United States Patent
Robinson et al.

(10) Patent No.: US 11,016,341 B2
(45) Date of Patent: May 25, 2021

(54) DIRECTIONAL ILLUMINATION APPARATUS AND PRIVACY DISPLAY

(71) Applicant: RealD Spark, LLC, Beverly Hills, CA (US)

(72) Inventors: Michael G. Robinson, Boulder, CO (US); Graham J. Woodgate, Henley-on-Thames (GB)

(73) Assignee: RealD Spark, LLC, Beverly Hills, CA (US)

( * ) Notice: Subject to any disclaimer, the term of this patent is extended or adjusted under 35 U.S.C. 154(b) by 0 days.

(21) Appl. No.: 17/019,020

(22) Filed: Sep. 11, 2020

(65) Prior Publication Data

US 2021/0072595 A1    Mar. 11, 2021

Related U.S. Application Data

(60) Provisional application No. 62/898,734, filed on Sep. 11, 2019.

(51) Int. Cl.
| | | |
|---|---|---|
| *G02F 1/1335* | (2006.01) | |
| *G02F 1/13357* | (2006.01) | |
| *H01L 33/60* | (2010.01) | |
| *F21K 9/68* | (2016.01) | |
| *F21K 9/64* | (2016.01) | |

(52) U.S. Cl.
CPC .......... *G02F 1/133605* (2013.01); *F21K 9/64* (2016.08); *F21K 9/68* (2016.08); *G02F 1/133603* (2013.01); *H01L 33/60* (2013.01)

(58) Field of Classification Search
None
See application file for complete search history.

(56) References Cited

U.S. PATENT DOCUMENTS

| | | |
|---|---|---|
| 5,184,114 A | 2/1993 | Brown |
| 5,812,105 A | 9/1998 | Ven |
| 6,547,423 B2 | 4/2003 | Marshall et al. |

(Continued)

FOREIGN PATENT DOCUMENTS

| | | |
|---|---|---|
| DE | 102010031945 A1 | 1/2012 |
| EP | 1387412 A1 | 2/2004 |

(Continued)

OTHER PUBLICATIONS

EP18200530.6—European Search Report of the European Patent Office dated May 23, 2019.

(Continued)

*Primary Examiner* — Elmito Breval
(74) *Attorney, Agent, or Firm* — Penny L. Lowry

(57) ABSTRACT

A directional illumination apparatus comprises a waveguide with a reflective surface comprising reflective pairs of light input facets, reflective light extraction facets and an output transmissive surface. An array of micro-LEDs is arranged to illuminate the reflective surface in a rearwards direction. The pairs of light input facets direct light within the waveguide and reflective light extraction facets cooperate to provide a uniform output illumination across the output aperture of the waveguide with collimated light. A thin and efficient illumination apparatus may be used for high dynamic range display backlighting, privacy display or environmental illumination applications.

41 Claims, 27 Drawing Sheets

(56) References Cited

U.S. PATENT DOCUMENTS

| | | |
|---|---|---|
| 6,570,324 B1 | 5/2003 | Tutt et al. |
| 7,014,964 B1 | 3/2006 | Hsu et al. |
| 7,171,874 B1 | 2/2007 | Huang |
| 7,863,614 B2 | 1/2011 | Toyama et al. |
| 7,994,531 B2 | 8/2011 | Lin et al. |
| 9,519,153 B2 | 12/2016 | Robinson et al. |
| 10,121,772 B1 | 11/2018 | Wu et al. |
| 10,126,575 B1 | 11/2018 | Robinson et al. |
| 10,303,030 B2 | 5/2019 | Robinson et al. |
| 10,533,730 B2 | 1/2020 | Harrold et al. |
| 2004/0089935 A1 | 5/2004 | Lehner |
| 2004/0126911 A1 | 7/2004 | Kimura |
| 2004/0161871 A1 | 8/2004 | Omori |
| 2004/0218390 A1* | 11/2004 | Holman ............... G02B 17/002 362/245 |
| 2004/0239243 A1 | 12/2004 | Roberts et al. |
| 2005/0219693 A1 | 10/2005 | Hartkop et al. |
| 2006/0152931 A1 | 7/2006 | Holman |
| 2006/0290276 A1 | 12/2006 | Cok et al. |
| 2007/0007237 A1 | 1/2007 | Wu et al. |
| 2007/0242477 A1 | 10/2007 | Yoo et al. |
| 2007/0256453 A1 | 11/2007 | Barnes et al. |
| 2008/0043466 A1 | 2/2008 | Chakmakjian et al. |
| 2008/0225523 A1 | 9/2008 | Samber et al. |
| 2008/0237612 A1 | 10/2008 | Cok |
| 2008/0258162 A1 | 10/2008 | Koung et al. |
| 2008/0315755 A1 | 12/2008 | Han |
| 2009/0001869 A1 | 1/2009 | Tanimoto et al. |
| 2009/0086508 A1 | 4/2009 | Bierhuizen |
| 2009/0128735 A1 | 5/2009 | Larson et al. |
| 2009/0242929 A1 | 10/2009 | Lin |
| 2010/0097809 A1 | 4/2010 | Munro et al. |
| 2010/0165635 A1 | 7/2010 | Chen et al. |
| 2010/0171215 A1 | 7/2010 | Fischer et al. |
| 2010/0195330 A1 | 8/2010 | Schaefer et al. |
| 2010/0258543 A1 | 10/2010 | Mizuno et al. |
| 2010/0317132 A1 | 12/2010 | Rogers et al. |
| 2011/0018860 A1 | 1/2011 | Parry-Jones et al. |
| 2011/0038150 A1* | 2/2011 | Woodgate .......... G02B 19/0066 362/235 |
| 2011/0255303 A1 | 10/2011 | Nichol et al. |
| 2012/0086875 A1 | 4/2012 | Yokota |
| 2012/0119237 A1 | 5/2012 | Leatherdale et al. |
| 2012/0140462 A1 | 6/2012 | Pickard |
| 2012/0258963 A1 | 10/2012 | Berger et al. |
| 2013/0039062 A1 | 2/2013 | Vintner et al. |
| 2013/0107525 A1 | 5/2013 | Woodgate et al. |
| 2013/0258663 A1 | 10/2013 | Woodgate et al. |
| 2014/0186979 A1 | 7/2014 | Tu et al. |
| 2014/0316742 A1 | 10/2014 | Sun et al. |
| 2015/0054011 A1 | 2/2015 | Koizumi et al. |
| 2015/0062490 A1 | 3/2015 | Kwon |
| 2015/0160396 A1 | 6/2015 | Wilcox et al. |
| 2015/0268479 A1 | 9/2015 | Woodgate et al. |
| 2015/0268513 A1 | 9/2015 | Chang et al. |
| 2015/0295154 A1 | 10/2015 | Tu et al. |
| 2015/0308635 A1 | 10/2015 | Li et al. |
| 2016/0018077 A1* | 1/2016 | Mallory .................. F21V 5/045 362/311.02 |
| 2016/0211413 A1 | 7/2016 | Park et al. |
| 2016/0299281 A1 | 10/2016 | Robinson et al. |
| 2017/0031085 A1 | 2/2017 | Lim et al. |
| 2017/0045666 A1 | 2/2017 | Vasylyev |
| 2017/0059127 A1 | 3/2017 | Jansma et al. |
| 2017/0102127 A1* | 4/2017 | Woodgate ............. H01L 33/507 |
| 2017/0139114 A1 | 5/2017 | Woodgate et al. |
| 2017/0154919 A1 | 6/2017 | Chen et al. |
| 2017/0205959 A1 | 7/2017 | Seong |
| 2017/0248289 A1 | 8/2017 | Vasylyev |
| 2017/0261179 A1 | 9/2017 | Wu et al. |
| 2018/0226384 A1 | 8/2018 | Park et al. |
| 2018/0321553 A1 | 11/2018 | Robinson et al. |
| 2019/0086706 A1 | 3/2019 | Robinson et al. |
| 2019/0250458 A1 | 8/2019 | Robinson et al. |
| 2019/0265478 A1 | 8/2019 | Cok et al. |
| 2020/0159055 A1 | 5/2020 | Robinson et al. |
| 2020/0321553 A1 | 10/2020 | Kwon et al. |

FOREIGN PATENT DOCUMENTS

| | | |
|---|---|---|
| EP | 1835550 A2 | 9/2007 |
| EP | 1890343 A1 | 2/2008 |
| EP | 1986023 A1 | 10/2008 |
| EP | 2182783 A2 | 5/2010 |
| EP | 2595295 A1 | 5/2013 |
| GB | 2464102 A | 4/2010 |
| GB | 2484711 A | 4/2012 |
| JP | 2000323755 A | 11/2000 |
| JP | 2009295309 A | 12/2009 |
| JP | 2010238846 A | 10/2010 |
| JP | 2013219397 A | 10/2013 |
| WO | 2007074932 A1 | 7/2007 |
| WO | 2010038025 A2 | 4/2010 |
| WO | 2011131200 A1 | 10/2011 |
| WO | 2012052722 A2 | 4/2012 |
| WO | 2012052723 A1 | 4/2012 |
| WO | 2013064801 A1 | 5/2013 |
| WO | 2013112435 A1 | 8/2013 |
| WO | 2014043384 A1 | 3/2014 |
| WO | 2017007770 A2 | 1/2017 |
| WO | 2018185475 A1 | 10/2018 |
| WO | 2018185476 A1 | 10/2018 |
| WO | 2018208618 A1 | 11/2018 |
| WO | 2019067846 A1 | 4/2019 |

OTHER PUBLICATIONS

International search report and written opinion of international searching authority for PCT application PCT/GB2018/050893 dated Aug. 27, 2018.

International search report and written opinion of international searching authority for PCT application PCT/GB2018/050894 dated Aug. 27, 2018.

International search report and written opinion of international searching authority for PCT application PCT/GB2019/050076 dated May 9, 2019.

International search report and written opinion of international searching authority for PCT application PCT/US2019/021570 dated May 24, 2019.

International search report and written opinion of international searching authority for PCT application PCT/US2019/031526 dated Jul. 29, 2019.

International search report and written opinion of international searching authority for PCT application PCT/US2020/040686 dated Nov. 20, 2020.

International search report and written opinion of international searching authority for PCT application PCT/US2020/047383 dated Dec. 4, 2020.

International search report and written opinion of international searching authority for PCT application PCT/US2020/050460 dated Dec. 8, 2020.

International search report and written opinion of international searching authority for PCT application PCT/US2020/053864 dated Dec. 14, 2020.

International search report and written opinion of international searching authority for PCT application PCT/US2020/050527 dated Feb. 3, 2021.

International search report and written opinion of international searching authority for PCT application PCT/US2020/053825 dated Dec. 30, 2020.

\* cited by examiner

DIRECTIONAL ILLUMINATION APPARATUS AND PRIVACY DISPLAY

TECHNICAL FIELD

This disclosure generally relates to illumination from light modulation devices, and more specifically relates to optical stacks for providing narrow angle illumination for use in display including privacy display, high dynamic range display and for use in environmental illumination.

BACKGROUND

Privacy displays provide image visibility to a primary user that is typically in an on-axis position and reduced visibility of image content to a snooper, that is typically in an off-axis position. A privacy function may be provided by micro-louvre optical films that transmit a high luminance from a display in an on-axis direction with low luminance in off-axis positions, however such films are not switchable, and thus the display is limited to privacy only function.

Switchable privacy displays may be provided by control of the off-axis optical output from a spatial light modulator. Control may be provided by means of off-axis luminance reduction, for example by means of switchable polarisation control layers between display polarisers and additional polarisers.

Backlights with reduced off-axis luminance can be used to provide or enhance the privacy function. Certain imaging directional backlights have the additional capability of directing the illumination through a display panel into viewing windows. An imaging system may be formed between multiple sources and the respective window images. One example of an imaging directional backlight is an optical valve that may employ a folded optical system and hence may also be an example of a folded imaging directional backlight. Light may propagate substantially without loss in one direction through the optical valve while counter-propagating light may be extracted by reflection off tilted facets as described in U.S. Pat. No. 9,519,153, which is herein incorporated by reference in its entirety.

Backlights formed from arrays of individually controllable light sources arranged in series with a liquid crystal spatial light modulator can provide high dynamic range by reducing output luminous flux of the light sources in alignment with low luminance regions of the image displayed on the spatial light modulator. High dynamic range LCDs (HDR-LCD) can achieve dynamic ranges that are superior to that which can be provided by an LCD optical mode alone. An array of light sources such as LEDs (light emitting diodes) that is addressed with lower resolution image data is provided in a local dimming LCD backlight, such that dark areas of an image are illuminated by the backlight with low luminance, and bright areas are illuminated with high luminance.

Thin substrate and polymer substrate LCD panels can provide mechanical characteristics such as flexibility that is similar to organic LED (OLED) displays. Such thin substrate LCDs desirably use backlights with similar mechanical characteristics.

One type of LCD backlight comprises a light guide plate, and array of input light sources such as LEDs at one end of the light guide plate. Light that propagates by total internal reflection within the waveguide is output by means of surface features that adjust the propagation angle of light within the waveguide and allow extraction at angles close to grazing the outside of the waveguide. Such light is directed in a normal direction to the LCD by means of a turning film and/or rear reflectors. Such optical stacks may have high efficiency, but have multiple optical components with total backlight thickness typically 1 mm or greater. Such an edge illuminated light guide plate is not typically appropriate for two-dimensional local dimming for HDR-LCD illumination, or free-form shaped LCD.

Other known backlights incorporate an array of light emitting diodes (LEDs) in a matrix behind the LCD such as described in U.S. Patent Publ. No. 2017-0261179 comprises a plurality of spatially separated packaged LEDs and a multiple "batwing" optical elements, each batwing optical element arranged to direct light from the packaged LED in a lateral direction. Such light is strongly diffused to provide output illumination. Such backlights require expensive pick-and-place LED and individual optics alignment and have a high thickness and reduced efficiency in comparison to edge illuminated backlights.

Illumination systems for environmental lighting such as automobile headlights, architectural, commercial or domestic lighting may provide a narrow directional light output distribution, for example by means of focussing optics to provide spotlighting effects, or can achieve a wide directional light output distribution for example by means of diffusing optics.

In this specification LED refers to an unpackaged LED die chip extracted directly from a monolithic wafer, i.e. a semiconductor element. This is different from packaged LEDs which have been attached to a lead frame in order to provide electrodes and may be assembled into a plastic package to facilitate subsequent assembly. Packaged LEDs are typically of dimension greater than 1 mm, and more typically of dimension greater than 3 mm and are assembled by conventional Printed Circuit Board assembly techniques including pick and place methods. The accuracy of components placed by such assembly machines may typically be about plus or minus 30 micrometres. Such sizes and tolerances prevent application to very high resolution displays.

Micro-LEDs may be formed by array extraction methods in which multiple LEDs are removed from a monolithic wafer in parallel and may be arranged with positional tolerances that are less than 5 micrometres.

White LED lighting sources can be comprised of separate spectral bands such as red, green, blue and yellow, each created by a separate LED element. Such sources enable users to resolve the separate colours, and as a result of the separation of the sources in the lamp, can create coloured illumination patches.

Catadioptric elements combine refractive surfaces (dioptrics) and reflective surfaces (catoptrics), which may provide total internal reflection or reflection from metallised surfaces. Backlights employing catadioptric optical elements with small output luminous intensity solid angles are described in WIPO International Publ. No. WO/2010/038025, which is herein incorporated by reference in its entirety.

BRIEF SUMMARY

According to a first aspect of the present disclosure there is provided an illumination apparatus for providing illumination over a predetermined area, the illumination apparatus comprising: an array of light emitting diodes arrayed across the predetermined area and arranged to output light rearwardly; and an array of optical elements arrayed across the predetermined area, rearwardly of the light emitting diodes, each optical element being aligned with at least one light emitting diode, and each optical element comprising a waveguide having a transmissive surface and a reflective surface that is arranged rearwardly of the transmissive surface to receive light from the respective at least one light emitting diode through the transmissive surface, the reflective surface of each optical element comprising: a reflective light input structure arranged to reflect light received from the respective at least one light emitting diode in directions in which the light reflected thereby is guided within the waveguide by total internal reflection at the transmissive surface; and reflective light extraction facets arranged to reflect light that is guided within the waveguide in directions in which the light reflected thereby is output from the waveguide through the transmissive surface, wherein the optical element has mirror symmetry about an optical axis in at least one cross-sectional plane and in the at least one cross-sectional plane the reflective light input structure comprises first and second sets of reflective facets that are interleaved with each other and are inclined in opposite senses so that the light reflected by the first and second sets of reflective facets is guided away from the optical axis in opposite directions transverse to the optical axis.

Advantageously a thin directional illumination apparatus may be provided with low surface profile variations. Widely spaced LEDs may be provided over a large area while achieving high image uniformity. Cost and complexity of manufacture may be reduced. High brightness may be achieved.

The light emitting diodes output light in respective first light output distributions, and the optical elements output light from the waveguide originating from a light emitting diode in a respective second light output distribution that has a luminous intensity half maximum solid angle that is smaller than the luminous intensity half maximum solid angle of the respective first light output distribution of the light emitting diode from which the light originates. The ratio of luminous intensity half maximum solid angle of the second light output distribution to the luminous intensity half maximum solid angle of a Lambertian light distribution may be less than 1, preferably less than 0.5, more preferably less than 0.25 and most preferably less than 0.1. Advantageously a collimated output may be achieved. High efficiency may be provided in desirable output directions.

Each optical element may have mirror symmetry about an optical axis in all cross-sectional planes around the optical axis. Advantageously high uniformity may be provided over a large area. The spacing of LEDs may be increased, reducing cost and complexity of manufacture. An illumination apparatus suitable for landscape and portrait privacy operation may be provided.

The reflective facets of the first and second sets may be inclined at tilt angles selected such that light from a point on a light emitting diode on the optical axis is reflected by the reflective facets at an angle with the optical axis of at most 50 degrees, preferably at most 48 degrees from the normal of the waveguide, and most preferably at most 46 degrees. The reflective facets of the first and second sets may be inclined at tilt angles selected such that light from a point on a light emitting diode on the optical axis is reflected by the reflective facets at an angle to the optical axis of at least 43 degrees from the normal of the waveguide and most preferably at least 44 degrees from the normal of the waveguide. Advantageously stray light at undesirable angles may be reduced. Hot spots visibility may be reduced.

Within each of the first and second sets of reflective facets, the reflective facets may be inclined with tilt angles defined between normal of the reflective facets and the optical axis that decrease for successive reflective facets in the direction in which light is guided away from the optical axis. Advantageously high uniformity of collimation may be achieved across the area of the illumination apparatus.

In the at least one cross-sectional plane the reflective light extraction facets may comprise plural pairs of inclined facets facing the optical axis. Advantageously light from an LED may be extracted by more than one optical element of the array. Uniformity may be increased.

The reflective surface may comprise reflective planar regions between the reflective light extraction facets. Advantageously light may be distributed over a large area by means of guiding. LED cost may be reduced and uniformity increased.

The reflective planar regions and the reflective light extraction facets may have a stepped structure. Advantageously leakage between adjacent optical elements may be reduced. Dynamic range of a backlight may be increased.

In the at least one cross-sectional plane the reflective light extraction facets may have a separation that decreases with distance from the optical axis of the optical element. The reflective light extraction facets may have lengths that increase with distance from the optical axis of the respective optical element. The reflective light extraction facets may have total areas that increase with the distance from the optical axis of the respective optical element. The reflective light extraction facet may have total areas that increase in proportion with the distance from the optical axis of the respective optical element. Advantageously uniformity of output may be increased.

Some of the reflective light extraction facets may be arranged to direct light that has not guided within the optical element. Advantageously some light may be extracted near the LEDs. The visibility of hotspots or dim spots near the LEDs may be reduced.

The transmissive surface of each optical element may be planar. Advantageously cost and complexity of the surface is reduced. Light guiding is provided so that light is distributed over a wide area and cost of the illumination apparatus is reduced.

The transmissive surface of each optical element may further comprise a refractive light input structure formed in the transmissive surface of the waveguide and aligned with the respective at least one light emitting diode so that the light emitted thereby passes through the refractive light input structure. Each optical element may have mirror symmetry about an optical axis in at least one cross-sectional plane. In the at least one cross-sectional plane the refractive light input structure may comprise a plurality of pairs of oppositely inclined refractive input facets. The transmissive surface of the input substrate may comprise planar regions between the refractive light input structures. Advantageously the efficiency of input into the waveguide may be increased.

The illumination apparatus may further comprise a transmissive support substrate, the light emitting diodes being supported by the transmissive support substrate on the rear side thereof. Advantageously the manufacturing cost of the LED support substrate may be reduced.

A transmissive material with a lower refractive index than a material of the waveguide may be arranged between the transmissive support substrate and the transmissive surfaces of the optical elements. The transmissive material may be air. Light may guide within the optical elements advantageously reducing LED cost and increasing uniformity over the predetermined area.

Each optical element may further comprise a refractive light output structure formed in a front surface of the transmissive support substrate in front of the respective at least one light emitting diode. Some of the reflective light extraction facets of each optical element may be arranged to direct light to the refractive light output structure of the optical element. Each optical element may have mirror symmetry about an optical axis in at least one cross-sectional plane. In the at least one cross-sectional plane the refractive light output structure may comprise a concave refractive surface arranged to provide negative optical power. In the at least one cross-sectional plane the refractive light output structure may comprise a plurality of pairs of oppositely inclined transmissive light deflecting facets. The angular light output distribution of light passing through the refractive light output structure may be substantially the same as the angular light output distribution of light passing through regions of the transmissive support substrate that do not comprise a refractive light output structure. Advantageously collimated light may be provided from the region of the waveguide that is obscured by the region of the LED. Uniformity may be increased.

The illumination apparatus may further comprise diffuser structures arranged on at least one surface of the transmissive support substrate. Advantageously uniformity may be increased. Output illumination solid angle may be increased to provide desirable angular output characteristics.

The illumination apparatus may further comprise mask regions provided between the light emitting diodes and the transmissive support substrate. Advantageously the visibility of hot spots from the region near the LED is reduced.

Each mask region may comprise electrodes connected to the light emitting diodes. Advantageously electrical connections to the LEDs may be conveniently provided.

The reflective surface of the optical element may have a reflective layer formed thereon. Advantageously light rays may be provided to the waveguide that would otherwise not be directed to guiding rays. The reflective layer may comprise a metal material. Advantageously high efficiency may be conveniently provided.

The waveguides of each optical element may be formed as an integrated body. Advantageously manufacturing cost may be reduced. Light may be guided between adjacent elements increasing uniformity.

The illumination apparatus may further comprise a wavelength conversion layer arranged so that light output from the waveguide passes therethrough. Advantageously white or coloured output may be provided from narrowband LEDs.

The light emitting diodes may have a maximum width of at most 300 micrometres, preferably at most 200 micrometres and more preferably at most 100 micrometres. Advantageously low cost LEDs may be provided and device thickness may be reduced.

In the at least one cross-sectional plane the distance between the transmissive output surface and reflective surface may be less than 1000 micrometres, preferably less than 500 micrometres and more preferably less than 250 micrometres. Advantageously a low cost illumination apparatus may be provided. The illumination apparatus may be flexible.

The illumination apparatus may further comprise a control system arranged to control the output of light from the light emitting diodes. Advantageously a high dynamic range illumination apparatus may be provided. The illumination apparatus may be controllable to achieve desirable spatial distributions of output.

According to a second aspect of the present disclosure there is provided a display apparatus comprising: an illumination apparatus according to the first aspect; and a transmissive spatial light modulator illuminated by the illumination apparatus. Advantageously a high dynamic range (HDR) display apparatus may be provided. Further a display with reduced moving picture response time (MPRT) may be provided, increasing the sharpness of fast moving objects. The display may further be provided with narrow illumination angle to provide privacy display, high efficiency display and low stray light display.

According to a third aspect of the present disclosure there is provided an illumination apparatus for providing illumination over a predetermined area, the switchable illumination apparatus comprising: a transmissive support substrate; an array of light emitting diodes supported by the transmissive support substrate on the rear side thereof, arrayed across the predetermined area, and arranged to output light rearwardly; an array of optical elements arrayed across the predetermined area, rearwardly of the light emitting diodes, each optical element being aligned with a respective at least one light emitting diode, and each optical element comprising a rear layer having a transmissive surface and a reflective surface that is arranged rearwardly of the transmissive surface to receive light from the respective at least one light emitting diode through the transmissive surface; and a transmissive material arranged between the transmissive support substrate and the transmissive surfaces of the optical elements, wherein the rear layers, the transmissive material and the transmissive support substrate have matched refractive indices, and the reflective surface of each optical element comprises: a reflective light input structure arranged to reflect light received from the respective at least one light emitting diode in directions in which the light reflected thereby is guided within a waveguide formed by the rear layer, the transmissive material and the transmissive support substrate by total internal reflection at the front surface of the transmissive support substrate; and reflective light extraction facets arranged to reflect light that is guided within the waveguide in directions in which the light reflected thereby is output from the waveguide through the transmissive surface, wherein the optical element has mirror symmetry about an optical axis in at least one cross-sectional plane and in the at least one cross-sectional plane the reflective light input structure comprises first and second sets of reflective facets that are interleaved with each other and are inclined in opposite senses so that the light reflected by the first and second sets of reflective facets is guided away from the optical axis in opposite directions transverse to the optical axis.

Advantageously the illumination apparatus may be provided with increased stability of alignment between the reflective surface and the LEDs of the array of LEDs.

The light emitting diodes output light in respective first light output distributions, and the optical elements output light from the waveguide originating from a light emitting diode in a respective second light output distribution that has a luminous intensity half maximum solid angle that is smaller than the luminous intensity half maximum solid angle of the respective first light output distribution of the light emitting diode from which the light originates.

The ratio of luminous intensity half maximum solid angle of the second light output distribution to the luminous intensity half maximum solid angle of a Lambertian light distribution may be less than 1, preferably less than 0.5, more preferably less than 0.25 and most preferably less than 0.1.

Each optical element may have mirror symmetry about an optical axis in all cross-sectional planes around the optical axis.

The reflective facets of the first and second sets may be inclined at tilt angles selected such that light from a point on a light emitting diode on the optical axis is reflected by the reflective facets at an angle with the optical axis of at most 50 degrees, preferably at most 48 degrees from the normal of the waveguide, and most preferably at most 46 degrees.

The reflective facets of the first and second sets may be inclined at tilt angles selected such that light from a point on a light emitting diode on the optical axis is reflected by the reflective facets at an angle to the optical axis of at least 43 degrees from the normal of the waveguide and most preferably at least 44 degrees from the normal of the waveguide.

Within each of the first and second sets of reflective facets, the reflective facets may be inclined with tilt angles defined between normal of the reflective facets and the optical axis that decrease for successive reflective facets in the direction in which light is guided away from the optical axis.

In the at least one cross-sectional plane the reflective light extraction facets may comprise plural pairs of inclined facets facing the optical axis.

The reflective surface may comprise reflective planar regions between the reflective light extraction facets.

The reflective planar regions and the reflective light extraction facets may have a stepped structure.

In the at least one cross-sectional plane the reflective light extraction facets may have a separation that decreases with distance from the optical axis of the optical element.

The reflective light extraction facets may have lengths that increase with distance from the optical axis of the respective optical element.

The reflective light extraction facets may have total areas that increase with the distance from the optical axis of the respective optical element.

The reflective light extraction facet may have total areas that increase in proportion with the distance from the optical axis of the respective optical element.

Some of the reflective light extraction facets may be arranged to direct light that has not guided within the optical element.

The transmissive surface of each optical element may be planar.

The transmissive surface of each optical element may further comprise a refractive light input structure formed in the transmissive surface of the waveguide and aligned with the respective at least one light emitting diode so that the light emitted thereby passes through the refractive light input structure.

Each optical element may have mirror symmetry about an optical axis in at least one cross-sectional plane.

In the at least one cross-sectional plane the refractive light input structure may comprise a plurality of pairs of oppositely inclined refractive input facets.

The transmissive surface of the input substrate may comprise planar regions between the refractive light input structures.

The illumination apparatus may further comprise a transmissive support substrate the light emitting diodes being supported by the transmissive support substrate on the rear side thereof.

A transmissive material with a lower refractive index than a material of the waveguide may be arranged between the transmissive support substrate and the transmissive surfaces of the optical elements. The transmissive material may be air.

Each optical element may further comprise a refractive light output structure formed in a front surface of the transmissive support substrate in front of the respective at least one light emitting diode.

Some of the reflective light extraction facets of each optical element may be arranged to direct light to the refractive light output structure of the optical element.

Each optical element may have mirror symmetry about an optical axis in at least one cross-sectional plane.

In the at least one cross-sectional plane the refractive light output structure may comprise a concave refractive surface arranged to provide negative optical power.

In the at least one cross-sectional plane the refractive light output structure may comprise a plurality of pairs of oppositely inclined transmissive light deflecting facets.

The illumination apparatus may further comprise diffuser structures arranged on at least one surface of the transmissive support substrate.

The angular light output distribution of light passing through the refractive light output structure may be substantially the same as the angular light output distribution of light passing through regions of the transmissive support substrate that do not comprise a refractive light output structure.

The illumination apparatus may further comprise mask regions provided between the light emitting diodes and the transmissive support substrate.

Each mask region may comprise electrodes connected to the light emitting diodes.

The reflective surface of the optical element may have a reflective layer formed thereon.

The reflective layer may comprise a metal material.

The waveguides of each optical element may be formed as an integrated body.

The illumination apparatus may further comprise a wavelength conversion layer arranged so that light output from the waveguide passes therethrough.

The light emitting diodes may have a maximum width of at most 300 micrometres, preferably at most 200 micrometres and more preferably at most 100 micrometres.

In the at least one cross-sectional plane the distance between the transmissive output surface and reflective surface may be less than 1000 micrometres, preferably less than 500 micrometres and more preferably less than 250 micrometres.

The illumination apparatus may further comprise a control system arranged to control the output of light from the light emitting diodes.

According to a fourth aspect of the present disclosure there is provided a display apparatus comprising: an illumination apparatus according to the third aspect; and a transmissive spatial light modulator illuminated by the illumination apparatus.

Other advantages of the third and fourth aspects of the present embodiments include those as provided for the first and second aspects of the present embodiments.

Any of the aspects of the present disclosure may be applied in any combination.

Embodiments of the present disclosure may be used in a variety of optical systems. The embodiments may include or work with a variety of projectors, projection systems, optical components, displays, microdisplays, computer systems, processors, self-contained projector systems, visual and/or audiovisual systems and electrical and/or optical devices.

Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

Before proceeding to the disclosed embodiments in detail, it should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying FIGURES, in which like reference numbers indicate similar parts, and in which.

DETAILED DESCRIPTION

Figure 1A:
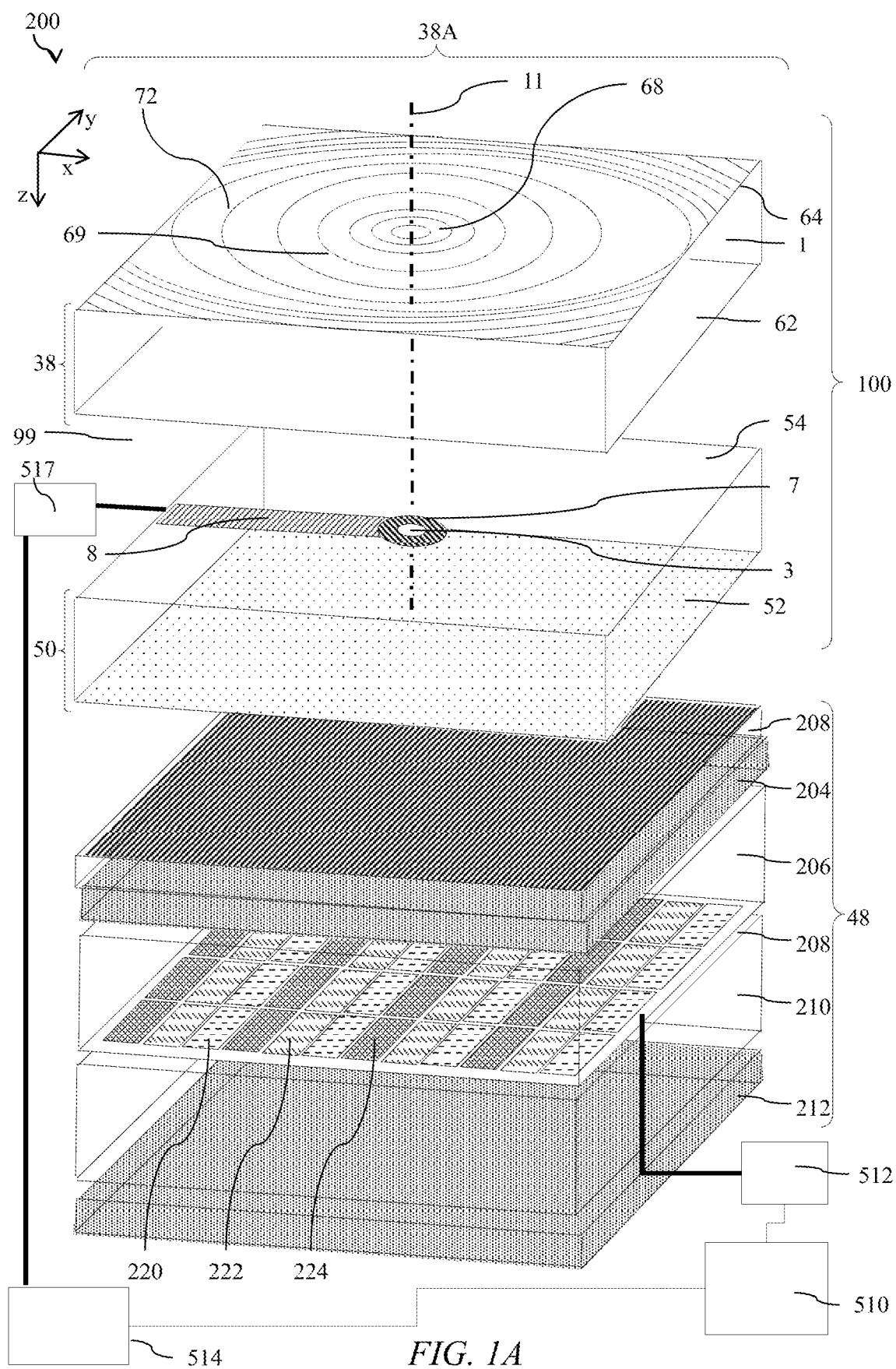
FIG. 1A is a schematic diagram illustrating in side perspective view a collimated output optical stack of a high efficiency and high dynamic range display apparatus comprising an array backlight arranged to illuminate a spatial light modulator.

A private mode of operation of a display is one in which an observer sees a low contrast sensitivity such that an image is not clearly visible. Contrast sensitivity is a measure of the ability to discern between luminances of different levels in a static image. Inverse contrast sensitivity may be used as a measure of visual security, in that a high visual security level (VSL) corresponds to low image visibility.

For a privacy display providing an image to an observer, visual security may be given as:

$$VSL=(Y+R)/(Y-K) \qquad \text{eqn. 1}$$

where VSL is the visual security level, Y is the luminance of the white state of the display at a snooper viewing angle, K is the luminance of the black state of the display at the snooper viewing angle and R is the luminance of reflected light from the display.

Panel contrast ratio is given as:

$$C=Y/K \qquad \text{eqn. 2}$$

For high contrast optical LCD modes, the white state transmission remains substantially constant with viewing angle. In the contrast reducing liquid crystal modes of the present embodiments, white state transmission typically reduces as black state transmission increases such that $$Y+K \sim P \cdot L \qquad \text{eqn. 3}$$

The visual security level may then be further given as:

$$VSL = \frac{(C + I \cdot \rho/\pi \cdot (C+1)/(P \cdot L))}{(C-1)} \qquad \text{eqn. 4}$$

where off-axis relative luminance, P is typically defined as the percentage of head-on luminance, L at the snooper angle and the display may have image contrast ratio C and the surface reflectivity is p.

The off-axis relative luminance, P is sometimes referred to as the privacy level. However, such privacy level P describes relative luminance of a display at a given polar angle compared to head-on luminance, and is not a measure of privacy appearance.

The display may be illuminated by Lambertian ambient illuminance I. Thus in a perfectly dark environment, a high contrast display has VSL of approximately 1.0. As ambient illuminance increases, the perceived image contrast degrades, VSL increases and a private image is perceived.

For typical liquid crystal displays the panel contrast C is above 100:1 for almost all viewing angles, allowing the visual security level to be approximated to:

$$VSL=1+I \cdot \rho/(\pi \cdot P \cdot L) \qquad \text{eqn. 5}$$

The perceptual image security may be determined from the logarithmic response of the eye, such that $$S=\log_{10}(V) \qquad \text{eqn. 6}$$

Desirable limits for S were determined in the following manner. In a first step a privacy display device was provided. Measurements of the variation of privacy level, P(θ) of the display device with polar viewing angle and variation of reflectivity ρ(θ) of the display device with polar viewing angle were made using photopic measurement equipment. A light source such as a substantially uniform luminance light box was arranged to provide illumination from an illuminated region that was arranged to illuminate the privacy display device along an incident direction for reflection to a viewer positions at a polar angle of greater than 0° to the normal to the display device. The variation I(θ) of illuminance of a substantially Lambertian emitting lightbox with polar viewing angle was determined by measuring the variation of recorded reflective luminance with polar viewing angle taking into account the variation of reflectivity ρ(θ). The measurements of P(θ), r(θ) and I(θ) were used to determine the variation of Security Factor S(θ) with polar viewing angle along the zero elevation axis.

In a second step a series of high contrast images were provided on the privacy display including (i) small text images with maximum font height 3 mm, (ii) large text images with maximum font height 30 mm and (iii) moving images.

In a third step each observer (with eyesight correction for viewing at 1000 mm where appropriate) viewed each of the images from a distance of 1000 m, and adjusted their polar angle of viewing at zero elevation until image invisibility was achieved for one eye from a position near on the display at or close to the centre-line of the display. The polar location of the observer's eye was recorded. From the relationship S(θ), the security factor at said polar location was determined. The measurement was repeated for the different images, for various display luminance $Y_{max}$, different lightbox illuminance I(q=0), for different background lighting conditions and for different observers.

From the above measurements S<1.0 provides low or no visual security, 1.0≤S<1.5 provides visual security that is dependent on the contrast, spatial frequency and temporal frequency of image content, 1.5≤S<1.8 provides acceptable image invisibility (that is no image content is observable) for most images and most observers and S≥1.8 provides full image invisibility, independent of image content for all observers.

In comparison to privacy displays, desirably wide-angle displays are easily observed in standard ambient illuminance conditions. One measure of image visibility is given by the contrast sensitivity such as the Michelson contrast which is given by:

$$M=(I_{max}-I_{min})(I_{max}+I_{min}) \qquad \text{eqn. 7}$$

and so:

$$M=((Y+R)-(K+R))/((Y+R)+(K+R))=(Y-K)/(Y+K+2\cdot R) \qquad \text{eqn. 8}$$

Thus the visual security level (VSL), is equivalent (but not identical to) 1/M. In the present discussion, for a given off-axis relative luminance, P the wide-angle image visibility, W is approximated as $$W=1/\text{VSL}=1/(1+I\cdot\rho/(\pi\cdot P\cdot L)) \qquad \text{eqn. 9}$$

In the present discussion the colour variation Δε of an output colour $(u_w'+\Delta u', v_w'+\Delta v')$ from a desirable white point $(u_w', v_w')$ may be determined by the CIELUV colour difference metric, assuming a typical display spectral illuminant and is given by:

$$\Delta\varepsilon=(\Delta u'^2+\Delta v'^2)^{1/2} \qquad \text{eqn. 10}$$

Catadioptric elements employ both refraction and reflection, which may be total internal reflection or reflection from metallised surfaces.

The structure and operation of various directional display devices will now be described. In this description, common elements have common reference numerals. It is noted that the disclosure relating to any element applies to each device in which the same or corresponding element is provided. Accordingly, for brevity such disclosure is not repeated.

It would be desirable to provide a display with a high efficiency for head-on display users while achieving high dynamic range to increase image contrast.

Figure 1B:
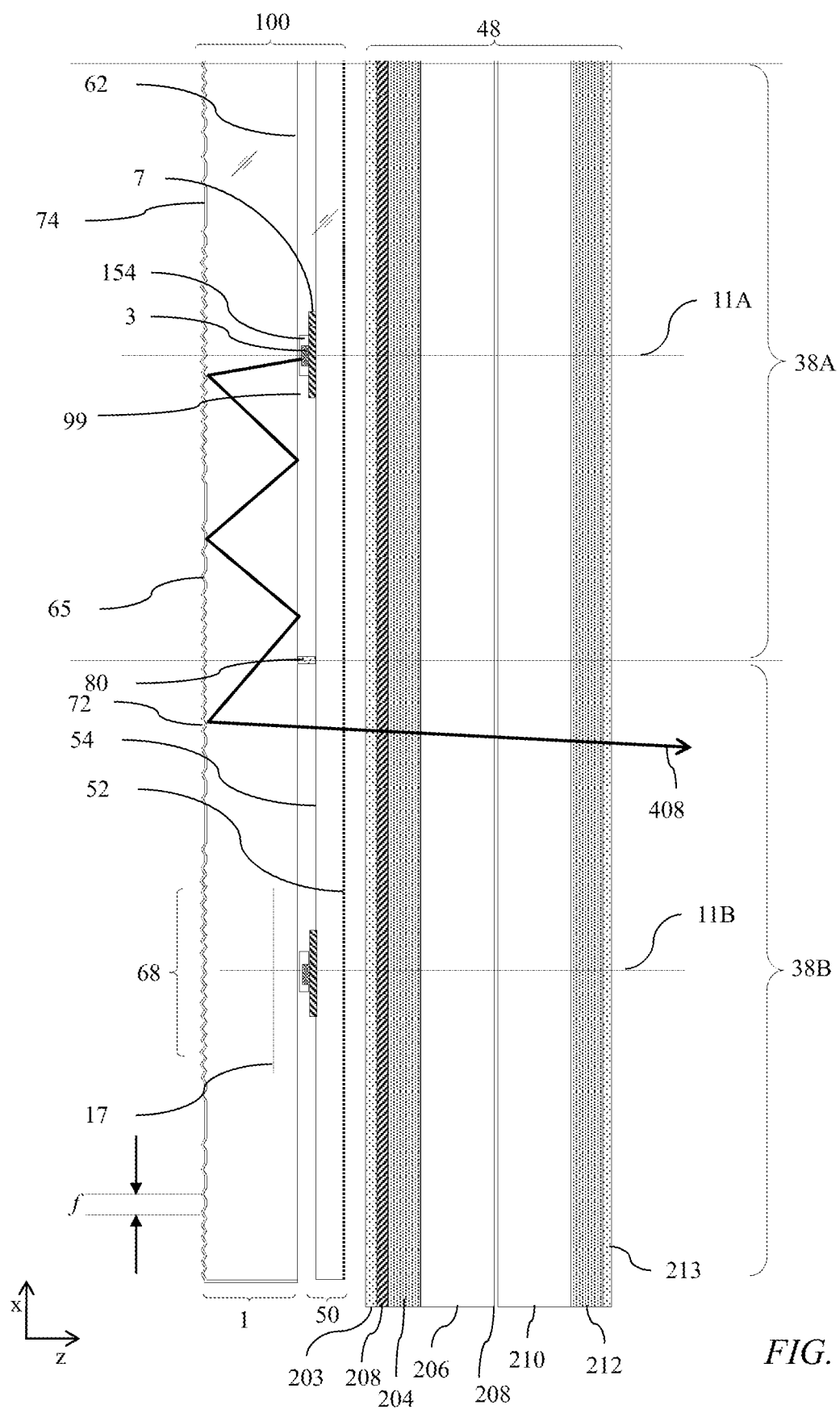
FIG. 1B is a schematic diagram illustrating in side view a collimated output optical stack of a high efficiency and high dynamic range display apparatus comprising an array backlight arranged to illuminate a spatial light modulator.

FIG. 1A is a schematic diagram illustrating in side perspective view a collimated output optical stack 20 of a high efficiency and high dynamic range display apparatus 200 comprising a backlight comprising an array illumination apparatus 100 arranged to illuminate a spatial light modulator 48; and FIG. 1B is a schematic diagram illustrating in side view a collimated output optical stack of a high efficiency and high dynamic range display apparatus 200 comprising an array backlight arranged to illuminate a spatial light modulator 48 such as an LCD.

The display apparatus comprises a display apparatus 200 comprising: an illumination apparatus 100 and a transmissive spatial light modulator 48 illuminated by the illumination apparatus 100. Thus a backlight comprises an illumination apparatus 100 arranged to provide illumination to the transmissive spatial light modulator 48.

Illumination apparatus 100 is arranged for providing illumination 400 over a predetermined area. The predetermined area in FIG. 1A is at least the active area of the spatial light modulator 48 and is typically oversized in comparison to the active area to advantageously provide uniform illumination for off-axis viewing positions.

Spatial light modulator 48 comprises input polariser 210; TFT substrate 212; liquid crystal layer 214 that is pixelated with typically red pixels 220, green pixels 222 and blue pixels 224; colour filter substrate 216 and output polariser 218.

The illumination apparatus comprises an array of light emitting diodes 3 arrayed across the predetermined area. The light emitting diodes 3 are arranged to output light rearwardly, that is away from the spatial light modulator 48. Light rays including ray 408 are output from the LEDs 3 are directed towards the spatial light modulator 48 and output in a direction close to the direction of the optical axis 11. Advantageously visibility of hot spots of illumination near the LEDs may be substantially avoided. Further high image uniformity over the predetermined angle and narrow beam angles may be provided as will be described.

The illumination apparatus further comprises a transmissive support substrate 50 the light emitting diodes 3 being supported by the transmissive support substrate 50 on the rear side thereof. The illumination apparatus comprises a two-dimensional array of light emitting diodes 3 disposed on a support substrate 50, the light emitting diodes 3, (or LEDs 3), being arrayed across the predetermined area. The support substrate 50 is transmissive to light rays 408 from the light emitting diodes 3. Light rays 408 that are extracted from the waveguide 1 are extracted through the substrate 50. Advantageously high efficiency output is achieved. Advantageously the manufacturing cost of the LED support substrate may be reduced.

Support substrate 50 comprises first and second surfaces 52, 54 that are planar. Advantageously the LED array may be manufactured on a separate element 50 to the optical element 38 that may have surface suitable for attaching the LEDs. Higher temperature processing environments may be provided, reducing cost of manufacture. Transparent electrodes 8 such as ITO may be provided on the substrate 50. The transmissive substrate 50 may be glass or polymer material. The waveguide 1 may be glass or may be a polymer material.

A transmissive material 59 with a lower refractive index than a material of the waveguide 1 is arranged in the gap 99 between the transmissive support substrate 50 and the transmissive surfaces 62 of the optical elements 38. In the embodiments of FIGS. 1A-B the transmissive material 59 is air. Light ray 408 guides within the waveguide 1. Advantageously LED cost may be reduced and uniformity increased.

Adhesive regions 80 may be provided to attach the light guide 1 to the support substrate 50, achieving alignment between the two structures. Alignment during environmental and mechanical variations may be provided. Advantageously increased resilience to temperature variations may be provided.

The light emitting diodes 3 may be each provided with a wavelength conversion element 154. Wavelength conversion material and/or a light scattering material may be arranged in the wavelength conversion element 154 to receive light from the light emitting diodes 3, for example to convert blue output from gallium nitride (GaN) LEDs to white light or to scatter blue light. The wavelength conversion material may be a phosphor material or quantum dot material. Advantageously the present embodiments may achieve white light output with a narrow beam angle.

The illumination apparatus further comprises mask regions 7 provided between each the light emitting diodes 3 and the transmissive support substrate 50. The mask regions are opaque and typically reflective. Light from the LED 3 is not directly output from the illumination apparatus 100. Advantageously the visibility of hot spots is reduced. Further, light may be reflected from the mask regions, increasing efficiency.

Each mask region 7 comprises electrodes 700 connected to the light emitting diodes 3. Light extraction near the light emitting diode 3 is reduced and advantageously hot spots are reduced.

The array of optical elements 38 is arrayed across the predetermined area, rearwardly of the light emitting diodes 3, each optical element 38 being aligned with a respective at least one light emitting diode 3, and each optical element 38 comprising a waveguide 1 having a transmissive surface 62 and a reflective surface 64 that is arranged rearwardly of the transmissive surface 62 to receive light from the respective light emitting diode 3 through the transmissive surface 62. The reflective structure may provide backlight regions 20A, 20B around optical axes 11A, 11B. As will be described further below advantageously a uniform, thin and collimated illumination apparatus may be provided.

The reflective surface 64 of the optical element 38 has a reflective layer 65 formed thereon. Light that is incident on the reflective surface at angles less than the critical angle in the material of the waveguide 1 are directed within the waveguide 1. Advantageously efficiency and uniformity are increased.

The reflective layer 65 comprises a metal material. Metals may be provided at low cost and high reflectivity. Advantageously high efficiency may be provided.

The waveguides 1 of each optical element 38 are formed as an integrated body. The optical element 38 may be provided as a single layer, advantageously reducing cost and complexity of manufacture. Light may be guided between adjacent optical elements 38, advantageously increasing efficiency.

The reflective surface 64 of each optical element 38 comprises a reflective light input structure 68 arranged to reflect light received from the at least one light emitting diode 3 in directions in which the light 300 reflected thereby is guided within the waveguide 1 by total internal reflection at the transmissive surface 62. Light is spread through the waveguide 1 advantageously increasing efficiency and increasing LED separation. The number of LEDs for a given thickness is reduced, advantageously reducing cost and complexity while achieving high uniformity.

Reflective light extraction facets 72 arranged to reflect light that is guided within the waveguide 1 in directions in which the light reflected thereby is output from the waveguide 1 through the transmissive surface 62. Advantageously a narrow cone angle output is provided as will be described further in the illustrative embodiments below.

The light emitting diodes 3 are located in front of the waveguide 1 and arranged to emit light such as light rays 402, 404 rearwardly. Advantageously hot spots are reduced and uniformity increased.

An illustrative output light ray 408 is directed by LED 3 onto the reflective light input structure 68, is guided within the waveguide 1 by means of planar transmissive surface 62 and planar facets 71 and is deflected by light extraction feature 72 to be transmitted by spatial light modulator 48. The operation of the reflective surface 64 will be further described with reference to FIGS. 5A-B, hereinbelow.

Air gap 99 is provided between the LEDs 3 and guiding surface 62. Such an arrangement uses refraction at the input planar surface 62 as will be described further below, and may be termed catadioptric.

Advantageously a thin illumination apparatus may be provided with low surface profile variations. Widely spaced LEDs may be provided over a large area while achieving high image uniformity. Cost and complexity of manufacture may be reduced. High brightness may be achieved.

Optional reflective recirculation polariser 208 is provided to recirculate polarised light within the illumination apparatus 100. Further half wave retarders (not shown) may be arranged between the reflective polariser 208 and the light turning element 5 to increase the luminance of recirculated light using reflections from the reflective surface 64. Diffuser 203 may be provided to improve uniformity as will be described further below. Recirculated light may be reflected from the reflective surface 64 and directed through the polariser 204 by means of the retarders or scattering within the backlight structure. Advantageously display efficiency may be increased.

The illumination apparatus further comprises a control system 510, 514, 517 arranged to control the output of light from the light emitting diodes 3. The control system comprises display controller 510, backlight controller 514, and LED array driver 517 arranged to control the luminous flux from the array of LEDs 3; and SLM controller 512 arranged to control the pixels 220, 222, 224 of the spatial light modulator 48. Controller 514 may be provided with image data so that the LEDs 3 of the LED array are controlled with image information. Control system 510, 514, 517, 512 is arranged to control the luminous flux of the light emitted from the light emitting diodes 3 wherein the control is in response to image data supplied to the transmissive spatial light modulator 48.

Advantageously high dynamic range images may be provided. For example, in regions of the image on the spatial light modulator 48 where black pixels are provided, the luminous flux from the LEDs 3 of the LED array may be reduced and increased image contrast achieved. Further display efficiency is increased. Highlight regions of the image may be provided with increased luminance to achieve further enhanced dynamic range.

Further the illumination apparatus 100 may be scanned in synchronisation with the addressing of the spatial light modulator 48. A display with reduced moving picture response time (MPRT) may be provided, increasing the sharpness of fast moving objects.

Advantageously addressable illumination can be provided in a thin optical stack. Substrates 206, 210 may comprise thin substrates, such as 150 micrometres thickness or less that may be flexible. Thin substrates may be micro-sheet glass, glass that has been thinned by chemical-mechanical polishing, or polymer substrates such as polyimide or colourless polyimide. Advantageously an LCD that may be curved or used for flexible display may be provided as will be described further hereinbelow.

Further the total thickness of the spatial light modulator 48 may be less than 1 mm, preferably less than 500 micrometres, and most preferably less than 250 micrometres for applications such as mobile display. Control electronics may be provided within the active area of the spatial light modulator to provide substantially zero bezel, for example bezel widths of less than 500 micrometres. Further free-form shapes for the spatial light modulator 48, such as circular display may be achieved as will be described further hereinbelow.

The display may further be provided with narrow illumination angle to provide privacy display, high efficiency display, low stray light display as will be described with reference to for example FIG. 23 further below.

It may be desirable to provide a collimated illumination apparatus for environmental or other illumination purposes to achieve high illuminance and low glare.

Figure 2:
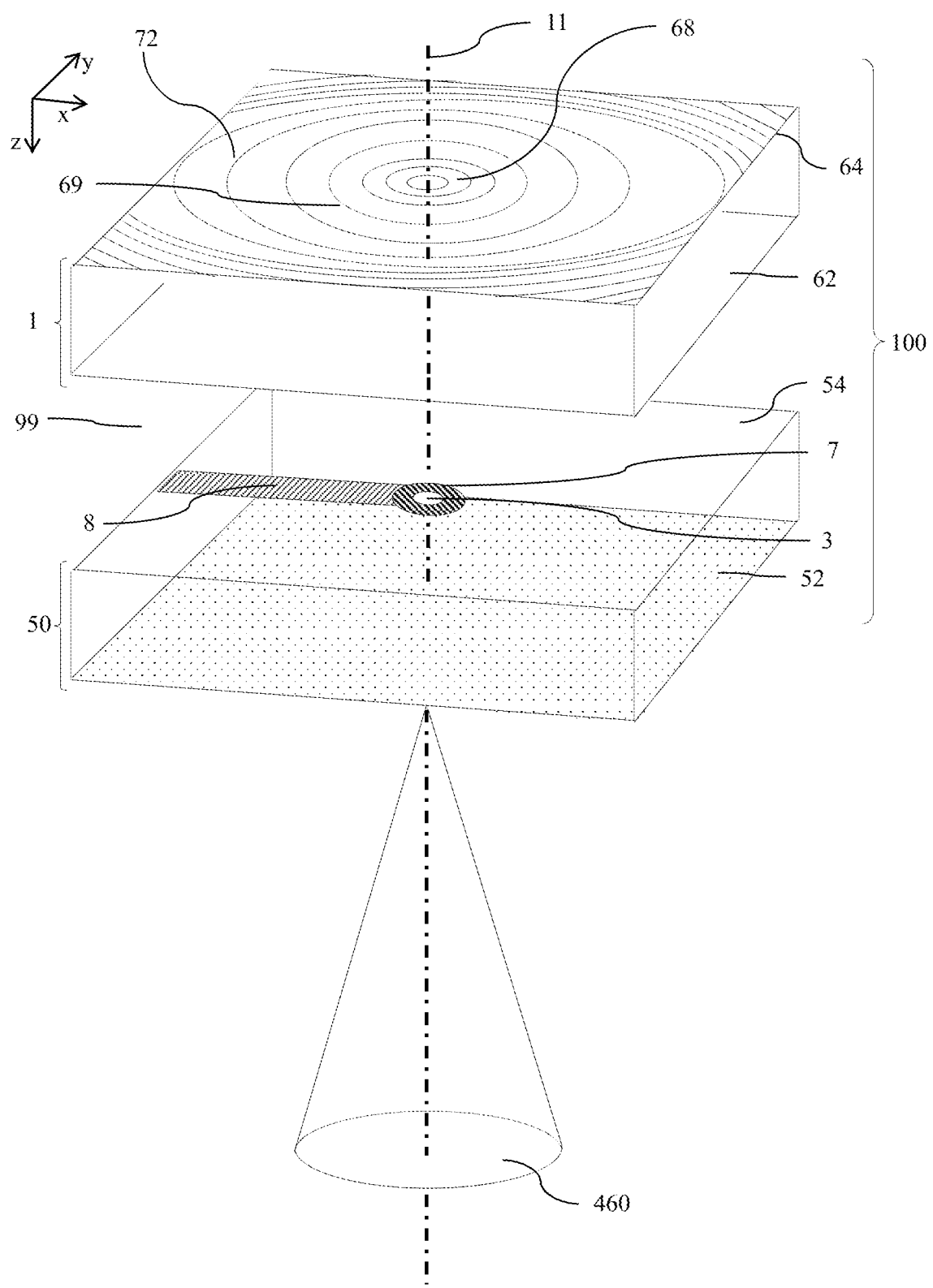
FIG. 2 is a schematic diagram illustrating in side perspective view a collimated output optical stack for environmental lighting.

FIG. 2 is a schematic diagram illustrating in side perspective view a high efficiency and spatially controllable environmental lighting illumination apparatus 100 comprising an array of light emitting diodes 3 arranged to illuminate an ambient environment. In comparison to the arrangement of FIGS. 1A-B, the spatial light modulator 48 is omitted. Features of the arrangement of FIG. 2 not discussed in further detail may be assumed to correspond to the features with equivalent reference numerals as discussed above, including any potential variations in the features.

Output light 400 in the light cone 460 from the illumination apparatus 100 is output in a direction close to the normal 11 to the predetermined area direction. The light cone 460 represents the FWHM profile of the output light 400 for example.

The light output may be controlled to provide spatially patterned illumination light cones across the predetermined area of the illumination apparatus for each element 38 of the illumination apparatus 100. High spatial uniformity of illumination may be achieved into a narrow cone angle as will be described further hereinbelow.

Advantageously an illumination apparatus may provide sunlight type illumination from a large area light source with high uniformity. The luminance of the illumination apparatus is reduced in comparison to small area collimated sources. Image glare may be reduced and high efficiency achieved.

Further the profile of the illumination may be varied to achieve light dappling simulation by providing image data to the illumination apparatus by means of controllers 510, 514, 517 and omitting spatial light modulator 48. Desirable lighting characteristics for indoors operation may be achieved to simulate an outdoors environment.

The structure of a reflective surface 64 will now be described.

Figure 3A:
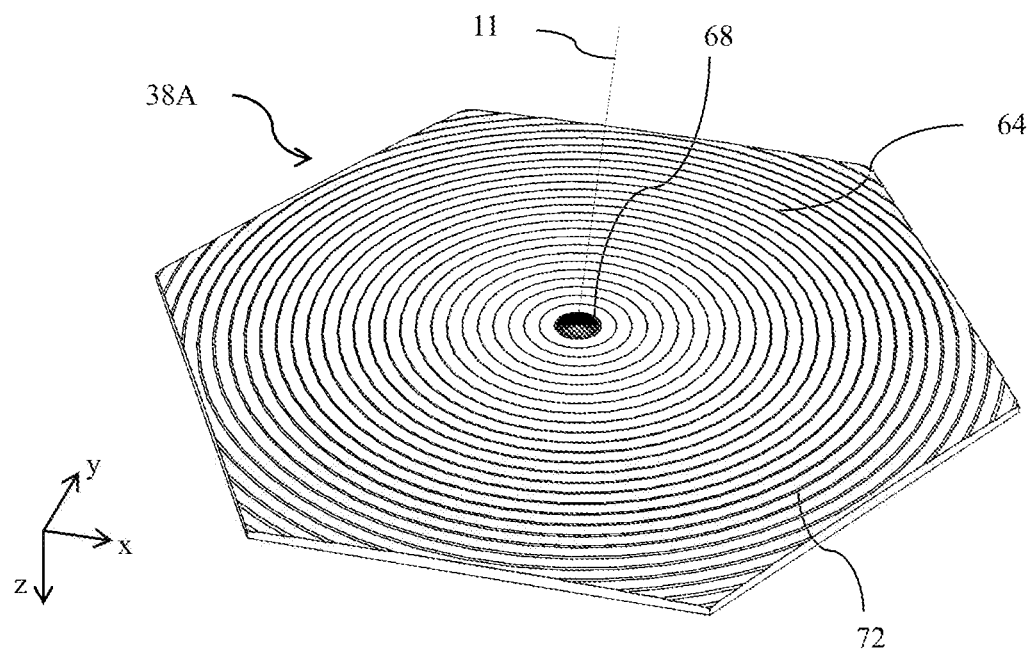
FIG. 3A is a schematic diagram illustrating in front perspective view a reflector for an illumination apparatus.

FIG. 3A is a schematic diagram illustrating in side perspective view a reflective surface 64 for a collimating optical element 38 unit cell. One unit cell 38A of the illumination apparatus 100A comprises reflective surface 64 with optical axis 11, input region 68 and light extraction facets 72. The unit cell may be hexagonal as illustrated, square or other packing arrangement. Features of the arrangement of FIG. 3A not discussed in further detail may be assumed to correspond to the features with equivalent reference numerals as discussed above, including any potential variations in the features.

Each optical element 38 has mirror symmetry about an optical axis 11 in all cross-sectional planes around the optical axis 11. Advantageously high uniformity may be provided over a large area. The spacing of LEDs may be increased, reducing cost and complexity of manufacture.

In a case that the optical elements have mirror symmetry about an optical axis in all cross-sectional planes around the optical axis, then the optical elements have rotational symmetry about the optical axis. In this case, the optical elements may be arranged in a two dimensional array.

Figure 3B:
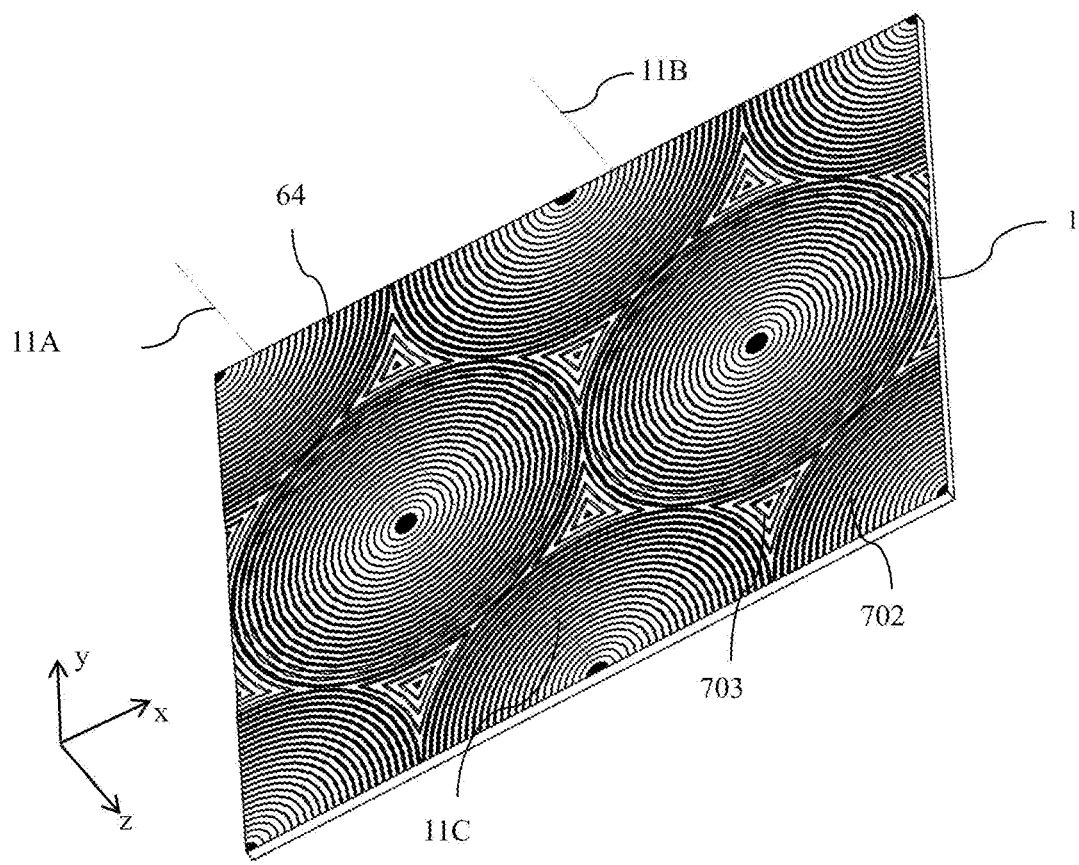
FIG. 3B is a schematic diagram illustrating in front perspective view a reflector array for an illumination apparatus.

FIG. 3B is a schematic diagram illustrating in front perspective view a tool 700 for fabricating a reflective surface 64 for an illumination apparatus 100. Features of the arrangement of FIG. 3B not discussed in further detail may be assumed to correspond to the features with equivalent reference numerals as discussed above, including any potential variations in the features.

Surface 64 comprises circular regions 702 and interspersed regions 703 that each provide collimated output for light from micro-LEDs arranged at axes 11A, 11B, 11C respectively. Such a surface can be conveniently provided by cutting of a metal surface by a diamond. Advantageously high uniformity of collimated output may be achieved.

In the embodiments of FIGS. 1A-B the transmissive surface 62 of each optical element 38 is planar. The operation of the refractive planar input surface 62 of FIGS. 1A-B will now be described.

Figure 4:
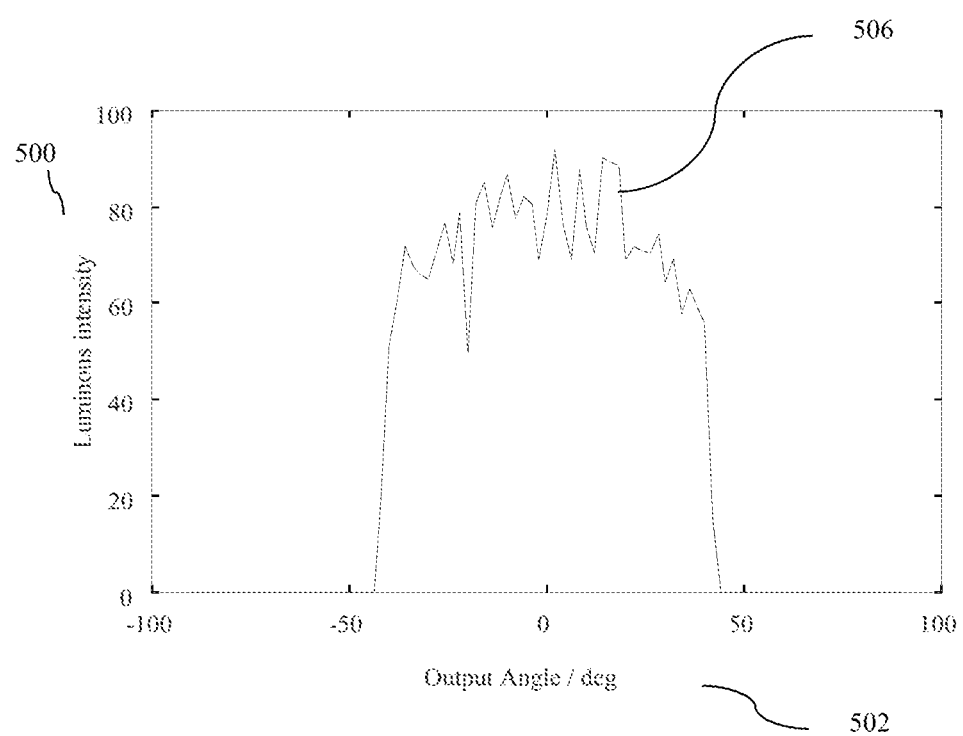
FIG. 4 is a schematic graph illustrating in at least one cross-sectional plane the simulated profile of output luminous intensity with illumination angle from a planar transmissive input surface 62 onto a detector plane.

FIG. 4 is a schematic graph illustrating in at least one cross-sectional plane the simulated profile 506 of input luminous intensity 500 within the waveguide with illumination angle 502 from a planar transmissive input surface 62 onto a detector plane 17 of FIG. 1B near the planar input surface 62.

The LEDs 3 are simulated with a Lambertian output profile, that is the luminous intensity varies as the cosine of the output angle. The profile 506 arises from the refraction of this output at the planar input surface 62 and has desirable features. First, the light is constrained with the critical angle in the medium of the waveguide 1. Further, the profile 506 of luminous emittance has a small variation with angle within the waveguide, such that high uniformity at the reflective input structure 68 is provided, and high uniformity of luminance may be provided within the waveguide 1. Advantageously alignment tolerances may be relaxed and uniformity may be increased.

The waveguide 1 may be considered as a catadioptric optical element in that it combines refraction at the input surface 62 and reflection at the reflective surface 64.

The operation of the waveguide 1 will now be described in further detail.

Figure 5A:
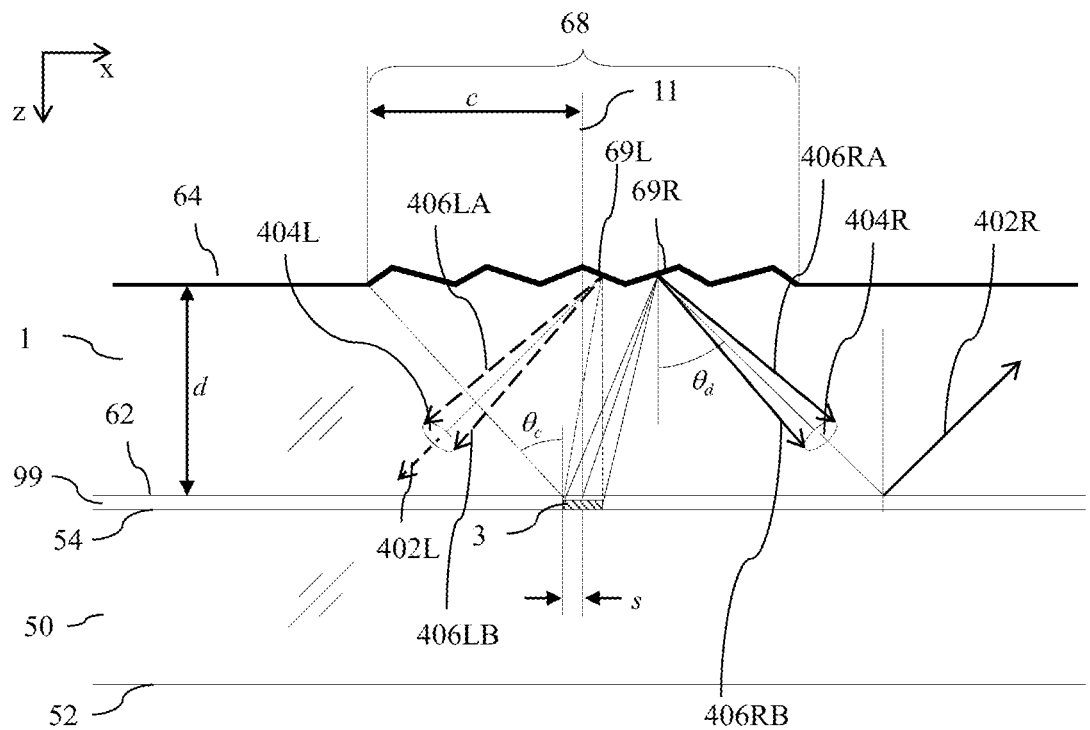
FIG. 5A is a schematic diagram illustrating in side view operation of the input structure of a reflector for an illumination apparatus.

FIG. 5A is a schematic diagram illustrating in side view operation of the reflective input structure 68 of a reflective surface 64 for an illumination apparatus 100. Features of the arrangement of FIG. 5A not discussed in further detail may be assumed to correspond to the features with equivalent reference numerals as discussed above, including any potential variations in the features.

The optical element 38 has mirror symmetry about an optical axis 11 in at least one cross-sectional plane and in the at least one cross-sectional plane the reflective light input structure 68 comprises first and second sets of reflective facets 69R, 69L that are interleaved with each other and are inclined in opposite senses so that the light reflected by the first and second sets of reflective facets 69R, 69L is guided away from the optical axis in opposite directions transverse to the optical axis 11.

In operation reflective facets 69R of input region 68 couple light rays 402R, 406RA, 406RB in light cone 404R from individual LEDs 3 in a rightwards direction. Central ray 402R and extreme ray 406RA from the left edge of the LED 3 and ray 406RB from the right edge of the LED 3 provide a narrow off-axis ray cone 404R. The rays 406RA, 406RB are reflected by just the facets 69R and undergo grazing if any reflections from both of the facets 69R, 69L. The cone 404R is guided within the optically transmissive waveguide 1.

Reflective facets 69L of input region 68 couple light rays 402L, 406LA, 406LB in light cone 404L from individual LEDs 3 in a leftwards direction. Central ray 402L and extreme rays 406LA, 406LB provide a narrow off-axis ray cone 404L. The rays 406LA, 406LB are reflected by just one of the facets 69L and do not undergo reflections from both of the facets 69R, 69L. The cone 404L is guided within the optically transmissive waveguide 1.

The left hand going rays 406LA, 406LB from the right hand side of the input deflection region will not experience double bouncing whereas the right hand going rays 406RA, 406RB can experience some grazing reflections off the falling facets 69L.

As illustrated in FIG. 4, the air gap 99 provides coupling of light into the planar surface 62 at the critical angle $\theta_c$ within the material of the waveguide 1 and the maximum width c of the region 68 is provided by the critical angle $\theta_c$ of the light into the material of the waveguide 1 and the thickness d of the waveguide 1.

Desirable facet angles for the interleaved facets 69R, 69L will now be described.

Figure 5B:
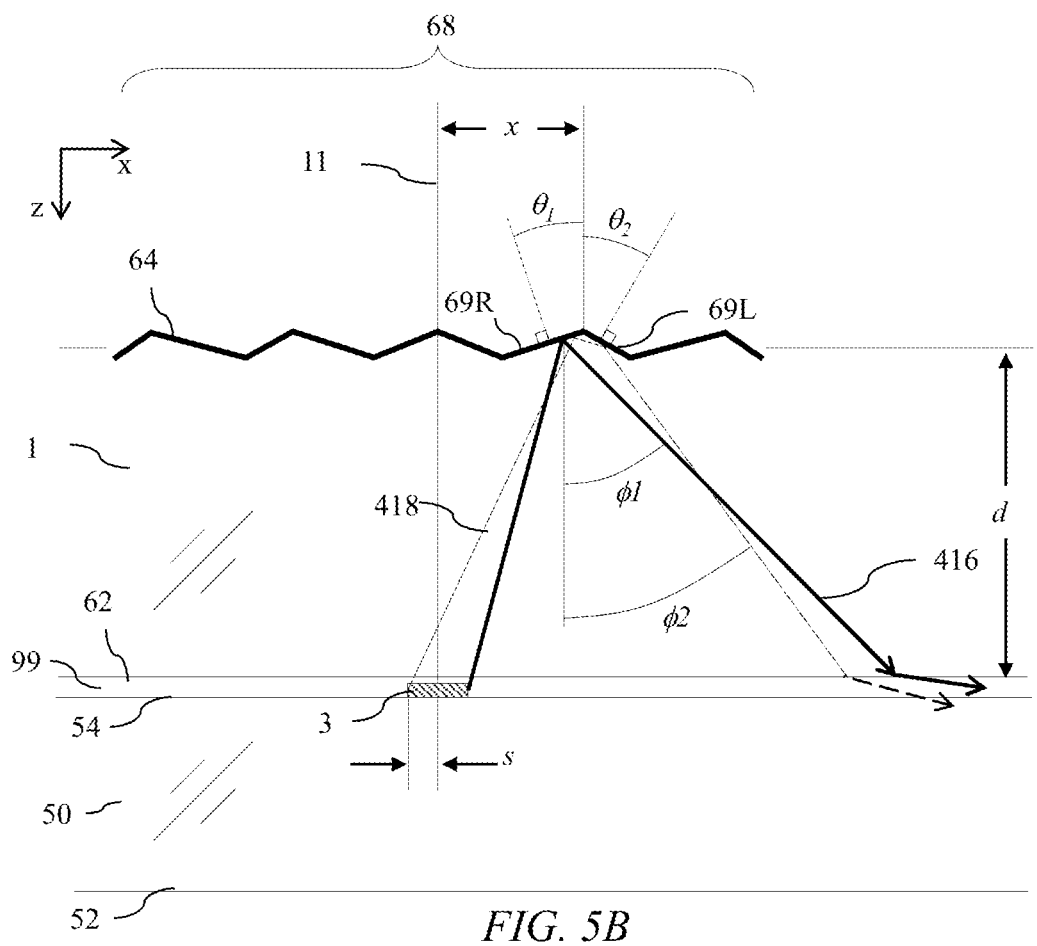
FIG. 5B is a schematic diagram illustrating in side view limits of operation of the input structure of a reflector for an illumination apparatus.

FIG. 5B is a schematic diagram illustrating in side view limits of operation of the input structure of a reflective surface 64 for a waveguide 1 of the illumination apparatus 100. The paths of maximally deflected extreme rays 481, 416 emanating from left and right edges of the LED 3 determine said limits. Features of the arrangement of FIG. 5B not discussed in further detail may be assumed to correspond to the features with equivalent reference numerals as discussed above, including any potential variations in the features.

Light ray 416 is directed by facet 69R at an angle φ1 to the normal to the waveguide 1 that is at or greater than the critical angle $\theta_c$. Undesirably light ray 416 is coupled out of the waveguide 1 and provides a hot spot. The minimum tilt angle θ1 of facet 69R is determined by the critical angle $\theta_c$.

Light ray 418 is directed by both facets 69R, 69L and is similarly couple out, causing a hot spot. The maximum tilt angle θ1 of facet 69R is determined by the rays 418 that can have incidence on both facets 69R, 69L. Light rays are provided that are guided within the waveguide 1.

Illustrative embodiments will now be described.

Figure 6A:
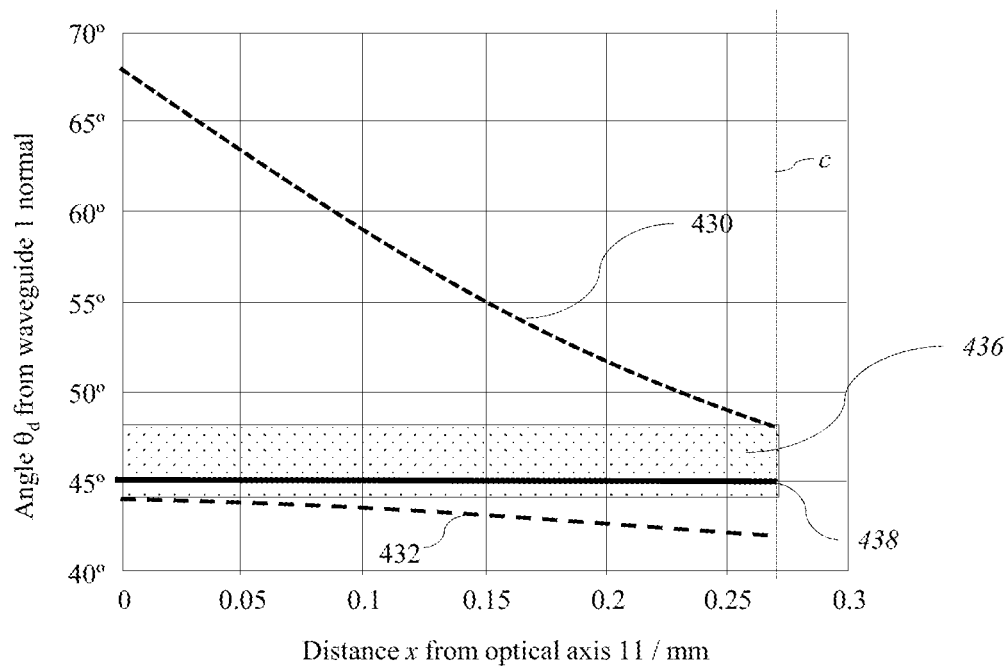
FIG. 6A is a schematic graph illustrating the variation of limits of operation of the input structure of a reflector for an illumination apparatus.
Figure 6B:
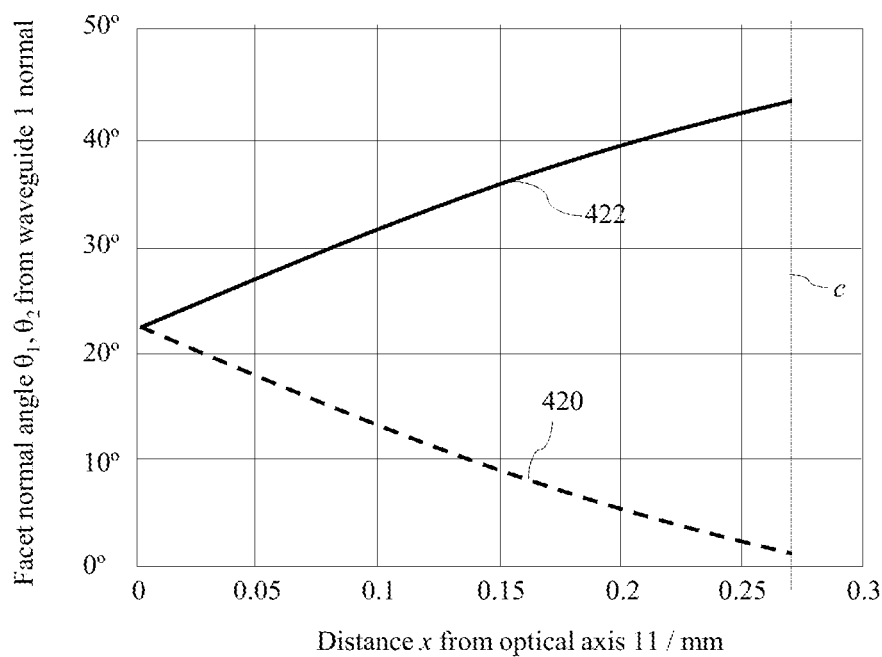
FIG. 6B is a schematic graph illustrating the variation of facet normal tilt against lateral position for a constant nominal deflection angle.

FIG. 6A is a schematic graph illustrating the variation of limits of operation of the input structure of a reflector for an illumination apparatus over the width c of the input region 68 for the illustrative embodiment of TABLE 1; and FIG. 6B is a schematic graph illustrating the variation of facet normal tilt against lateral position for a constant nominal deflection angle for the illustrative embodiment of TABLE 1.

TABLE 1

| Item | Value |
| --- | --- |
| Reflective element maximum width, w (mm) | 11 |
| LED half width, s (micrometers) | 25 |
| Centre thickness, d (mm) | 0.30 |
| Waveguide refractive index, n | 1.58 |
| Nominal deflection angle $\theta_d$ (°) | 45 |
| Extraction facet 72 pitch, p (mm) | 0.2 |
| Extraction facet 72 tilt angle, $\theta_f$ (°) | 22.5 |
| Extraction facet pair surface normal angle (°) | 22.5 |

The light emitting diodes 3 have a maximum width of at most 300 micrometers, preferably less than 200 micrometers and most preferably at most 100 micrometers. In the at least one cross-sectional plane the distance between the transmissive output surface and reflective surface 64 is less than 1000 micrometres, preferably less than 500 micrometres and more preferably less than 250 micrometres. Advantageously the total area of semiconductor material may be reduced, achieving reduced cost. A low thickness illumination apparatus may be provided. The illumination apparatus may be flexible and have high uniformity.

Returning to FIGS. 5A-B, the present embodiments achieve a desirable nominal deflection angle $\theta_d$ for the light cone 404 propagating in the waveguide as will now be described by considering light rays 402, 406A, 406B that are propagating in the positive/rightwards direction.

Profile 430 of FIG. 6A illustrates the variation of maximum angle $\theta_d$ with distance x from the optical axis 11 while providing light cone 404R that guides within the waveguide 1.

Profile 432 of FIG. 6A illustrates the variation of minimum angle $\theta_d$ with distance x from the optical axis 11 while providing light cone 404R that guides within the waveguide 1.

Desirably the output angle $\theta_d$ is constant across the input region 68, to achieve high uniformity of extraction as will be described further below. The region 436 indicates desirable range for the output angle $\theta_d$. In the illustrative example a single value of $\theta_d$ of 45° is chosen, indicated by the profile 438.

The angle $\theta_d$ determines the angles θ1, θ2 of the facets from the vertical direction. FIG. 6B illustrates the illustrative profile 420 for tilt angle θ1 to achieve $\theta_d$ of 45° and the illustrative profile 422 for tilt angle θ2 to achieve $\theta_d$ of 45°.

The reflective facets 69R, 69L of the first and second sets are inclined at tilt angles selected such that light from a point on a light emitting diode on the optical axis is reflected by the reflective facets 69R, 69L at an angle with the optical axis of at most 50 degrees, preferably at most 48 degrees from the normal of the waveguide, and most preferably at most 46 degrees.

The reflective facets 69R, 69L of the first and second sets are inclined at tilt angles selected such that light from a point on a light emitting diode 3 on the optical axis 11 is reflected by the reflective facets 69R, 69L at an angle to the optical axis 11 of at least 43 degrees from the normal of the waveguide 1 and most preferably at least 44 degrees from the normal of the waveguide 1. Advantageously stray light at undesirable angles may be reduced. Hot spots visibility may be reduced.

Within each of the first and second sets of reflective facets 69R, 69L, the reflective facets 69R, 69L are inclined with tilt angles defined between normal of the reflective facets 69R, 69L and the optical axis 11 that decrease for successive reflective facets in the direction in which light is guided away from the optical axis 11. Advantageously high uniformity of collimation may be achieved across the area of the illumination apparatus.

Advantageously narrow cone angles may be achieved with high uniformity across the predetermined area. Stray light rays and hot spots are minimised as will be illustrated below.

Extraction of light from the waveguide 1 will now be described.

Figure 7:
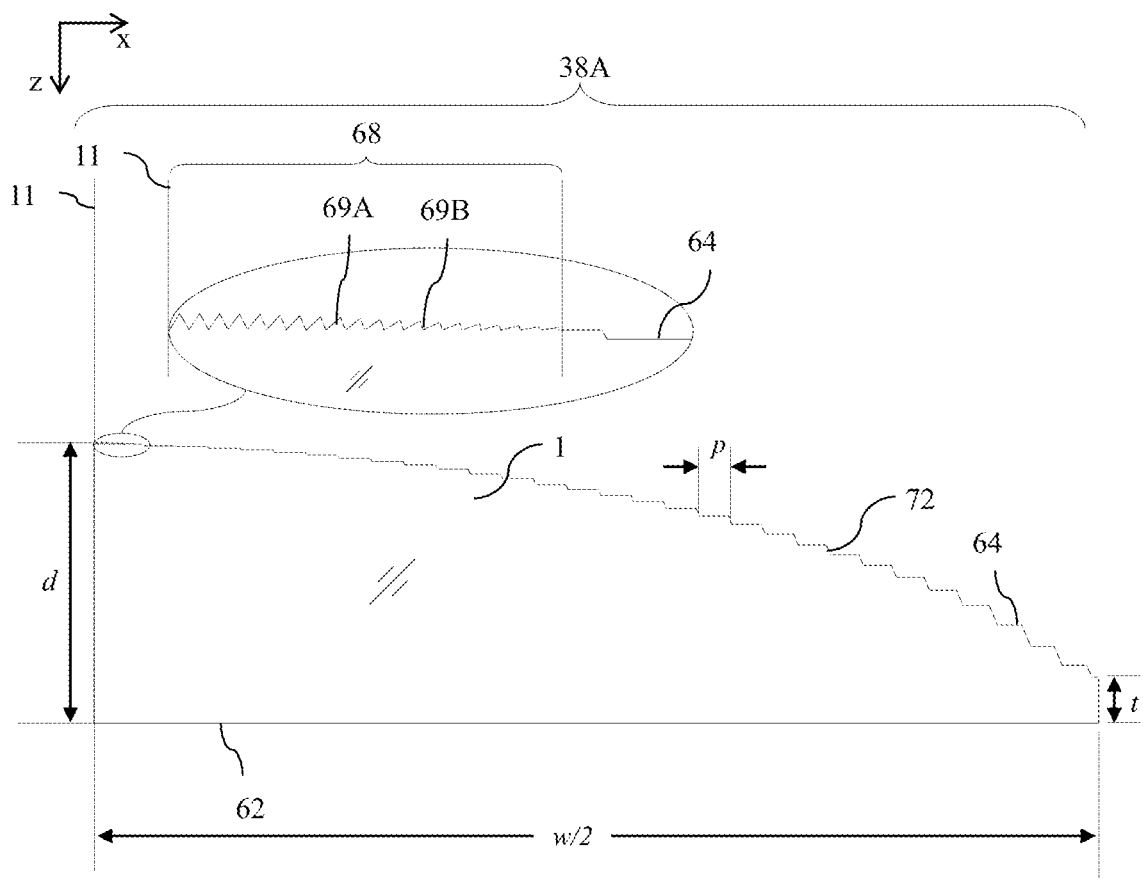
FIG. 7 is a schematic diagram illustrating in side view a waveguide structure reflector comprising a stepped surface.
Figure 8:
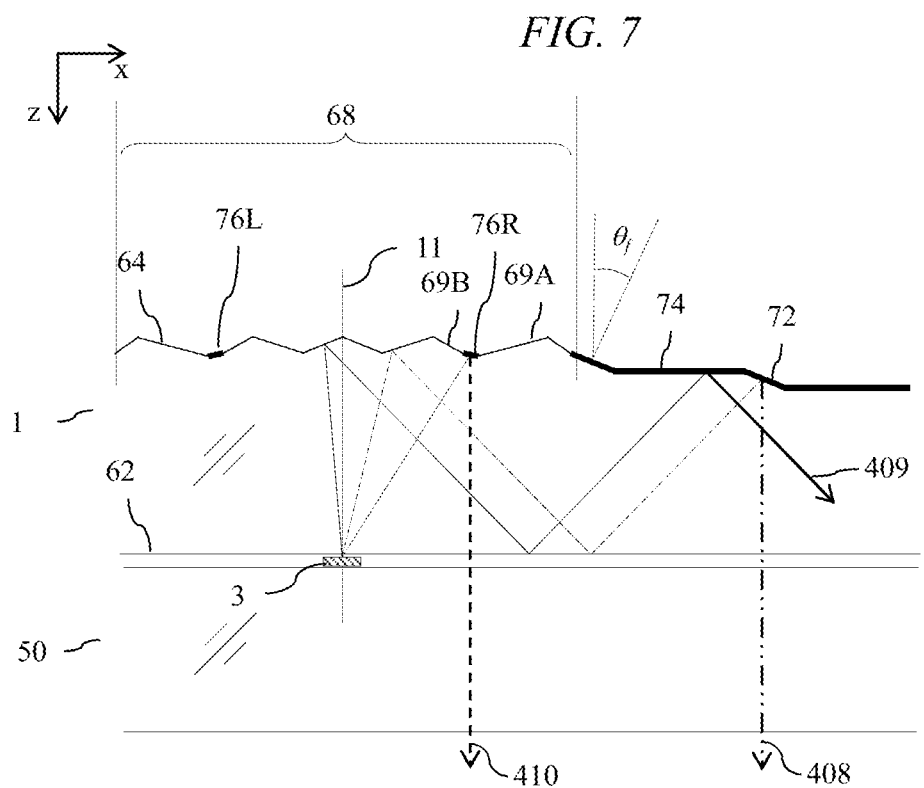
FIG. 8 is a schematic diagram illustrating in side view operation of light extraction features of the reflector of FIG. 7.

FIG. 7 is a schematic diagram illustrating in side view a waveguide 1 structured reflective surface 64 comprising a stepped surface; and FIG. 8 is a schematic diagram illustrating in side view operation of light extraction features of the reflector of FIG. 7. Features of the arrangements of FIGS. 7-8 not discussed in further detail may be assumed to correspond to the features with equivalent reference numerals as discussed above, including any potential variations in the features.

The reflective surface 64 comprises reflective planar regions 74 between the reflective light extraction facets 72. The reflective planar regions 71 and the reflective light extraction facets 72 have a stepped structure. Light extraction facets 72 are inclined to direct light rays 408 that are propagating at angle $\theta_d$ towards a direction parallel to the normal to the waveguide 1. Light rays 409 that are incident on the planar regions 74 continue to guide within the waveguide 1.

Advantageously light may be distributed over a large area by means of guiding. LED cost may be reduced and uniformity increased. Advantageously leakage between adjacent optical elements may be reduced. Dynamic range of a high dynamic range display apparatus 200 may be increased.

The thickness t at the edge of the element 20A is less than the thickness d at the optical axis of the element 20A. Advantageously light is extracted within the unit cell of the illumination element 20A. Some isolation between adjacent unit cells is provided and dynamic range may be increased in high dynamic range operation.

Some of the reflective light extraction facets 76R are arranged to direct light that 410 has not guided within the optical element 38. Thus some light rays 410 that are incident on facets 76R, 76L are extracted from within the input region 68. Advantageously some light may be extracted near the LEDs. The visibility of hotspots or dim spots near the LEDs may be reduced.

The optical output of an illustrative embodiment obtained by simulation will now be described.

Figure 9A:
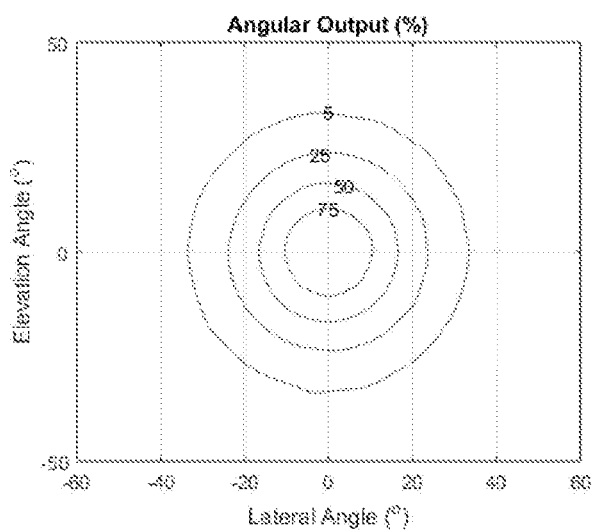
FIG. 9A is a schematic graph illustrating the polar profile of output luminance for an illustrative embodiment of FIG. 7.
Figure 9B:
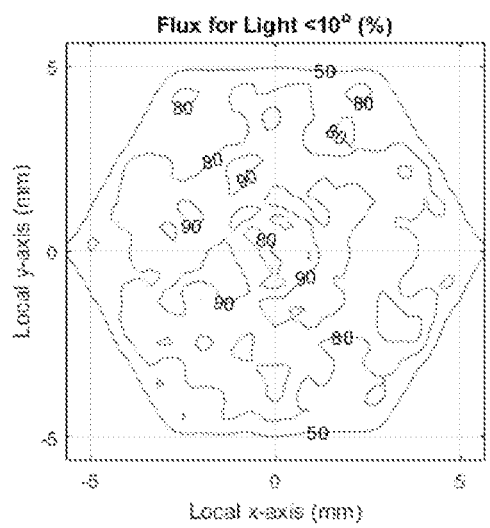
FIG. 9B is a schematic graph illustrating the spatial luminance distribution for light output within a 10° polar angle for an illustrative embodiment of FIG. 7.

FIG. 9A is a schematic graph illustrating the polar profile of output luminance for an illustrative embodiment of FIG. 7 and a 30 degree FWHM diffuser; FIG. 9B is a schematic graph illustrating the spatial luminance distribution for light output within a 10° polar angle for an illustrative embodiment of FIG. 7; and FIG. 9C is a schematic graph illustrating the spatial luminance distribution for all light output for an illustrative embodiment of FIG. 7.

FIG. 9A illustrates the collimated output of the illumination apparatus 100. The light emitting diodes 3 output light in respective first light output distributions, and the optical elements 38 output light from the waveguide 1 originating from each light emitting diode 3 in a respective second light output distribution that has a luminous intensity half maximum solid angle that is smaller than the luminous intensity half maximum solid angle of the respective first light output distribution of the light emitting diode 3 from which the light originates. The ratio of luminous intensity half maximum solid angle of the second light output distribution to the luminous intensity half maximum solid angle of a Lambertian light distribution is less than 1, preferably less than 0.5, more preferably less than 0.25 and most preferably less than 0.1.

Figure 9C:
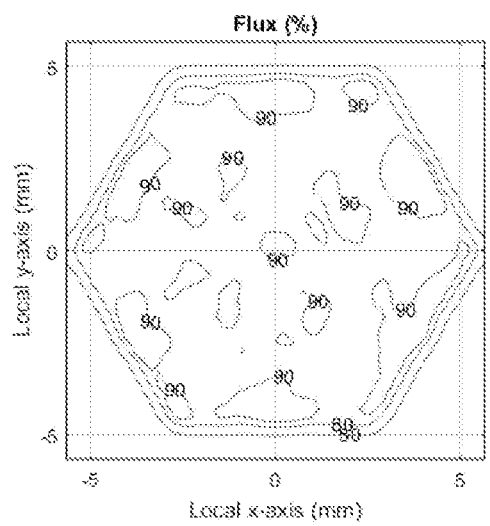
FIG. 9C is a schematic graph illustrating the spatial luminance distribution for all light output for an illustrative embodiment of FIG. 7.

FIGS. 9B-C illustrate that high uniformity is achieved for collimated light across the predetermined area. Advantageously a collimated output may be achieved with high uniformity. High efficiency may be provided in desirable output directions. A backlight suitable for privacy display, high efficiency display and low stray light night mode display may be provided.

Note that without the diffuser 203, the light cone provided by the illustrative embodiment is within a polar angle of 5 degrees from the normal to the waveguide 1. Advantageously a narrow output light cone may be provided with high uniformity for on-axis viewing positions and for off-axis viewing positions.

In an environmental illumination apparatus low glare may be achieved other than for direct viewing from within the light cone.

It may be desirable to reduce the variation of thickness of the reflector in comparison to that illustrated in FIG. 7.

Figure 10A:
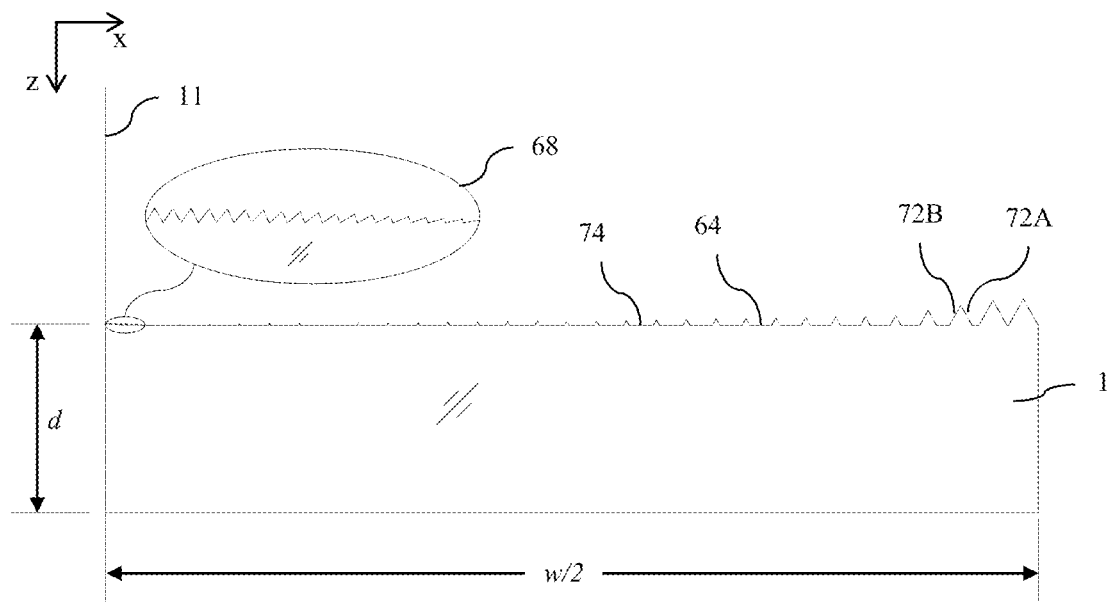
FIG. 10A is a schematic diagram illustrating in side view a waveguide structure reflector comprising a faceted reflective surface.
Figure 10B:
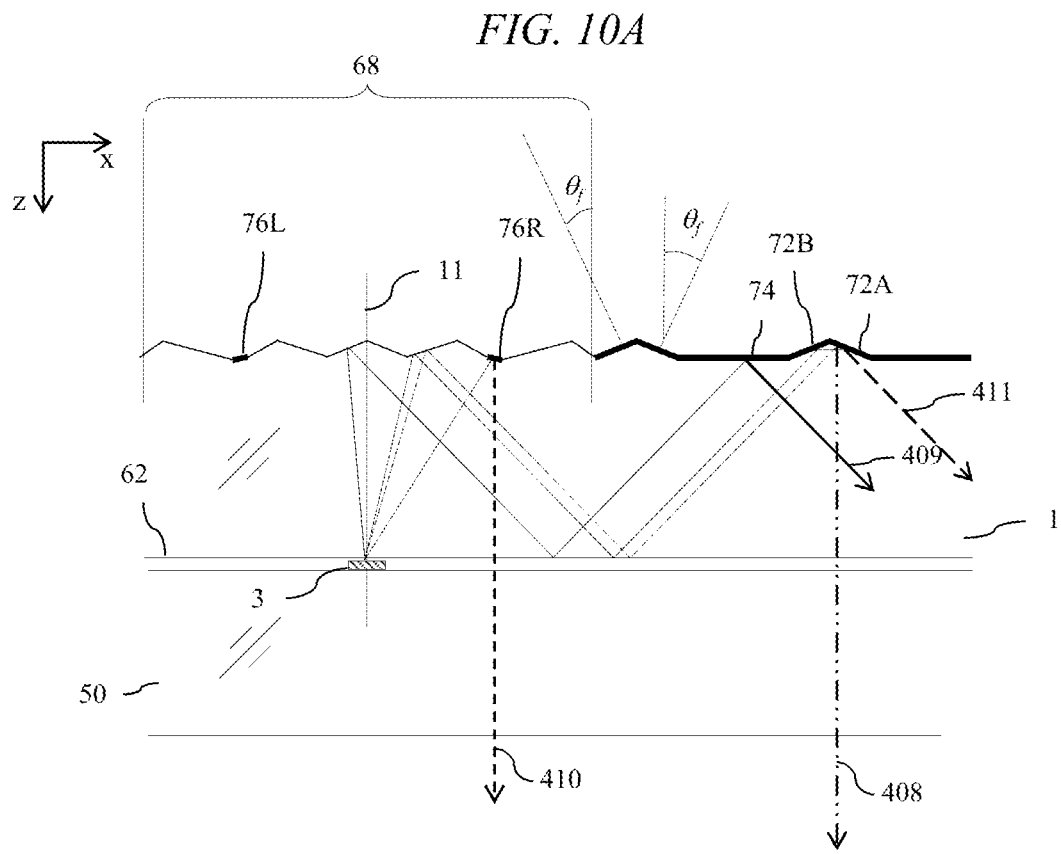
FIG. 10B is a schematic diagram illustrating in side view operation of light extraction features of the reflector of FIG. 10A.

FIG. 10A is a schematic diagram illustrating in side view a waveguide 1 structured reflective surface 64 comprising a faceted reflective surface 64; and FIG. 10B is a schematic diagram illustrating in side view operation of light extraction features of the reflector of FIG. 10A. Features of the arrangements of FIGS. 10A-B not discussed in further detail may be assumed to correspond to the features with equivalent reference numerals as discussed above, including any potential variations in the features.

In the at least one cross-sectional plane the reflective light extraction facets 72 comprise plural pairs of inclined facets 72a, 72b facing the optical axis 11. The reflective surface 64 comprises reflective planar regions 74 between the reflective light extraction facets 72. In comparison to the illustrative embodiment of FIG. 7, the embodiment of FIG. 10A may be provided by replication onto the surface of a planar waveguide, by UV casting, embossing or other known replication techniques. Cost may be reduced and thinner structures may be provided.

The operation of the structure of the FIGS. 10A-B is similar to that of FIG. 7 other than the light extraction facets comprise pairs of facets 72A, 72B with tilt angles $\theta_f$. Rays 411 that are incident on both facets 72A, 72B are reflected within the waveguide and remain as guiding rays. Advantageously light rays 408, 410 are the extracted rays and collimation is retained. Advantageously light from an LED may be extracted by more than one optical element of the array. Uniformity may be increased.

In the at least one cross-sectional plane the distance d between the transmissive output surface 62 and reflective surface 64 is less than 1000 micrometres, preferably less than 500 micrometres and more preferably less than 250 micrometres. Advantageously a thin and flexible LCD display may be provided with high dynamic range local dimming operation.

Returning to FIG. 1B, in the at least one cross-sectional plane the reflective light extraction facets 72 have a separation f that decreases with distance from the optical axis 11 of the optical element 38. The reduction of separation f achieves increased extraction for outer areas that have a lower luminous intensity of guided light. Advantageously uniformity of output may be increased.

Figure 11A:
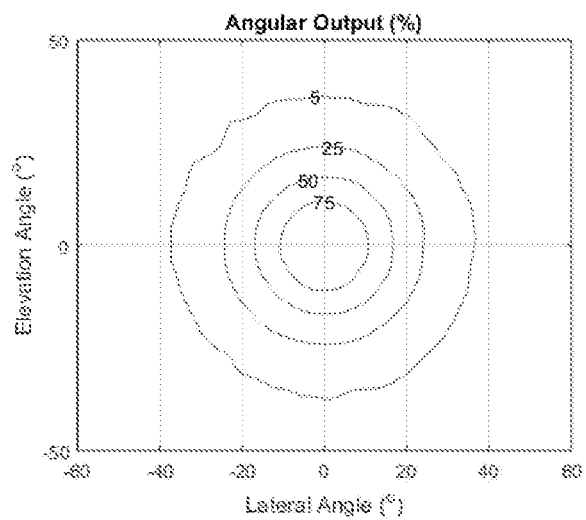
FIG. 11A is a schematic graph illustrating the polar profile of output luminance for an illustrative embodiment of FIG. 10A.
Figure 11B:
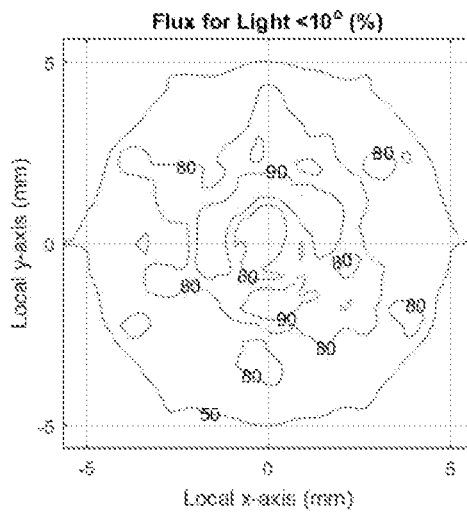
FIG. 11B is a schematic graph illustrating the spatial luminance distribution for light output within a 10° polar angle for an illustrative embodiment of FIG. 10A.
Figure 11C:
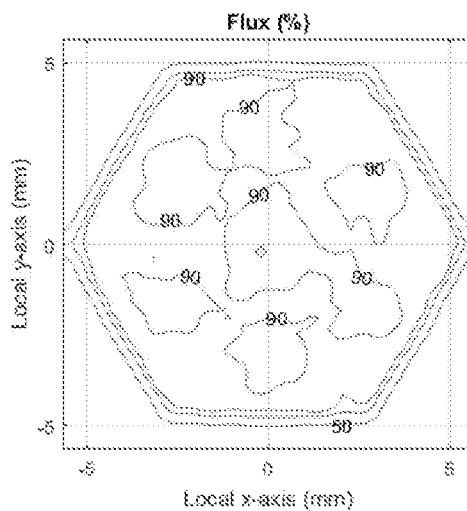
FIG. 11C is a schematic graph illustrating the spatial luminance distribution for all light output for an illustrative embodiment of FIG. 10A.

FIG. 11A is a schematic graph illustrating the polar profile of output luminance for an illustrative embodiment of FIG. 10A; FIG. 11B is a schematic graph illustrating the spatial luminance distribution for light output within a 10° polar angle for an illustrative embodiment of FIG. 10A; and FIG. 11C is a schematic graph illustrating the spatial luminance distribution for all light output for an illustrative embodiment of FIG. 10A.

Advantageously a narrow output light cone may be provided with high uniformity for on-axis viewing positions and for off-axis viewing positions and in a thin optical structure.

Optical structures that may be optionally provided near the region of the LED 3 will now be described.

Figure 12A:
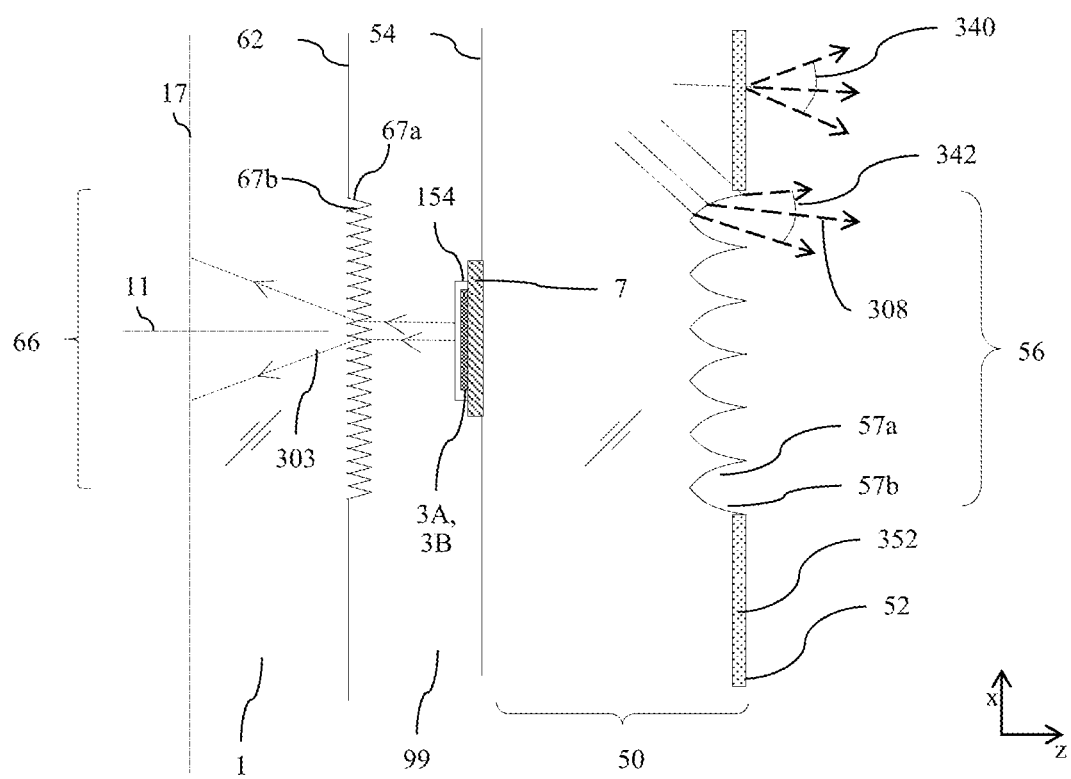
FIG. 12A is a schematic diagram illustrating in top view the transmissive output surface of the LED support substrate arranged to provide diffused output.

FIG. 12A is a schematic diagram illustrating in top view a detail of the optical element 38 comprising the refractive light input structure 66 and refractive light output structure 56 of the transmissive output surface 52 of the LED support substrate arranged to wherein the structure 56 further provides diffused output. Features of the arrangement of FIG. 12A not discussed in further detail may be assumed to correspond to the features with equivalent reference numerals as discussed above, including any potential variations in the features.

Each optical element 38 further comprises a refractive light output structure 56 formed in a front surface of the transmissive support substrate 50 in front of the respective at least one emitting diode 3. Some of the reflective light extraction facets 72 of each optical element 38 are arranged to direct light rays 308 to the refractive light output structure 56 of the optical element 38. Each optical element 38 has mirror symmetry about an optical axis 11 in at least one cross-sectional plane.

In the at least one cross-sectional plane the refractive light output structure 56 may comprise a concave refractive surface arranged to provide negative optical power.

In the embodiment of FIG. 12A, in the at least one cross-sectional plane the refractive light input structure 56 comprises a plurality of pairs of oppositely inclined refractive input facets 57a, 57b. In other words, the refractive light output structure 56 comprises a plurality of pairs of oppositely inclined transmissive light deflecting facets. Transmissive light deflecting facets 57a, 57b may be provided with curved surfaces, such that light cone solid angle 342 for light rays 308 from the surfaces 57a, 57b is substantially the same as the cone 340 from diffuser surface 352 that may be arranged on the surface 52.

Thus, the angular light output distribution of light from the refractive light output structure 56 is substantially the same as the angular light output distribution of light from the plurality of reflective light extraction facets 72 that is transmitted through regions of the transmissive output substrate that do not comprise a refractive light output structure 56. Advantageously spatial and angular uniformity may be increased in the region of the LED 3.

The transmissive surface 62 of the input substrate comprises planar regions 74 between the refractive light input structure 56s.

FIG. 12A further illustrates an embodiment wherein the transmissive surface 62 of each optical element 38 further comprises a refractive light input structure 66 formed in the transmissive surface 62 of the waveguide 1 and aligned with the respective at least one of light emitting diode 3 so that the light emitted thereby passes through the refractive light input structure 56. Each optical element 38 has mirror symmetry about an optical axis 11 in at least one cross-sectional plane and comprises refractive facets 67a, 67b.

The optical output 303 of a Lambertian micro-LED illuminating refractive facets 67a, 67b will now be described further.

Figure 12B:
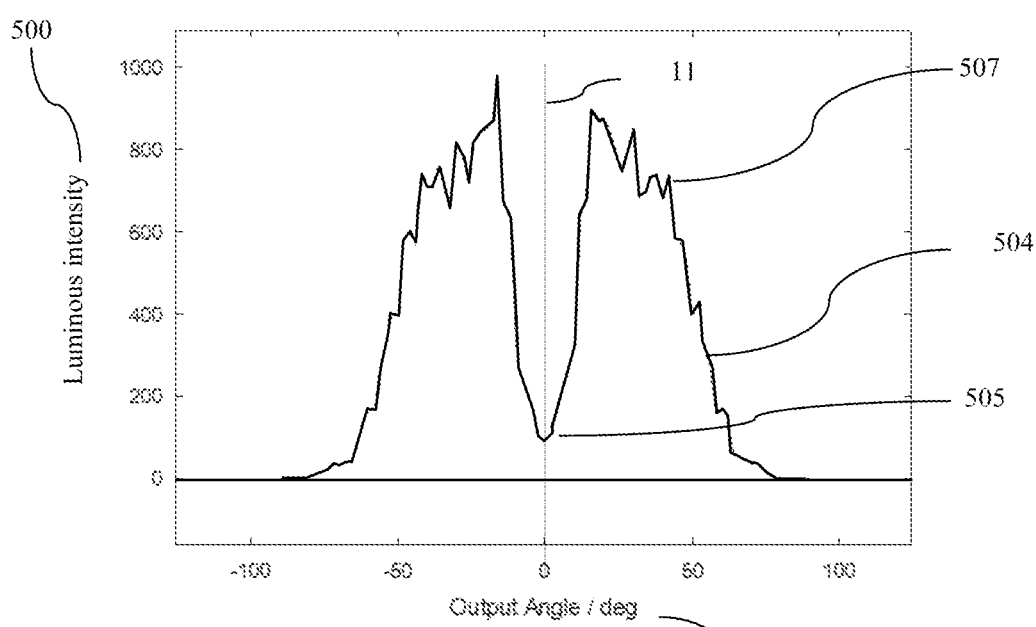
FIG. 12B is a schematic graph illustrating the variation of output luminous intensity from a refractive microstructure of FIG. 12A on the transmissive side of the input substrate of an optical element.

FIG. 12B is a schematic graph illustrating in at least one cross-sectional plane the profile 504 of simulated output luminous intensity 500 with illumination angle 502 from a refractive light input structure 66 onto a nominal detector plane 17 arranged between the light input structure 66 and the reflective surface 64 and arranged to receive light before incidence onto the reflective surface 64. Features of the arrangement of FIG. 12B not discussed in further detail may be assumed to correspond to the features with equivalent reference numerals as discussed above, including any potential variations in the features.

Profile 504 has a dip 505 in directions that are on-axis and thus reduced luminous intensity is directed towards the axial location of the reflector 68 of the refractive light input structure 68 of FIG. 12A. Facets 67a, 67b provide increased luminous intensity in directions near peak 507 that illuminate outer reflective facets 69R, 69L of the rear reflective surface in FIG. 12B. Some light rays are directed at angles greater than the critical angle. The luminous flux profile of guided light in the waveguide may be modified. Advantageously less guided light is incident on the transmissive surface 62 near to the LEDs 3 and hotspots may be reduced. The uniformity of the display from a wide range of viewing angles may be maintained, minimising image mura.

It may be desirable to provide a large area uniform illumination of a wavelength conversion layer from widely spaced LEDs 3.

Figure 13A:
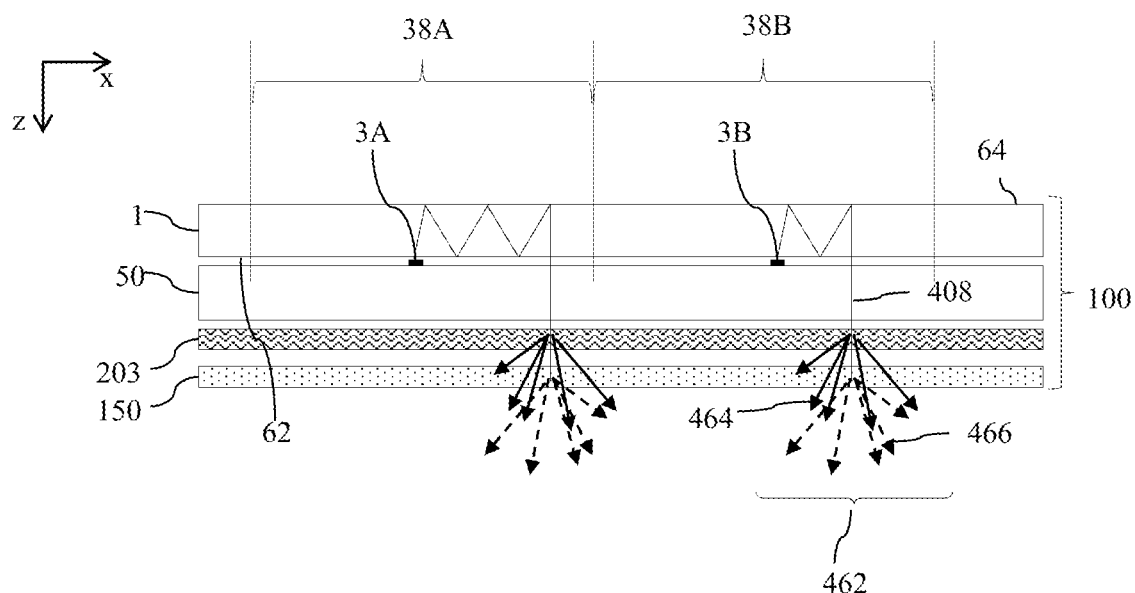
FIG. 13A is a schematic diagram illustrating in side view an optical stack comprising a wavelength conversion layer.

FIG. 13A is a schematic diagram illustrating in side view an illumination apparatus 100 comprising a light scattering layer 203 and a wavelength conversion layer 150 arranged across the predetermined area. Features of the arrangement of FIG. 13A not discussed in further detail may be assumed to correspond to the features with equivalent reference numerals as discussed above, including any potential variations in the features.

In comparison with the embodiment of FIGS. 1A-B, wavelength conversion layer 154 is omitted. Advantageously cost and complexity of fabrication of the LED 3 array is reduced.

The illumination apparatus further comprises a wavelength conversion layer 150 arranged so that light output from the waveguide 1 passes therethrough. In operation blue light is provided by LED 3 and directed by light rays 408 towards the light scattering layer 150. Light is diffused to rays 464 by the light scattering layer 203. Advantageously blue light is provided with a wide cone angle.

The scattered light is incident on the wavelength conversion layer which may comprise a phosphor or quantum dot material for example. Scattered yellow light rays 466 are generated and mixed with the scattered blue light to provide a wide angle white light illumination. White light cone 462 is provided as output.

Further blue light scattering material may be provided within the layer 150 and diffuser 203 may be omitted, advantageously reducing cost, thickness and complexity.

Advantageously uniform illumination may be provided over the predetermined area for high dynamic range operation and for high MPRT in a thin illumination apparatus 100. The spacing of the LEDs 3 may be high so that total LED 3 cost is reduced. In the case that the LEDs 3 are placed sequentially, for example using pick-and-place manufacturing equipment, the number of alignment steps may be substantially reduced.

It may be desirable to increase the viewing angle of the collimated illumination apparatus.

Figure 13B:
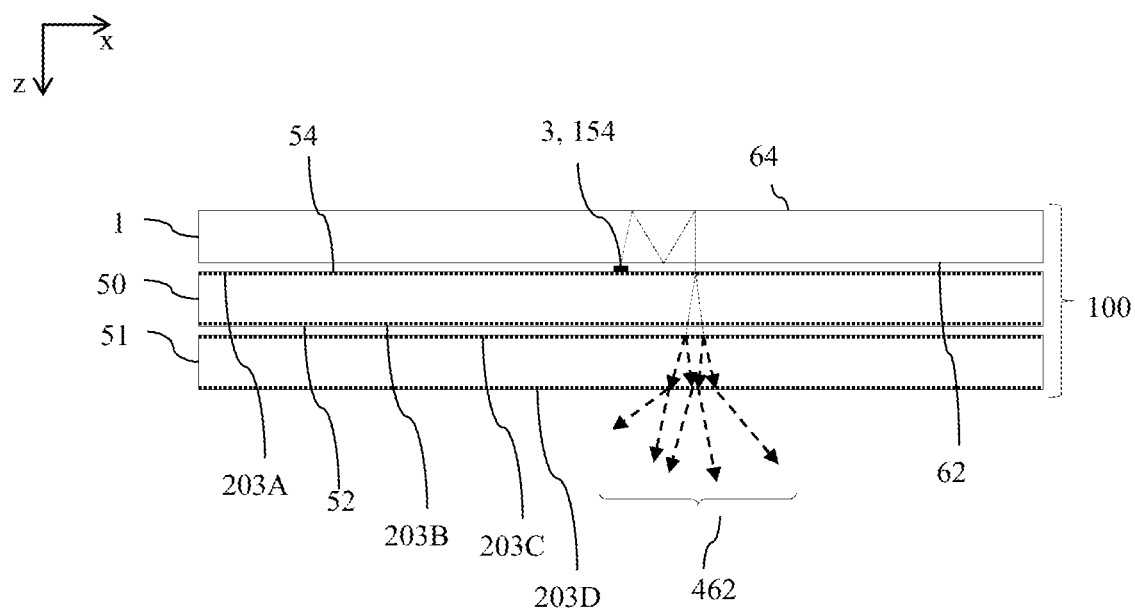
FIG. 13B is a schematic diagram illustrating in side view an optical stack comprising plural light diffusing layers.

FIG. 13B is a schematic diagram illustrating in side view an illumination apparatus 100 comprising plural light diffusing layers 203A, 203B, 203C arranged on support substrate 50 and an additional substrate 51. Features of the arrangement of FIG. 13B not discussed in further detail may be assumed to correspond to the features with equivalent reference numerals as discussed above, including any potential variations in the features.

The illumination apparatus further comprises diffuser structures 203A arranged on at least one surface of the transmissive support substrate 50. Support substrate 50 comprises first and second surfaces 52, 54 that may comprise light diffusing structures such as surface relief structures. Further diffuser layers 203C, 203D may be provided on a diffuser support substrate 51. Output light rays 462 may be provided.

An illustrative embodiment of the arrangement of FIG. 13B will now be given.

Figure 14A:
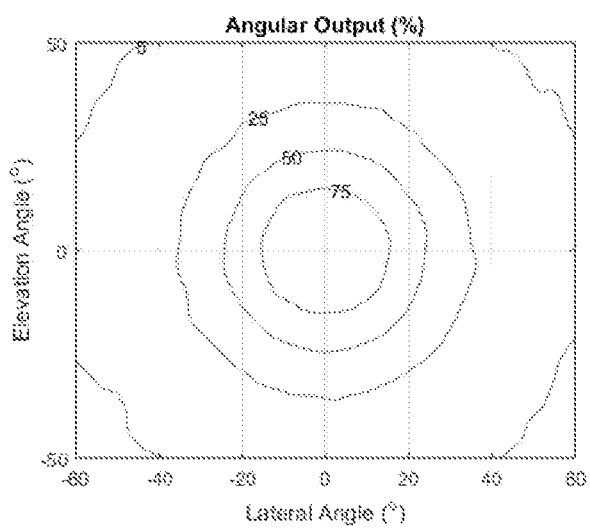
FIG. 14A is a schematic graph illustrating the polar profile of output luminance for an illustrative embodiment of FIG. 10A with the optical stack of FIG. 13B.
Figure 14B:
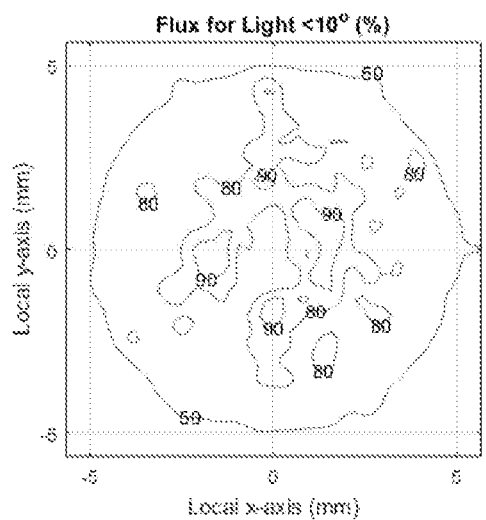
FIG. 14B is a schematic graph illustrating the spatial luminance distribution for light output within a 10° polar angle for an illustrative embodiment of FIG. 10A with the optical stack of FIG. 13B.
Figure 14C:
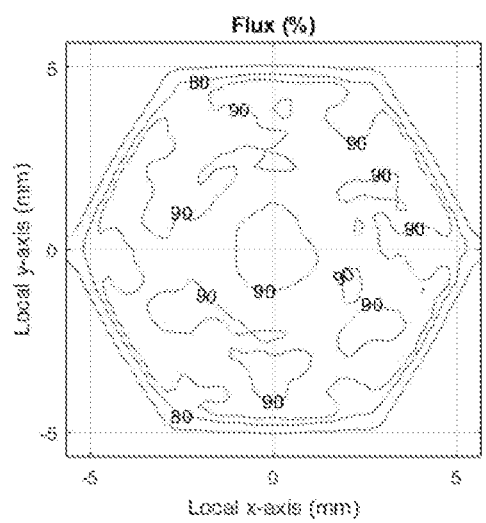
FIG. 14C is a schematic graph illustrating the spatial luminance distribution for all light output for an illustrative embodiment of FIG. 10A with the optical stack of FIG. 13B.

FIG. 14A is a schematic graph illustrating the polar profile of output luminance for an illustrative embodiment of FIG. 10A with the illumination apparatus 100 of FIG. 13B; FIG. 14B is a schematic graph illustrating the spatial luminance distribution for light output within a 10° polar angle for an illustrative embodiment of FIG. 10A with the illumination apparatus 100 of FIG. 13B; and FIG. 14C is a schematic graph illustrating the spatial luminance distribution for all light output for an illustrative embodiment of FIG. 10A with the illumination apparatus 100 of FIG. 13B.

A stack with 30° FWHM diffusers 203A, 203B is provided for an illustrative embodiment. In the present description a 30° FWHM diffusers planar wave gives a Gaussian profile with 30° full width half maximum output distribution.

Advantageously increased light cone angle may be provided with high uniformity.

It may be desirable to provide increased resilience to environmental and mechanical changes of the illumination apparatus.

Figure 15A:
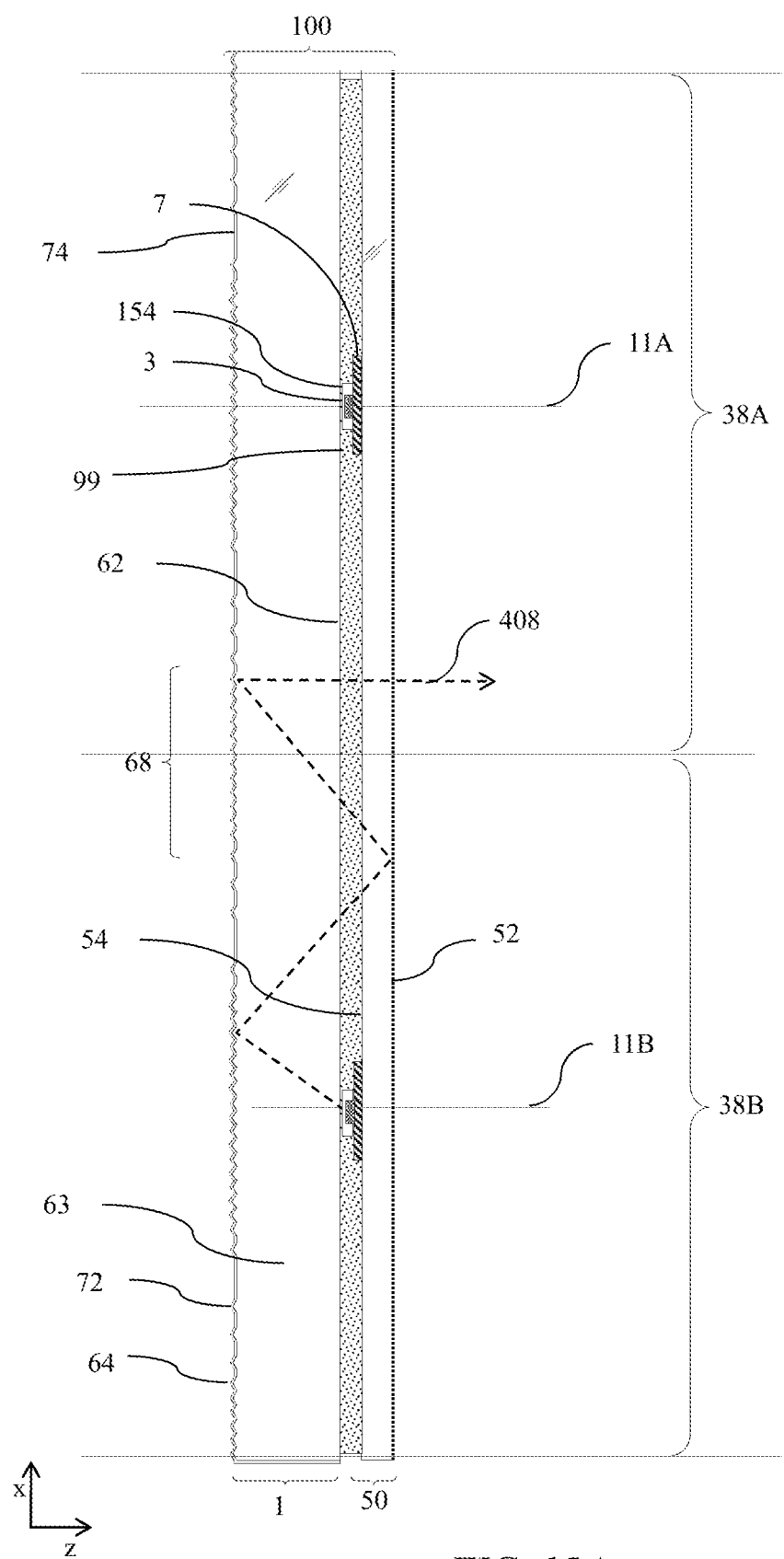
FIG. 15A is a schematic diagram illustrating in side view a collimated output optical stack of a high efficiency and high dynamic range display apparatus comprising an index matching material between the LED support substrate and the waveguide.

FIG. 15A is a schematic diagram illustrating in side view a collimated output illumination apparatus 100 of a high efficiency and high dynamic range display apparatus 200 comprising an index matching material in the gap 99 between the LED support substrate and the waveguide 1. Features of the arrangement of FIG. 15A not discussed in further detail may be assumed to correspond to the features with equivalent reference numerals as discussed above, including any potential variations in the features.

FIG. 15A illustrates an illumination apparatus 100 for providing illumination over a predetermined area, the illumination apparatus 100 comprising: a transmissive support substrate 50; an array of light emitting diodes 3 supported by the transmissive support substrate 50 on the rear side thereof and arrayed across the predetermined area, and arranged to output light rearwardly; an array of optical elements 38A, 38B arrayed across the predetermined area, rearwardly of the light emitting diodes 3, each optical element 38A, 38B being aligned with a respective at least one light emitting diode 3, and each optical element 38A, 38B comprising a rear layer having a transmissive surface 62 and a reflective surface 64 that is arranged rearwardly of the transmissive surface 62 to receive light from the respective at least one light emitting diode 3 through the transmissive surface 62; and a transmissive material 59 arranged between the transmissive support substrate 50 and the transmissive surfaces 64 of the optical elements 38A, 38B, wherein the rear layers 62, 64 of transmissive layer 63, the transmissive material and the transmissive support substrate 50 have matched refractive indices, and the reflective surface 64 of each optical element 38A, 38B comprises: a reflective light input structure 68 arranged to reflect light received from the respective at least one light emitting diode 3 in directions in which the light reflected thereby is guided within a waveguide 1 formed by the rear layer 64, the transmissive material and the transmissive support substrate 50 by total internal reflection at the front surface of the transmissive support substrate 52; and reflective light extraction facets 72 arranged to reflect light 300 that is guided within the waveguide 1 in directions in which the light reflected thereby is output from the waveguide 1 through the transmissive surface 52. The optical element 38 has mirror symmetry about an optical axis 11 in at least one cross-sectional plane and in the at least one cross-sectional plane the reflective light input structure 68 comprises first and second sets of reflective facets 69R, 69L that are interleaved with each other and are inclined in opposite senses so that the light reflected by the first and second sets of reflective facets 69R, 69L is guided away from the optical axis in opposite directions transverse to the optical axis 11.

In comparison to the arrangement of FIG. 1B, ray 408 is guided between the reflective surface 64 of the layer 63 and the transmissive surface 52 of the LED support substrate 50.

Advantageously the illumination apparatus may be provided with increased stability of alignment between the reflective surface and the LEDs of the array of LEDs. Increased resilience to environmental and mechanical changes of the illumination apparatus 100 is achieved.

Figure 15B:
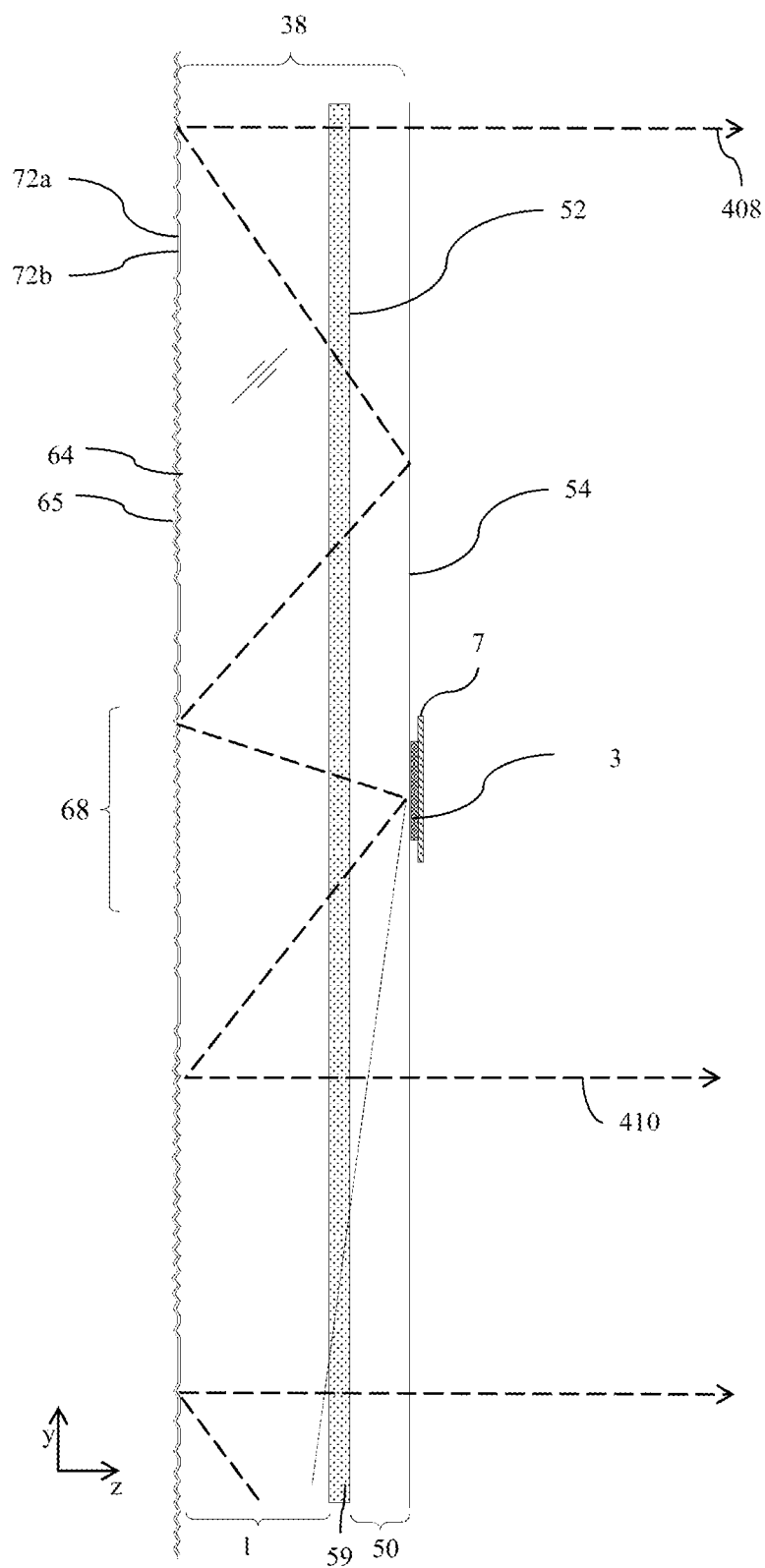
FIG. 15B is a schematic diagram illustrating in top view light rays from a micro-LED and catadioptric optical element comprising a transmissive LED support substrate wherein the second side of the transmissive substrate is attached to the catadioptric substrate.

FIG. 15B is a schematic diagram illustrating in top view light rays from an LED 3 and optical element 38 wherein the rear side 54 of the transmissive support substrate 50 is bonded to the front side 62 of the optical element 38. Features of the arrangement of FIG. 24B not discussed in further detail may be assumed to correspond to the features with equivalent reference numerals as discussed above, including any potential variations in the features.

Figure 24A:
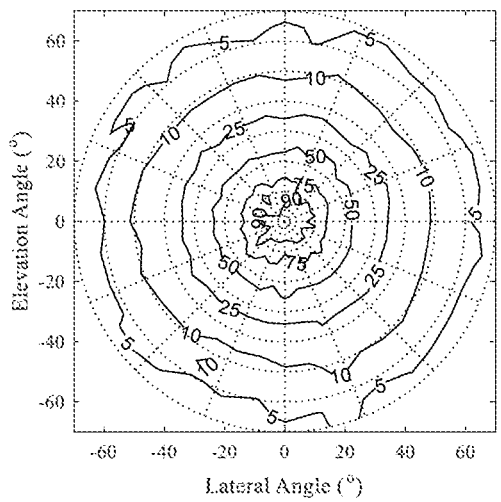
FIG. 24A is a schematic graph of the polar output distribution of luminance for the arrangement of FIG. 1A in series with two of the 30 degree FWHM output diffusers of FIG. 13B.

In comparison to FIG. 24A, the LED 3 is arranged to illuminate through transmissive LED support substrate 50 which is bonded to the waveguide 1. Advantageously device thickness may be reduced while achieving guiding rays 300 to increase spatial uniformity. Substrate 50 may have desirable chemical, thermal and mechanical properties for manufacture of the array of LEDs 3 whereas the waveguide 1 layer may have suitable properties for fabrication of the optical element 38 reflective surface 64.

The output directional distribution of an illustrative embodiment will now be described.

Figure 16A:
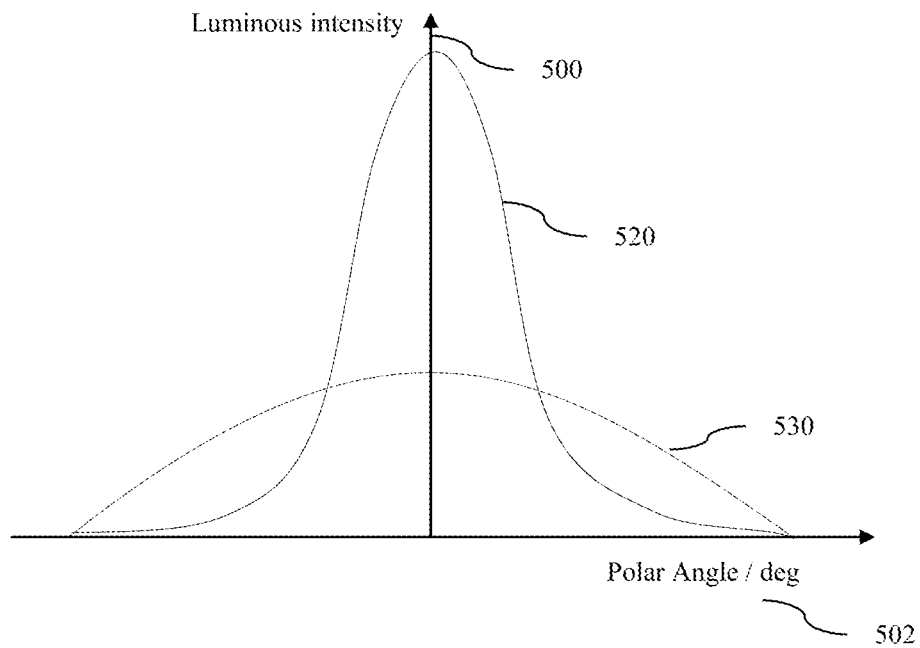
FIG. 16A is a schematic graph illustrating the luminous intensity variation of a directional distribution in comparison to a Lambertian directional distribution.
Figure 16B:
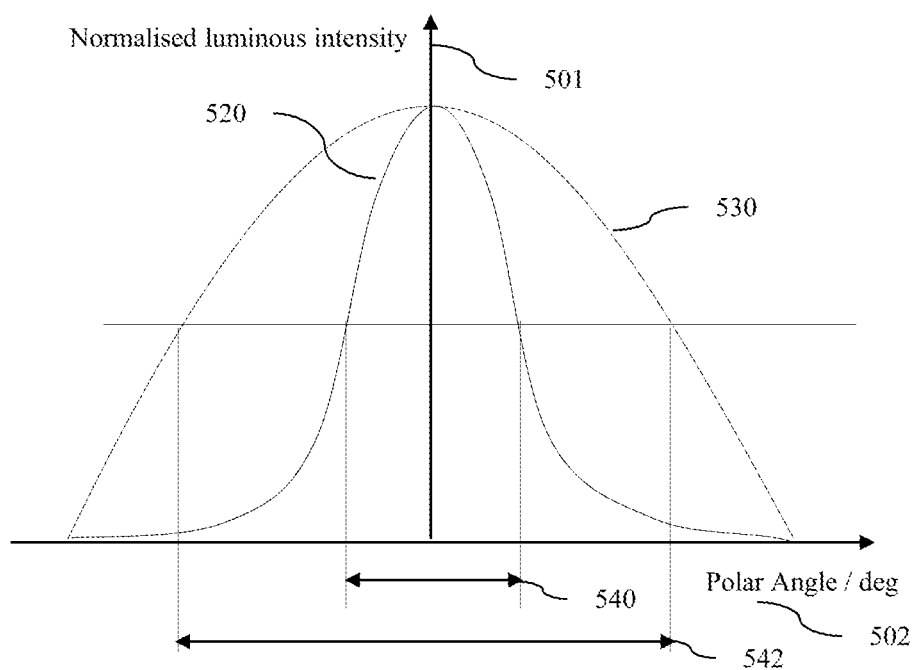
FIG. 16B is a schematic graph illustrating the luminous intensity variation of a normalised directional distribution in comparison to a Lambertian directional distribution.

FIG. 16A is a schematic graph illustrating in one cross-sectional plane the directional distribution 520 from the array of the present embodiments in comparison to a Lambertian directional distribution 530; and FIG. 16B is a schematic graph illustrating in one cross-sectional plane the solid angle of a normalised directional distribution 520 in comparison to a normalised Lambertian directional distribution 530.

Luminous intensity is a measure of the energy density in a light cone and is the number of lumens per unit solid angle. In the present embodiments the luminous intensity half maximum solid angle describes the subtended size of the illumination output cone for which the luminous intensity is half of the peak luminous intensity in each direction.

Luminance of a display is determined by the luminous intensity per subtended unit area. A Lambertian surface has a has a luminance that is independent of viewing angle and thus luminous intensity that is proportional to the cosine of the angle of observation to the normal direction to the surface.

The luminous intensity half maximum solid angle is the solid angle defined by the cone of light in which the luminous intensity in any direction falls to 50% of the peak luminous intensity. The solid angle $\Omega$ of a symmetric cone of full width half maximum angle 20 is given by:

$$\Omega = 2\pi^*(1-\cos\theta) \qquad \text{eqn. 13}$$

A Lambertian light source has a cosine distribution of luminous intensity such that the FWHM 542 illustrated in FIG. 16B is 120 degrees and the half angle, $\theta$ is 60 degrees. In the two-dimensional arrays of the present embodiments, the directional distribution is also two dimensional, so that the profiles 520, 530 are representative of the solid angle of the output.

In the present embodiments, the output is directional, that is the light output distribution 540 thus has a luminous intensity half maximum solid angle that is smaller than the luminous intensity half maximum solid angle of the light output distribution from each of the plurality of light emitting diodes 3A, 3B (that have substantially Lambertian output). The present embodiments achieve half maximum solid angles that are less than $\pi$ steradian and the half cone angle $\theta$ in a single cross-sectional plane is less than 60 degrees, preferably less than approximately 40 degrees, more preferably less than approximately 30 degrees and most preferably less than approximately 20 degrees. In other words, the ratio of luminous intensity half maximum solid angle of the present embodiments to the luminous intensity half maximum solid angle of a Lambertian light source is less than 1, preferably less than 50% and more preferably less than 25%. For a privacy display the ratio is most preferably less than 10%.

In the present disclosure, the angular directional distribution refers to the distribution of luminous intensity for a point on the display, in other words the angular directional distribution is the spread of ray density with angle for the point. The uniformity of a display represents the spatial distribution across the optical array for any given viewing angle.

It would be desirable to provide displays with high spatial and angular uniformity, very low bezel widths and with free form shapes. The arrangement of the optical structures of the present embodiments will now be considered further in front view.

Figure 17A:
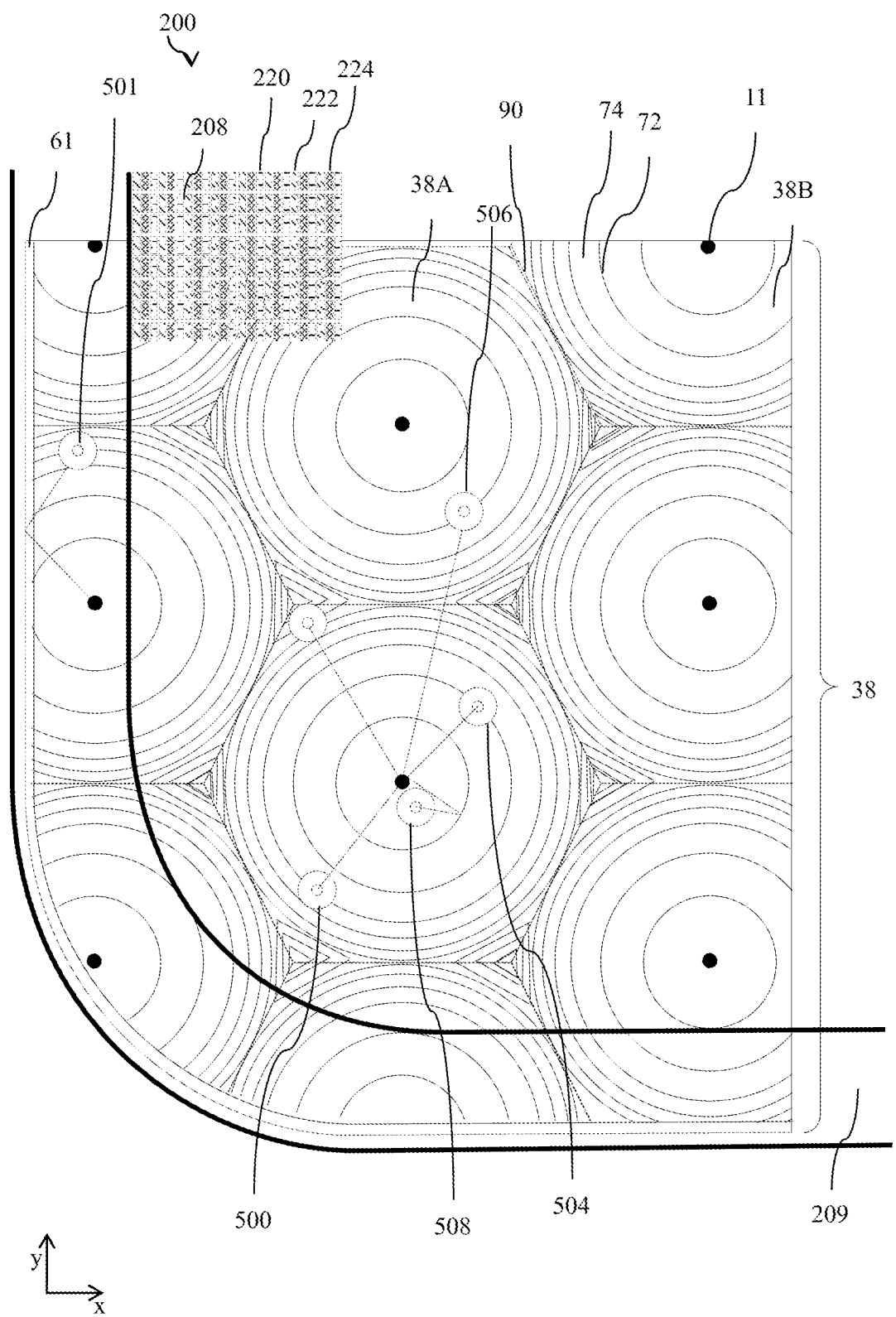
FIG. 17A is a schematic diagram illustrating in front view a display comprising the optical stack of FIGS. 1A-B.

FIG. 17A is a schematic diagram illustrating in front view arrangements of light reflecting facets 72,72 of the reflective surface 64 with a hexagonal extent and hexagonal packing of catadioptric optical elements 20A, 20B. Features of the arrangement of FIG. 17A not discussed in further detail may be assumed to correspond to the features with equivalent reference numerals as discussed above, including any potential variations in the features.

In the plane of the waveguide 1 the light reflecting facets 72, 74 are circularly symmetric. The plurality of light reflecting facets 72, 74 are concentric with the optical axis 11.

The propagation of light rays 500, 504, 506, 508 are illustrated. Light from micro-LED 3 aligned to the optical axis 11 is directed through each of the pixels 220, 222, 224 of the spatial light modulator 48 with substantially the same luminous intensity directional distribution. Advantageously high spatial uniformity may be provided with high efficiency.

In edge region 209 no pixels are provided and inside the edge region 209 the liquid crystal layer 208 comprises pixels 220, 222, 224. The width of the seal region may be 1 mm or less. FIG. 17A further illustrates raypath 501 that may be reflected from reflective material 61 arranged on the edges of the waveguide 1. Advantageously, display bezel width may be minimised and free form display shapes achieved such as the curved display corner illustrated in FIG. 17A.

Further arrangements to achieve uniform spatial uniformity of luminance will now be described.

Figure 17B:
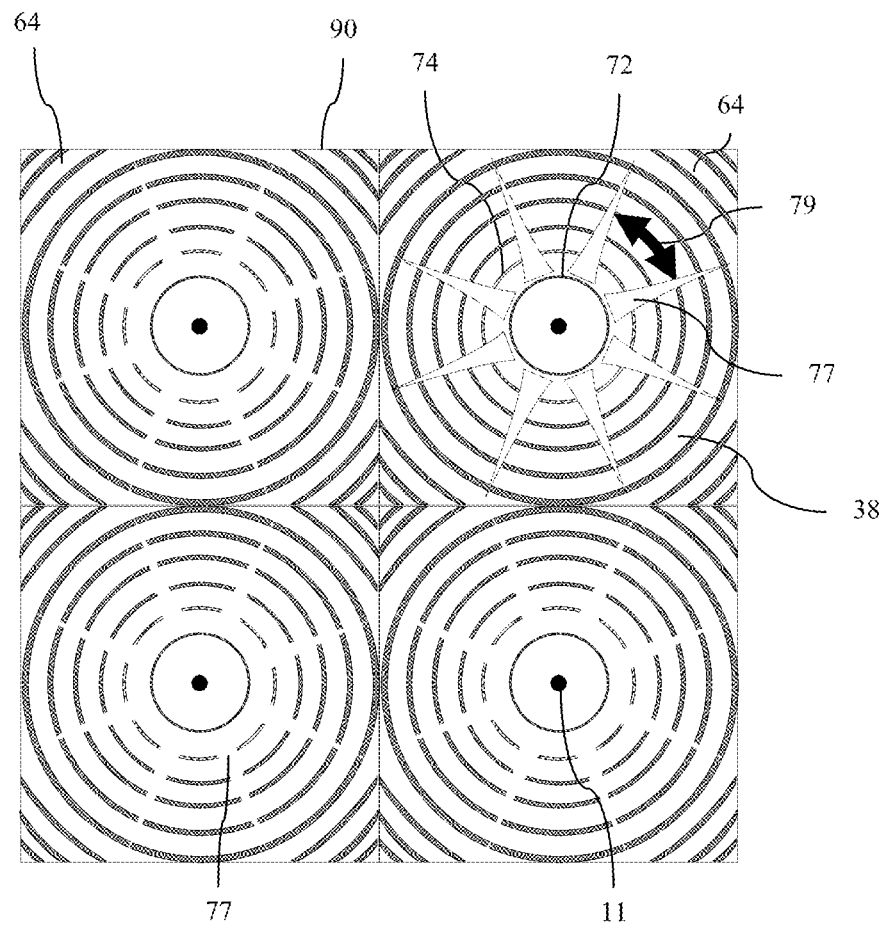
FIG. 17B is a schematic diagram illustrating in front view arrangements of reflective light extraction facets of the reflective surface with a square packing of optical elements.

FIG. 17B is a schematic diagram illustrating in front view arrangements of reflective light extraction facets 72 of the reflective surface 64 with a square extent 90 and a square packing of optical elements 38. Features of the arrangement of FIG. 17B not discussed in further detail may be assumed to correspond to the features with equivalent reference numerals as discussed above, including any potential variations in the features.

Square extent 90 may provide a different mura visibility to the hexagonal extent of FIG. 17A.

The reflective light extraction facets 72 have lengths 79 that increase with distance from the optical axis 11 of the respective optical element 38. The reflective light extraction facets 72 have total areas that increase with the distance from the optical axis 11 of the respective optical element 38. Advantageously uniformity may be increased.

In comparison to arrangement of FIG. 1B, the spacing of the facets 72, 74 in at least one cross sectional plane may be similar. Advantageously the visibility of Moiré beating between the LCD pixels 220, 222, 224 and the facets 72 may be reduced.

Additional planar regions 77 are provided that reduce the total length of each facet 72, 74, with length that varies depending on facet function and distance from the optical axis 11. Thus facets 72 may comprise facet segments 79, the length of the facet segments increasing with distance from the micro-LED 3. Output diffusers, for example arranged on surfaces 52, 54 of transmissive LED support substrate 50 may be arranged to provide uniform output in gap between facet segments.

In the plane of an optical element 38 the length of the reflective light extraction facets 72 increases with distance from the optical axis 11 of the respective optical element 38. Typically, the facets 72 will have an area in the plane of the optical element such that the total area of the reflective light extraction facets 72 increases with the distance from the optical axis 11 of the respective optical element 38. Further, the total area of the reflective light extraction facets 72 is proportional to the distance from the optical axis 11 of the respective optical element 38. Compensation for non-linear variation in luminous intensity may be provided.

Advantageously uniformity is increased and Moiré beating visibility reduced.

It may be desirable to provide collimation from the illumination apparatus 100 in a first axis and no collimation in an orthogonal axis.

Figure 17C:
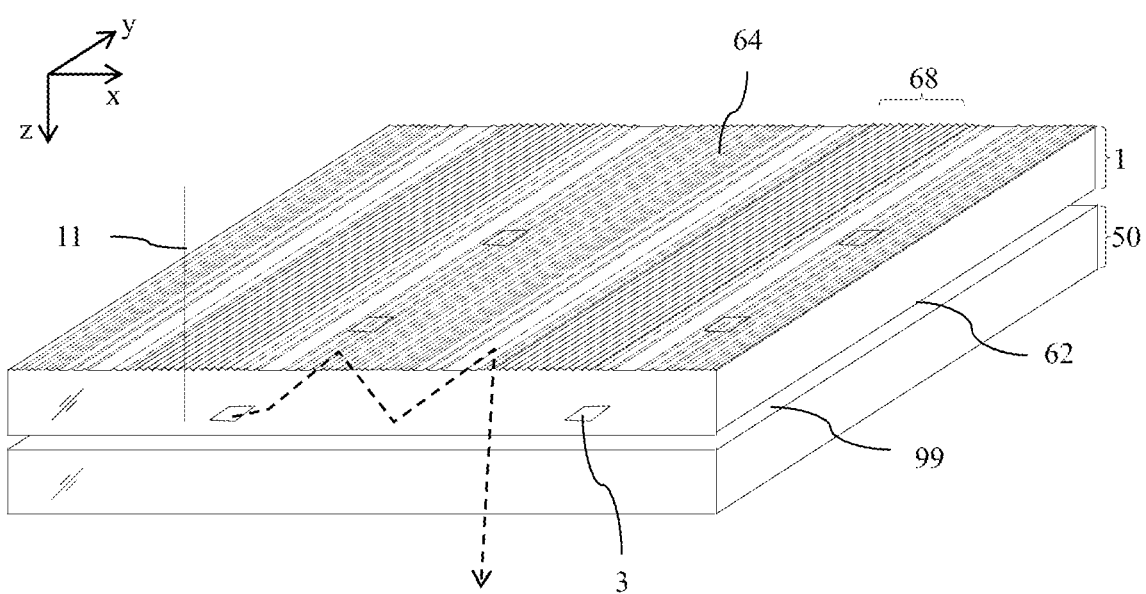
FIG. 17C is a schematic diagram illustrating in front view an optical stack comprising linear array of light input features and light extraction features.

FIG. 17C is a schematic diagram illustrating in perspective side view a one dimensional illumination apparatus 100 with in one plane a cross-sectional profile of reflective surface 64 of the type illustrated in FIGS. 1A-B and aligned LED 3 array. Features of the arrangement of FIG. 17C not discussed in further detail may be assumed to correspond to the features with equivalent reference numerals as discussed above, including any potential variations in the features.

In a case that each optical element has mirror symmetry about an optical axis in a single cross-sectional plane, then the optical elements may have the same configuration perpendicular to that cross-sectional plane. In this case, the optical elements may be arranged in a one dimensional array.

In comparison to the arrangement of FIG. 17A, the optical element 38 is extended in the y-direction. Such an arrangement provides control of cone angle in the x-z plane and substantially Lambertian output in the y-z plane.

In use in a display, the optical output may be observed with substantially the same luminance for rotation about the x-axis and with reduced luminance for rotation about the y-axis. Advantageously comfortable viewing freedom may be achieved for a head-on user for various display orientations. Further, manufacture of such components may also be conveniently achieved.

It may be desirable to provide opaque structures on the transmissive support substrate 50.

Figure 18:
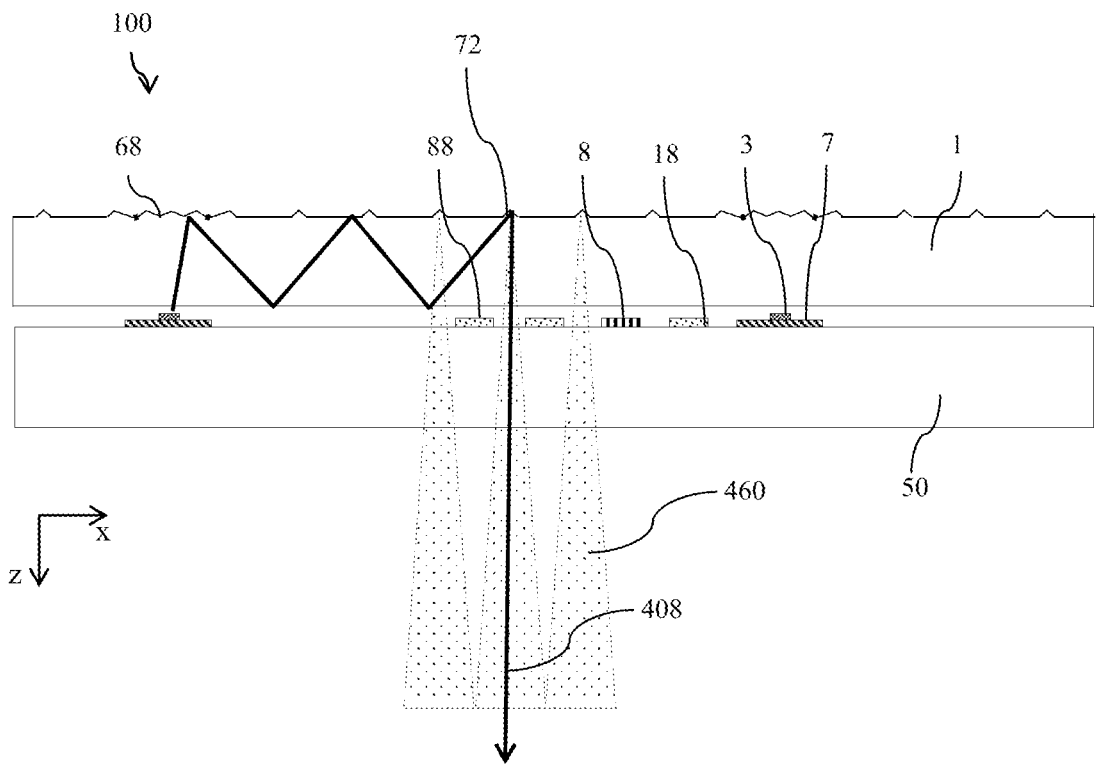
FIG. 18 is a schematic diagram illustrating in side view an optical stack comprising opaque elements arranged on the transmissive support substrate.

FIG. 18 is a schematic diagram illustrating in side view an optical stack comprising opaque elements that may include electrodes 8 and addressing electronics 88 arranged on the transmissive support substrate 50. Features of the arrangement of FIG. 18 not discussed in further detail may be assumed to correspond to the features with equivalent reference numerals as discussed above, including any potential variations in the features.

The opaque elements are arranged in the gaps that are aligned to be between the reflective light extraction facets 72. The output direction 408 has a cone angle 460 such that light from the facets 72 is directed without loss between the opaque elements. Advantageously high transmission may be achieved.

The electronics 88 may comprise for example transistors such as thin film transistors, capacitors and other drive components. Advantageously increased complexity of micro-LED 3 driving may be achieved. Improved high dynamic range operation may be achieved.

It may be desirable to provide output illumination that is directed to off-axis locations.

Figure 19A:
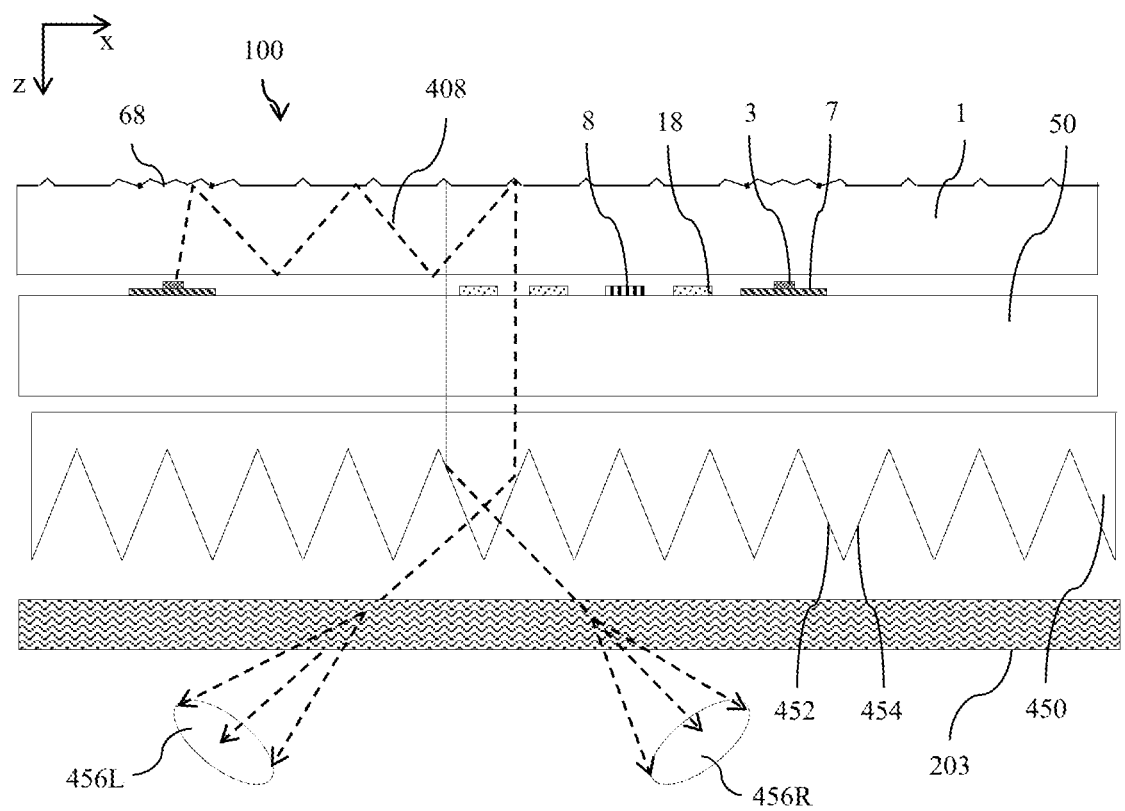
FIG. 19A is a schematic diagram illustrating in side view an optical stack for a centre stack display.
Figure 19B:
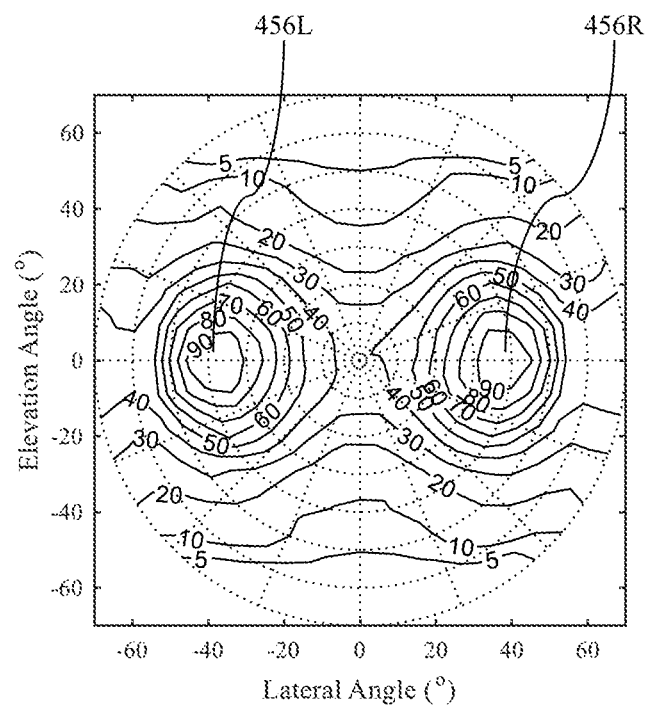
FIG. 19B is a schematic graph illustrating the polar profile of output luminance for an illustrative embodiment of FIG. 19A.

FIG. 19A is a schematic diagram illustrating in side view an optical stack for a centre stack display; and FIG. 19B is a schematic graph illustrating the polar profile of output luminance for an illustrative embodiment of FIG. 19A. Features of the arrangement of FIG. 19A not discussed in further detail may be assumed to correspond to the features with equivalent reference numerals as discussed above, including any potential variations in the features.

The illumination apparatus 100 further comprises a light splitting film 450 comprising opposed facets 452, 454 that may have the same tilt angle or may have different tilt angles from the normal to the plane of the film 450.

In operation, light cones 456L, 456R are output as illustrated in the exemplary embodiment of FIG. 19B.

Figure 19C:
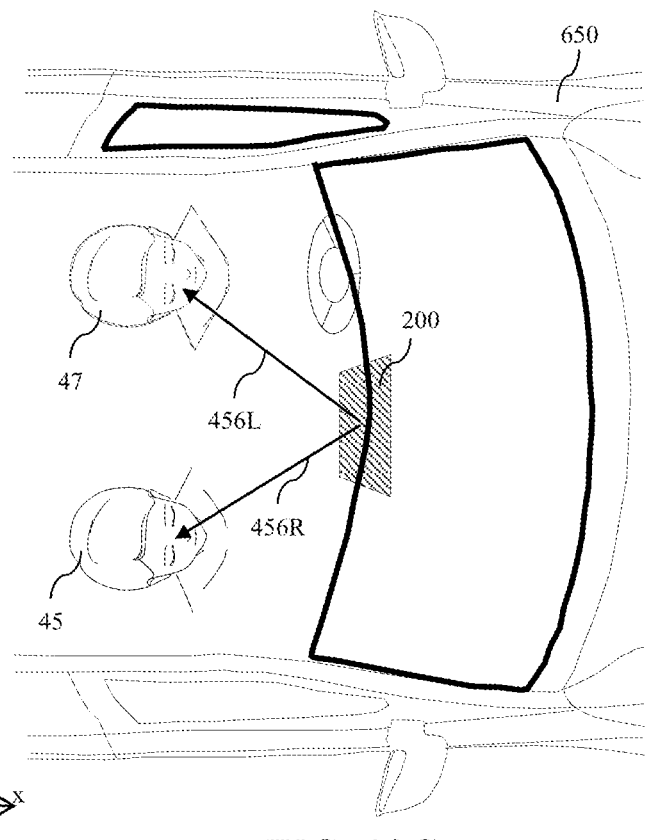
FIG. 19C is a schematic diagram illustrating in top view a vehicle comprising a centre stack display.

FIG. 19C is a schematic diagram illustrating in top view a vehicle 650 comprising a centre stack display apparatus 200 comprising the illumination apparatus 100 of FIG. 19A and a spatial light modulator 48. Occupants 45, 47 are provided with light rays in direction 456R, 456L respectively. Advantageously display efficiency may be improved in comparison to wide angle illumination.

Arrangements of micro-LEDs will now be discussed.

Figure 20A:
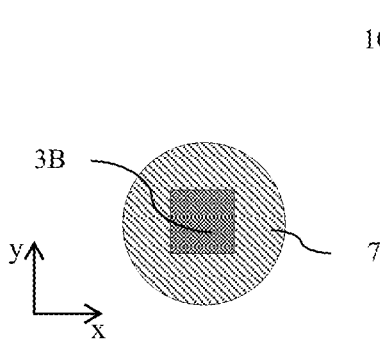
FIG. 20A is a schematic diagram illustrating in top view an arrangement of a monochromatic micro-LED.
Figure 20B:
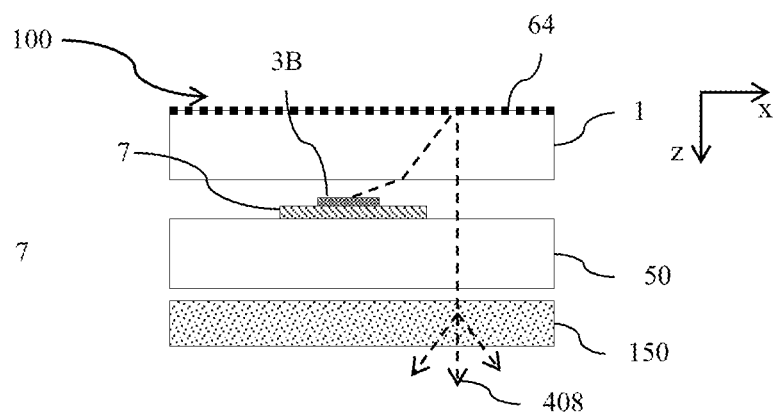
FIG. 20B is a schematic diagram illustrating in side view an arrangement of a monochromatic micro-LED of FIG. 20A and a wavelength conversion layer for an illumination apparatus.

FIG. 20A is a schematic diagram illustrating in top view an arrangement of a monochromatic micro-LED 3B and a wavelength conversion layer 150; and FIG. 20B is a schematic diagram illustrating in side view an arrangement of a monochromatic micro-LED of FIG. 20A and a wavelength conversion layer for an illumination apparatus.

Light rays 408 from the micro-LED 3B, which may be blue wavelength are output towards the wavelength conversion layer 150. Some of the blue light is diffused in the wavelength conversion layer while other light is converted to white light by a phosphor or quantum dot material in the wavelength conversion layer. Advantageously an illumination apparatus 100 may be provided with increased dynamic range and high uniformity. No alignment of the micro-LED to the wavelength is provided, advantageously reducing cost and complexity. Micro-LEDs may be provided in a thin structure with wide separation, reducing cost and complexity.

Figure 20C:
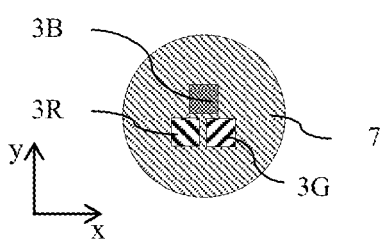
FIG. 20C is a schematic diagram illustrating in top view an arrangement of three monochromatic micro-LEDs.
Figure 20D:
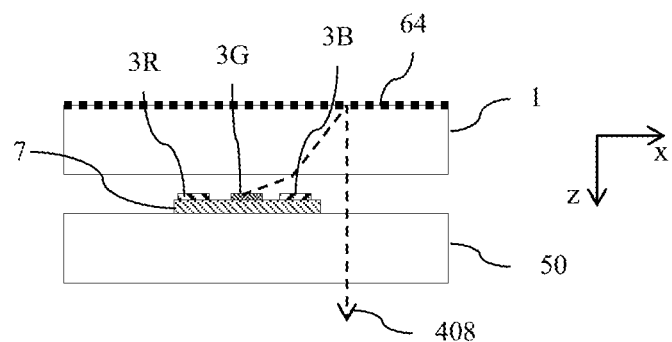
FIG. 20D is a schematic diagram illustrating in side view an arrangement of three monochromatic micro-LEDs of FIG. 20C for an illumination apparatus.

FIG. 20C is a schematic diagram illustrating in top view an arrangement of three monochromatic micro-LEDs 3R, 3G, 3B; and FIG. 20D is a schematic diagram illustrating in side view an arrangement of three monochromatic micro-LEDs 3R, 3G, 3B of FIG. 20C for an illumination apparatus 100.

In comparison to the arrangement of FIG. 20B, no additional wavelength conversion layer is provided, reducing cost. Further collimated light is provided in comparison to the substantially Lambertian output of FIG. 20B. Advantageously in a display apparatus 100, display efficiency is increased for desirable display users. A privacy display such as illustrated in FIG. 23 hereinbelow may be provided.

Figure 20E:
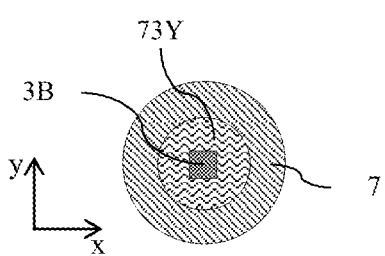
FIG. 20E is a schematic diagram illustrating in top view an arrangement of a monochromatic micro-LED and an aligned wavelength conversion region formed on the micro-LED.
Figure 20F:
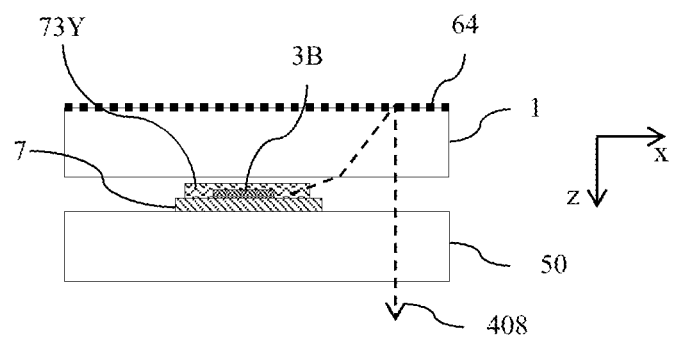
FIG. 20F is a schematic diagram illustrating in side view an arrangement of a monochromatic micro-LED and an aligned wavelength conversion region formed on the micro-LED of FIG. 20E for an illumination apparatus.

FIG. 20E is a schematic diagram illustrating in top view an arrangement of a monochromatic micro-LED 3B and an aligned wavelength conversion region 73Y formed on the micro-LED 3B; and FIG. 20F is a schematic diagram illustrating in side view an arrangement of a monochromatic micro-LED and an aligned wavelength conversion region formed on the micro-LED of FIG. 20E for an illumination apparatus 100. Alternatively the micro-LED 3B may be provided by a ultraviolet micro-LED and the colour conversion region may be a white colour conversion region 73W arranged to convert ultraviolet light to white light.

In comparison to the arrangement of FIG. 20B, collimated output is advantageously achieved. In comparison to the arrangement of FIG. 20D, a single micro-LED is provided reducing cost and complexity.

Figure 20G:
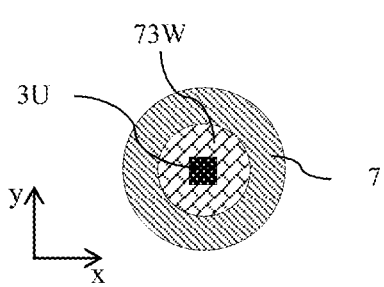
FIG. 20G is a schematic diagram illustrating in top view an arrangement of a monochromatic micro-LED and an aligned wavelength conversion region formed on the transmissive support substrate.
Figure 20H:
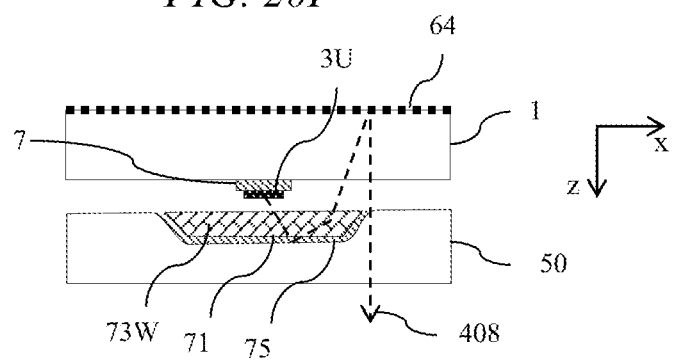
FIG. 20H is a schematic diagram illustrating in side view an arrangement of a monochromatic micro-LED and an aligned wavelength conversion region formed on the transmissive support substrate of FIG. 20G for an illumination apparatus.

FIG. 20G is a schematic diagram illustrating in top view an arrangement of a monochromatic micro-LED and an aligned wavelength conversion region formed on the transmissive support substrate; and FIG. 20H is a schematic diagram illustrating in side view an arrangement of a monochromatic micro-LED and an aligned wavelength conversion region 73W formed on the transmissive support substrate 50 of FIG. 20G for an illumination apparatus 100. Well 71 comprises a reflector 75 arranged to direct converted light and reflected light back into the waveguide 1.

In comparison to the arrangement of FIG. 20F, micro-LED 3U may provide ultraviolet output light that is converted to white light by colour conversion region 73W. Reduced visibility of leaking light may be seen. Alternatively the micro-LED 3U may be provided by a blue micro-LED 3B and the colour conversion region may be a yellow region 73Y arranged to convert some blue light to yellow light.

Advantageously the colour conversion material 73W may be remote from the micro-LED and increased efficiency and lifetime may be achieved.

Features of the arrangements of FIGS. 20A-D not discussed in further detail may be assumed to correspond to the features with equivalent reference numerals as discussed above, including any potential variations in the features.

Illustrative methods to manufacture the illumination apparatus of the present embodiments will now be described.

Figure 21A:
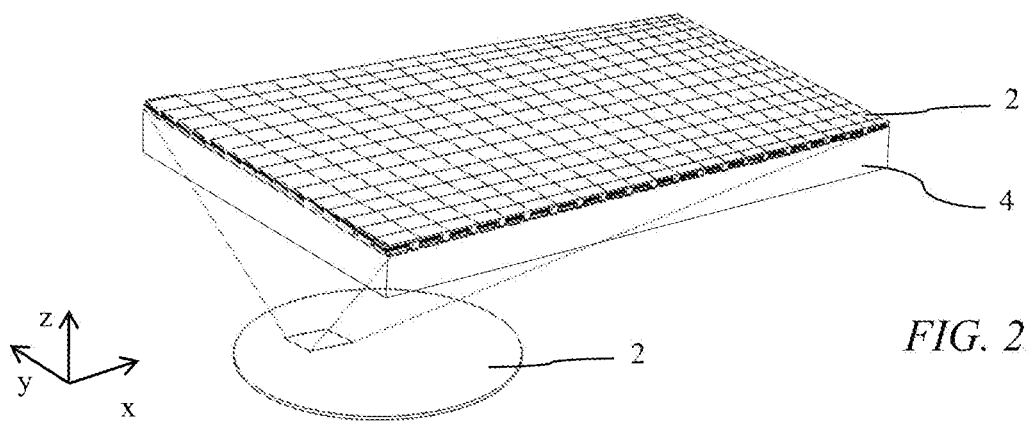
FIG. 21A is a schematic diagram illustrating in side perspective view a monolithic LED wafer.

In a first step a monolithic semiconductor wafer 2 may be provided as shown in FIG. 21A which is a schematic diagram illustrating in side perspective view a monolithic LED wafer 2. For example, the monolithic wafer 2 may comprise multiple doped GaN layers and may be formed on a substrate 4 that may be sapphire, silicon carbide or silicon for example.

Figure 21B:
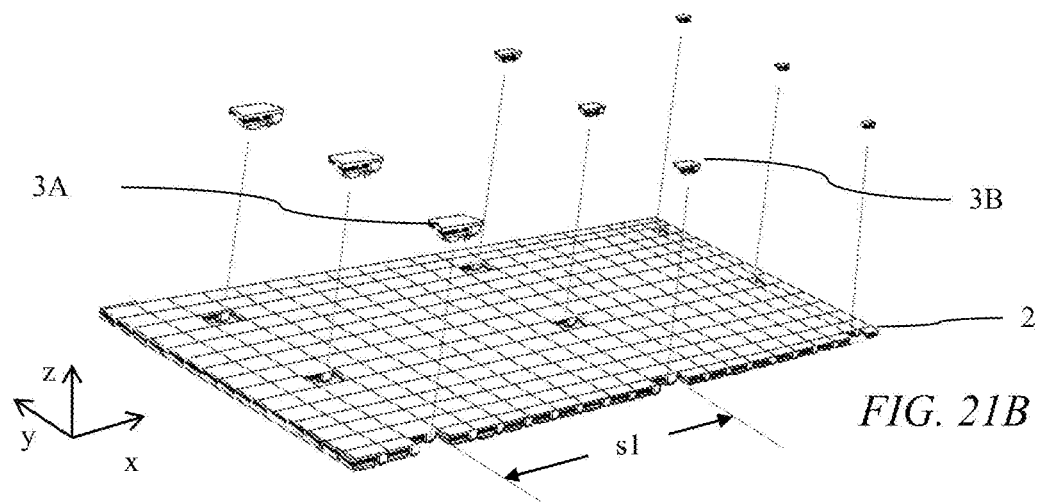
FIG. 21B is a schematic diagram illustrating in side perspective view extraction of a sparse array of micro-LEDs from a monolithic LED wafer.

In a second step a non-monolithic array of micro-LEDs 3A, 3B may be extracted from the monolithic wafer 2 as shown in FIG. 21B which is a schematic diagram illustrating in side perspective view extraction of a sparse array of micro-LEDs from a monolithic LED wafer 2 to provide LEDs 3A, 3B with separation s1 in the at least first direction.

Figure 21C:
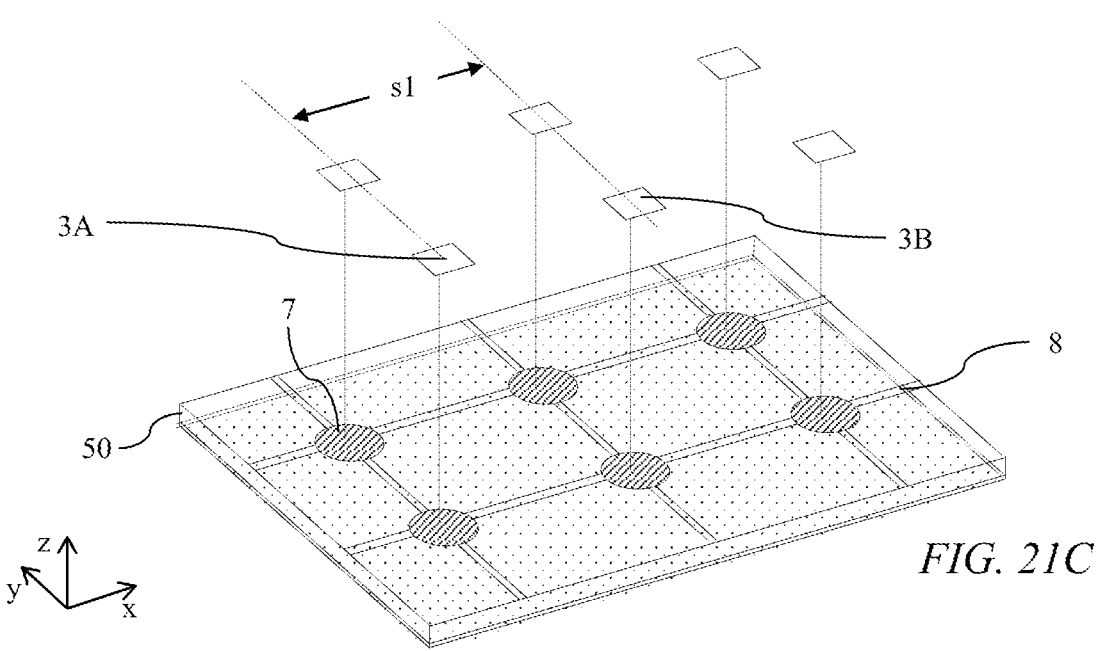
FIG. 21C is a schematic diagram illustrating in side perspective view placement of the sparse array of micro-LEDs from a monolithic LED wafer A onto the LED support substrate.

In a third step the non-monolithic array of micro-LEDs 3A, 3B may be transferred onto the transmissive LED support substrate 50 as shown in FIG. 21C which is a schematic diagram illustrating in side perspective view placement of the sparse array of micro-LEDs 3A, 3B from a monolithic LED wafer 2 of FIG. 21A onto the LED support substrate 50 comprising electrodes 8 and mask regions 7. Mask regions 7 have the same pitch s1. Features of the arrangements of FIGS. 21A-C not discussed in further detail may be assumed to correspond to the features with equivalent reference numerals as discussed above, including any potential variations in the features.

Micro-LEDs 3A, 3B may be arranged on substrate 52 in alignment with electrodes 8. The LED support substrate 50 may already be provided with drive circuit 517 comprising for example TFTs and/or integrated circuits (not shown).

The LEDs of the plurality of LEDs are thus from a monolithic wafer 3 arranged in an array with their original monolithic wafer positions and orientations relative to each other preserved; and wherein in at least one direction, for at least one pair of the plurality of LEDs 3 in the at least one direction, for each respective pair there was at least one respective LED 3 in the monolithic wafer 3 that was positioned in the monolithic wafer 4 between the pair of LEDs 3 in the at least one direction and that is not positioned between them in the array of LEDs 3.

In a fourth step, further layers (not shown) including addressing electrodes, wavelength conversion layers and optical bonding layers may be provided on the micro-LEDs 3 and the rear surface 54 of the transmissive LED support substrate 50.

Figure 22:
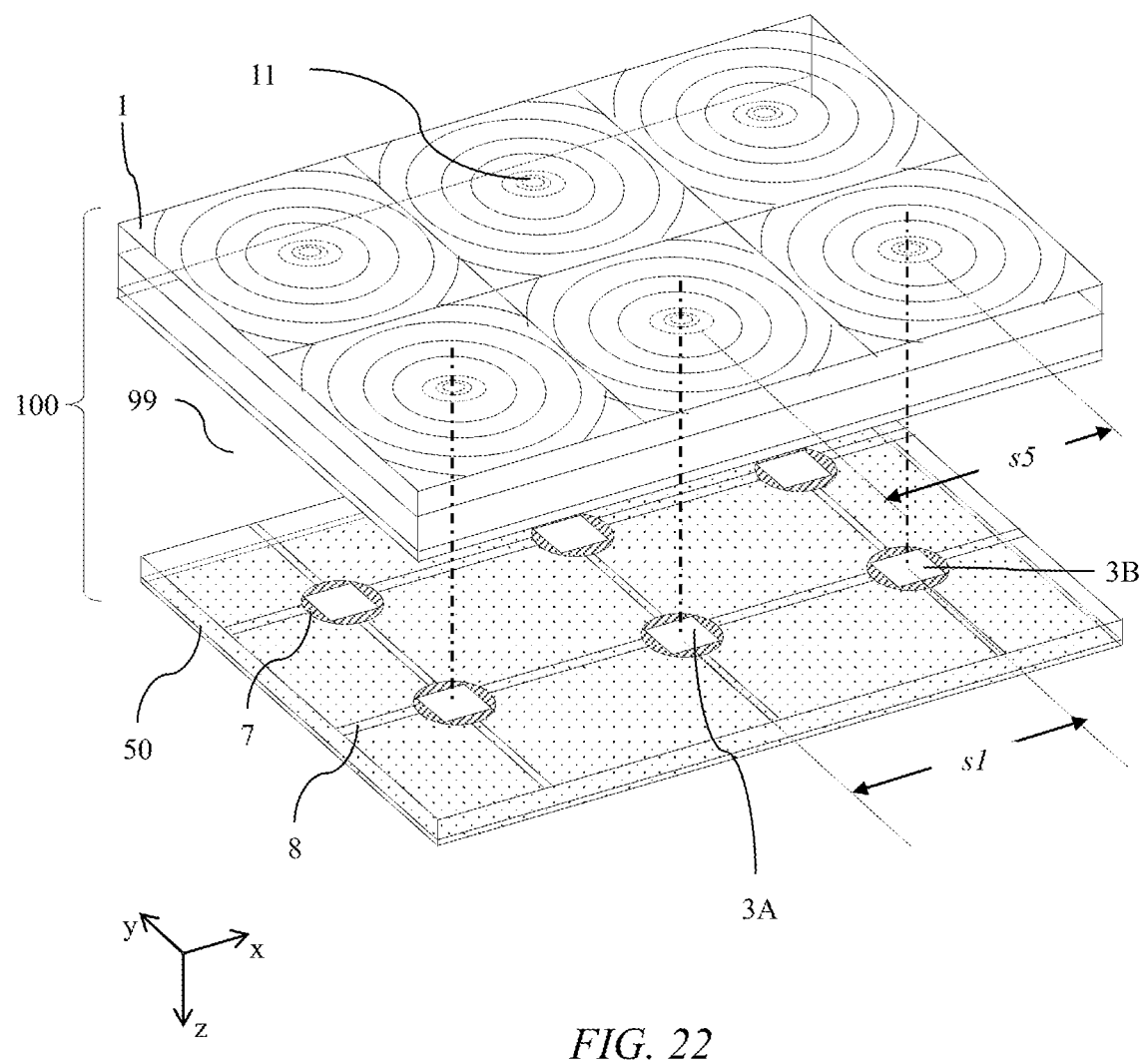
FIG. 22 is a schematic diagram illustrating in side perspective view assembly of a backlight comprising an input substrate and LED support substrate, in accordance with the present disclosure.

In a fifth step an illumination apparatus may be provided as shown in FIG. 22 which is a schematic diagram illustrating in side perspective view assembly of an illumination apparatus 100 comprising a waveguide 1 with optical axis 11 separation s5 and transmissive LED support substrate 50. Features of the arrangement of FIG. 22 not discussed in further detail may be assumed to correspond to the features with equivalent reference numerals as discussed above, including any potential variations in the features.

The substrate 50 may be aligned with the plurality of optical elements 38 with separations s5 to provide an illumination apparatus, such that separation s5 may be the same as separation s1. optical bonding such as optically clear adhesives may be used to provide attachment between the two substrates 50, 60 to advantageously provide increased robustness of alignment, such as in regions 80 as illustrated in FIG. 1B or as illustrated in FIG. 15A. Advantageously large numbers of elements may be formed over large areas using small numbers of extraction steps, while preserving alignment to a respective array of optical elements. Alignment of micro-LEDs 3 to catadioptric optical elements is described further in WIPO International Publ. No. WO/2010/038025, which is herein incorporated by reference in its entirety.

Further for the present disclosure, micro-LEDs are unpackaged LED die chips, and are not packaged LEDs. Advantageously individual wire bonding to LEDs is not used and the number of pick and place processes is significantly reduced.

It may be desirable to provide a switchable privacy display.

Figure 23:
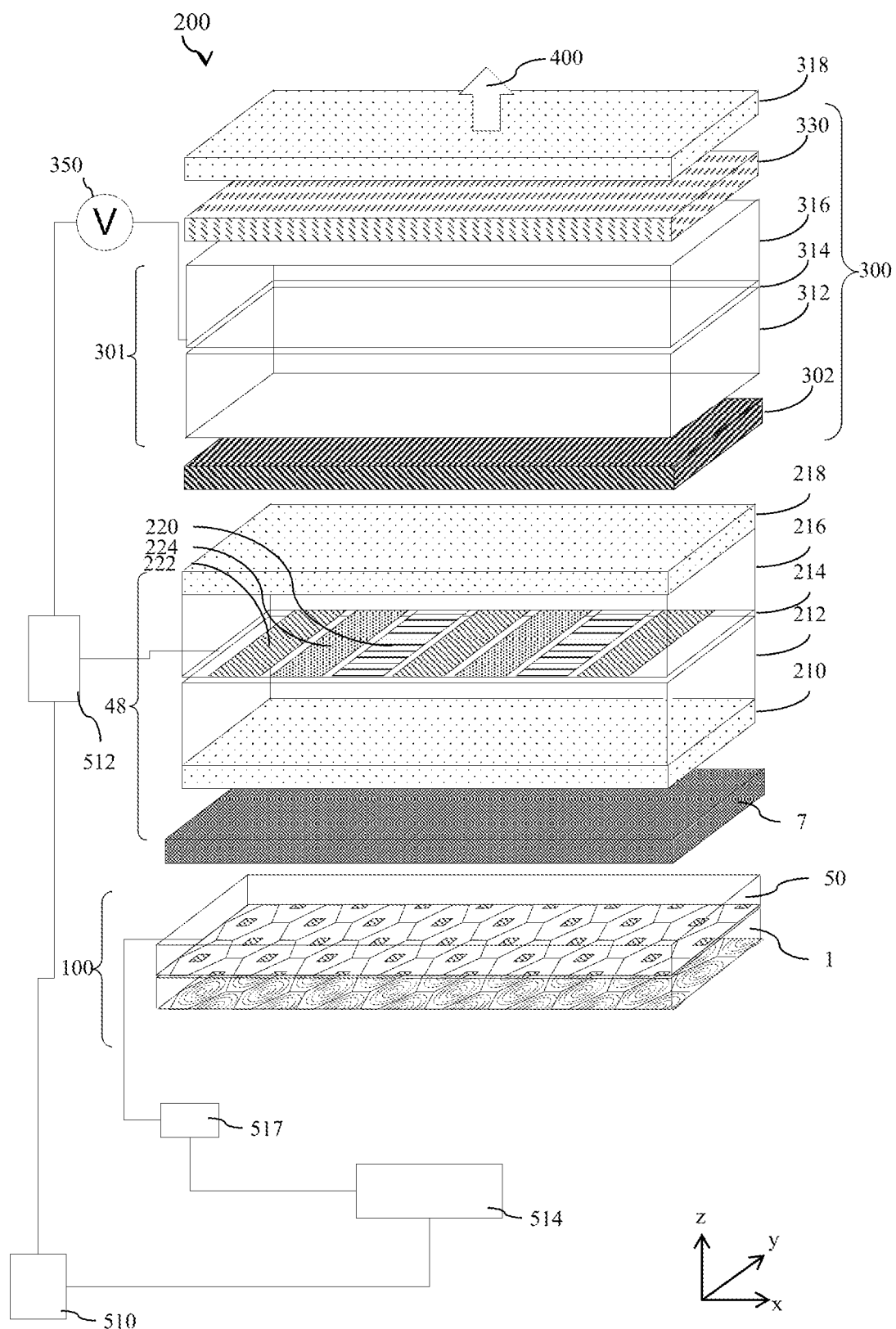
FIG. 23 is a schematic diagram illustrating in side perspective view an optical stack of a high efficiency and high dynamic range privacy display apparatus comprising an array backlight arranged to illuminate a spatial light modulator, a reflective polariser and a polar control retarder arrangement.

FIG. 23 is a schematic diagram illustrating in side perspective view a high efficiency and high dynamic range privacy display comprising an illumination apparatus 100 arranged to illuminate a spatial light modulator 48, a reflective polariser 302 and a polar control retarder arrangement 300. Features of the arrangement of FIG. 23 not discussed in further detail may be assumed to correspond to the features with equivalent reference numerals as discussed above, including any potential variations in the features.

Switchable liquid crystal retarder stack 300 is arranged in series with the illumination apparatus 100 and spatial light modulator 48. Stack 300 comprises a switchable liquid crystal retarder 301 that comprises substrates 312, 316 with transmissive electrodes and alignment layers to provide controllable alignment of a liquid crystal layer 314. Stack 300 further comprises an additional polariser 332 and compensation retarder 330. Various embodiments are described in U.S. Pat. No. 10,126,575, in U.S. Pat. No. 10,303,030, and in U.S. Patent Publ. No. 2020-0159055, all of which are herein incorporated by reference in their entireties.

Switchable liquid crystal retarder stack 300 and spatial light modulator 48 are arranged to receive light transmitted by the light turning element 5. Diffuser 334 may be arranged to provide modification of output cone angle and further to minimise Moiré and mura artefacts.

The control system may further comprise switchable liquid crystal retarder stack 300 controller 312 and liquid crystal cell driver 315 to control the voltage across the liquid crystal retarder 301. Controller 312 is arranged to address voltage driver 350 such that the switchable liquid crystal retarder 301 is driven in a first alignment state when the display operates in a wide angle mode, and in a second alignment state when the display operates in a narrow angle privacy mode.

An illustrative embodiment for polarisation control retarder 300 is given in TABLE 2.

TABLE 2

| | Passive polar control retarder(s) | | Active LC retarder | | | |
|---|---|---|---|---|---|---|
| Mode | Type | $\Delta n.d/$ mm | Alignment layers | Pretilt/ deg | $\Delta n.d/$ nm | $\Delta\varepsilon$ | Voltage/V |
| Public | Crossed A | +500 @ 45° | Homogeneous | 2 | 750 | 13.2 | 10 |
| Privacy | | +500 @ 135° | Homogeneous | 2 | | | 2.3 |

Figure 24B:
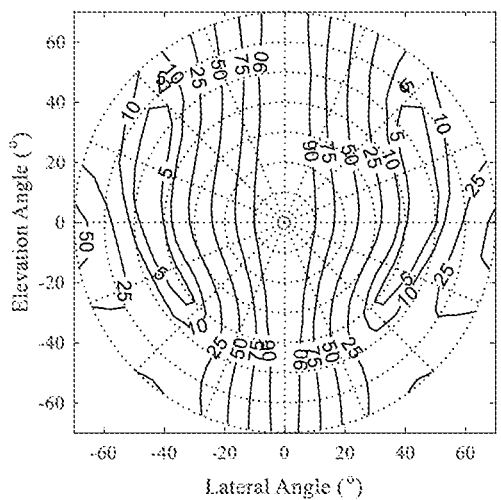
FIG. 24B is a schematic graph of the polar output distribution of transmission for a retarder stack arrangement of FIG. 23 with illustrative retarder stack arrangement of TABLE 2.
Figure 24C:
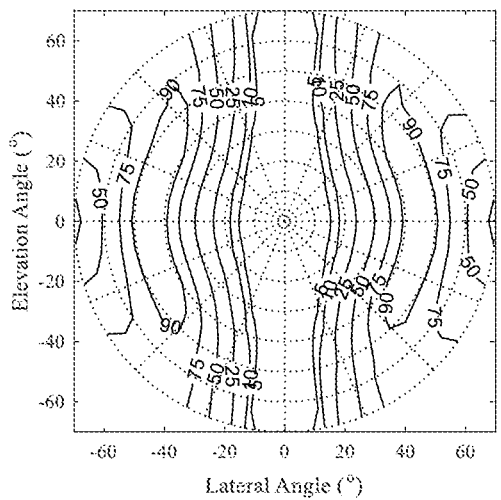
FIG. 24C is a schematic graph of the polar output distribution of reflectivity for a retarder stack arrangement of FIG. 23 with illustrative retarder stack arrangement of TABLE 2.

FIG. 24A is a schematic graph of the polar output distribution of luminance for the arrangement of FIG. 1A in series with two of the 30 degree FWHM output diffusers of FIG. 13B;

FIG. 24B is a schematic graph of the polar output distribution of transmission for a retarder stack arrangement of FIG. 23 with illustrative retarder stack arrangement of TABLE 2; and FIG. 24C is a schematic graph of the polar output distribution of reflectivity for a retarder stack arrangement of FIG. 23 with illustrative retarder stack arrangement of TABLE 2.

Figure 25A:
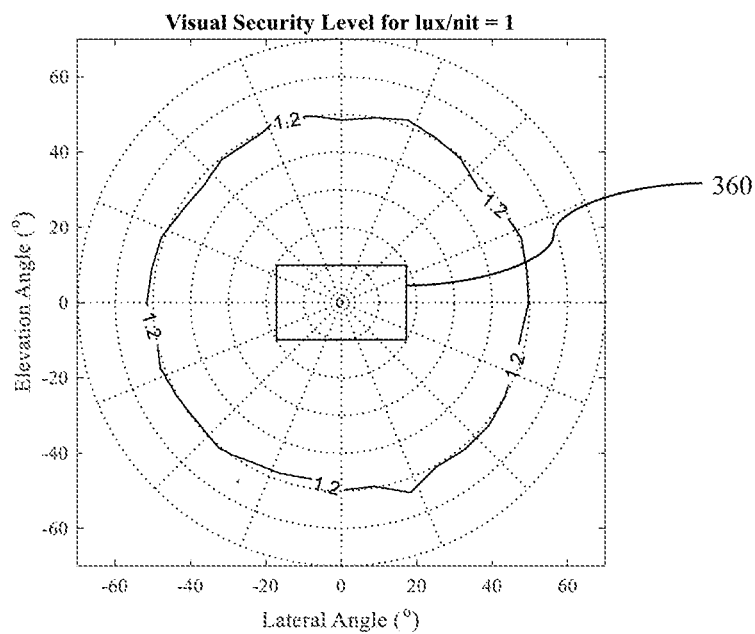
FIG. 25A is a schematic graph of the polar output distribution of Visual Security Level for a retarder stack arrangement of FIG. 23 with illustrative retarder stack arrangement of TABLE 2 and a lux/nit ratio of 1.0 in a public mode of operation.
Figure 25B:
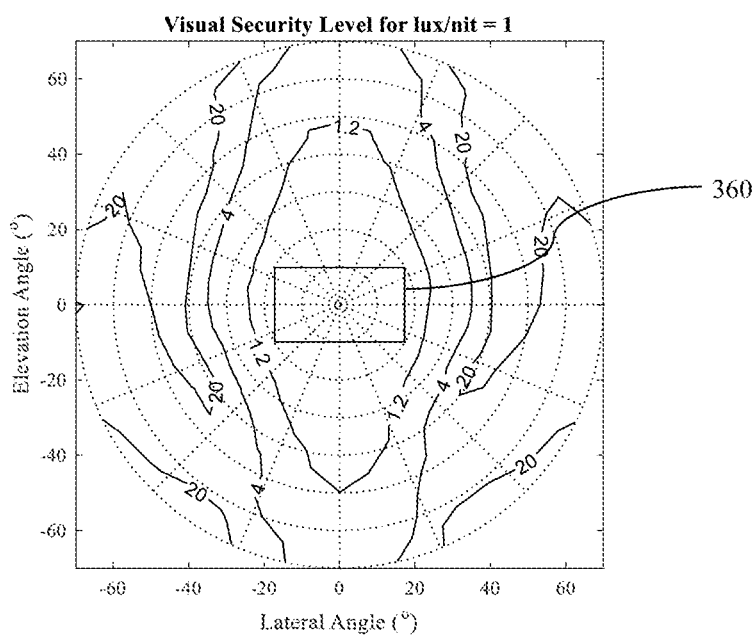
FIG. 25B is a schematic graph of the polar output distribution of Visual Security Level for a retarder stack arrangement of FIG. 23 with illustrative retarder stack arrangement of TABLE 2 and a lux/nit ratio of 1.0 in a privacy mode of operation.

FIG. 25A is a schematic graph of the polar output distribution of Visual Security Level for a retarder stack arrangement of FIG. 23 with illustrative retarder stack arrangement of TABLE 2 and a lux/nit ratio of 1.0 in a public mode of operation; and FIG. 25B is a schematic graph of the polar output distribution of Visual Security Level for a retarder stack arrangement of FIG. 23 with illustrative retarder stack arrangement of TABLE 2 and a lux/nit ratio of 1.0 in a privacy mode of operation. Region 360 represents the polar angles seen by a typical head-on user of a 14 inch diagonal 16:9 aspect ratio display viewed from 500 mm. All regions of the image have a VSL of less than 1.2, advantageously achieving high image visibility across the display area for the display user.

FIG. 25A further shows that the display has high image visibility in public mode of operation over a wide polar region while FIG. 25B illustrates high visual security level (VSL>4) over a wide polar region for snoopers.

Advantageously a switchable privacy display with high image visibility to display users and high visual security level to snoopers is provided.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. An illumination apparatus for providing illumination over a predetermined area, the illumination apparatus comprising:
    an array of light emitting diodes arrayed across the predetermined area and arranged to output light rearwardly; and
    an array of optical elements arrayed across the predetermined area, rearwardly of the light emitting diodes, each optical element being aligned with at least one light emitting diode, and each optical element comprising a waveguide having a transmissive surface and a reflective surface that is arranged rearwardly of the transmissive surface to receive light from the respective at least one light emitting diode through the transmissive surface, the reflective surface of each optical element comprising:
    a reflective light input structure arranged to reflect light received from the respective at least one light emitting diode in directions in which the light reflected thereby is guided within the waveguide by total internal reflection at the transmissive surface; and
    reflective light extraction facets arranged to reflect light that is guided within the waveguide in directions in which the light reflected thereby is output from the waveguide through the transmissive surface,
    wherein the optical element has mirror symmetry about an optical axis in at least one cross-sectional plane and in the at least one cross-sectional plane the reflective light input structure comprises first and second sets of reflective facets that are interleaved with each other and are inclined in opposite senses so that the light reflected by the first and second sets of reflective facets is guided away from the optical axis in opposite directions transverse to the optical axis.

2. An illumination apparatus according to claim 1, wherein the light emitting diodes output light in respective first light output distributions, and the optical elements output light from the waveguide originating from a light emitting diode in a respective second light output distribution that has a luminous intensity half maximum solid angle that is smaller than the luminous intensity half maximum solid angle of the respective first light output distribution of the light emitting diode from which the light originates.

3. An illumination apparatus according to claim 2, wherein the ratio of luminous intensity half maximum solid angle of the second light output distribution to the luminous intensity half maximum solid angle of a Lambertian light distribution is less than 1, preferably less than 0.5, more preferably less than 0.25 and most preferably less than 0.1.

4. An illumination apparatus according to claim 1, wherein each optical element has mirror symmetry about an optical axis in all cross-sectional planes around the optical axis.

5. An illumination apparatus according to claim 1, wherein the reflective facets of the first and second sets are inclined at tilt angles selected such that light from a point on a light emitting diode on the optical axis is reflected by the reflective facets at an angle with the optical axis of at most 50 degrees, preferably at most 48 degrees from the normal of the waveguide, and most preferably at most 46 degrees.

6. An illumination apparatus according to claim 1, wherein the reflective facets of the first and second sets are inclined at tilt angles selected such that light from a point on a light emitting diode on the optical axis is reflected by the reflective facets at an angle to the optical axis of at least 43 degrees from the normal of the waveguide and most preferably at least 44 degrees from the normal of the waveguide.

7. An illumination apparatus according to claim 1, wherein, within each of the first and second sets of reflective facets, the reflective facets are inclined with tilt angles defined between normal of the reflective facets and the optical axis that decrease for successive reflective facets in the direction in which light is guided away from the optical axis.

8. An illumination apparatus according to claim 1, wherein in the at least one cross-sectional plane the reflective light extraction facets comprise plural pairs of inclined facets facing the optical axis.

9. An illumination apparatus according to claim 1, wherein the reflective surface comprises reflective planar regions between the reflective light extraction facets.

10. An illumination apparatus according to claim 9, wherein the reflective planar regions and the reflective light extraction facets have a stepped structure.

11. An illumination apparatus according to claim 1, wherein in the at least one cross-sectional plane the reflective light extraction facets have a separation that decreases with distance from the optical axis of the optical element.

12. An illumination apparatus according to claim 1, wherein the reflective light extraction facets have lengths that increase with distance from the optical axis of the respective optical element.

13. An illumination apparatus according to claim 1, wherein the reflective light extraction facets have total areas that increase with the distance from the optical axis of the respective optical element.

14. An illumination apparatus according to claim 13, wherein the reflective light extraction facets have total areas that increase in proportion with the distance from the optical axis of the respective optical element.

15. An illumination apparatus according to claim 1, wherein some of the reflective light extraction facets are arranged to direct light that has not guided within the optical array.

16. An illumination apparatus according to claim 1, wherein the transmissive surface of each optical element is planar.

17. An illumination apparatus according to claim 1, wherein the transmissive surface of each optical element further comprises a refractive light input structure formed in the transmissive surface of the waveguide and aligned with the respective at least one light emitting diode so that the light emitted thereby passes through the refractive light input structure.

18. An illumination apparatus according to claim 17, wherein each optical element has mirror symmetry about an optical axis in at least one cross-sectional plane.

19. An illumination apparatus according to claim 18, wherein in the at least one cross-sectional plane the refractive light input structure comprises a plurality of pairs of oppositely inclined refractive input facets.

20. An illumination apparatus according to claim 17, wherein the transmissive surface of the input substrate comprises planar regions between the refractive light input structures.

21. An illumination apparatus according to claim 1, further comprising a transmissive support substrate, the light emitting diodes being supported by the transmissive support substrate on the rear side thereof.

22. An illumination apparatus according to claim 21, wherein a transmissive material with a lower refractive index than a material of the waveguide is arranged between the transmissive support substrate and the transmissive surfaces of the optical elements.

23. An illumination apparatus according to claim 22, wherein the transmissive material is air.

24. An illumination apparatus according to claim 21, wherein each optical element further comprises a refractive light output structure formed in a front surface of the transmissive support substrate in front of the respective at least one light emitting diode.

25. An illumination apparatus according to claim 24, wherein some of the reflective light extraction facets of each optical element are arranged to direct light to the refractive light output structure of the optical element.

26. An illumination apparatus according to claim 24, wherein each optical element has mirror symmetry about an optical axis in at least one cross-sectional plane.

27. An illumination apparatus according to claim 26, wherein in the at least one cross-sectional plane the refractive light output structure comprises a concave refractive surface arranged to provide negative optical power.

28. An illumination apparatus according to claim 24, wherein the angular light output distribution of light passing through the refractive light output structure is substantially the same as the angular light output distribution of light passing through regions of the transmissive support substrate that do not comprise a refractive light output structure.

29. An illumination apparatus according to claim 21, further comprising mask regions provided between the light emitting diodes and the transmissive support substrate.

30. An illumination apparatus according to claim 29, wherein the mask regions comprise electrodes connected to the light emitting diodes.

31. An illumination apparatus according to claim 1, wherein in the at least one cross-sectional plane the refractive light output structure comprises a plurality of pairs of oppositely inclined transmissive light deflecting facets.

32. An illumination apparatus according to claim 1, further comprising diffuser structures arranged on at least one surface of the transmissive support substrate.

33. An illumination apparatus according to claim 1, wherein the reflective surface of the optical array has a reflective layer formed thereon.

34. An illumination apparatus according to claim 33, wherein the reflective layer comprises a metal material.

35. An illumination apparatus according to claim 1, wherein the waveguides of each optical element are formed as an integrated body.

36. An illumination apparatus according to claim 1, further comprising a wavelength conversion layer arranged so that light output from the waveguide passes therethrough.

37. An illumination apparatus according to claim 1, wherein the light emitting diodes have a maximum width of at most 300 micrometres, preferably at most 200 micrometres and more preferably at most 100 micrometres.

38. An illumination apparatus according to claim 1, wherein in the at least one cross-sectional plane the distance between the transmissive surface and reflective surface is less than 750 micrometres, preferably less than 500 micrometres and more preferably less than 250 micrometres.

39. An illumination apparatus according to claim 1, further comprising a control system arranged to control the output of light from the light emitting diodes.

40. A display apparatus comprising:
an illumination apparatus according to claim 1; and
a transmissive spatial light modulator illuminated by the illumination apparatus.

41. An illumination apparatus for providing illumination over a predetermined area, the illumination apparatus comprising:
a transmissive support substrate;
an array of light emitting diodes supported by the transmissive support substrate on the rear side thereof, arrayed across the predetermined area, and arranged to output light rearwardly;
an array of optical elements arrayed across the predetermined area, rearwardly of the light emitting diodes, each optical element being aligned with a respective at least one light emitting diode, and each optical element comprising a rear layer having a transmissive surface and a reflective surface that is arranged rearwardly of the transmissive surface to receive light from the respective at least one light emitting diode through the transmissive surface; and
a transmissive material arranged between the transmissive support substrate and the transmissive surfaces of the optical elements,
wherein
the rear layers, the transmissive material and the transmissive support substrate have matched refractive indices, and
the reflective surface of each optical element comprises:
a reflective light input structure arranged to reflect light received from the respective at least one light emitting diode in directions in which the light reflected thereby is guided within a waveguide formed by the rear layer, the transmissive material and the transmissive support substrate by total internal reflection at the front surface of the transmissive support substrate; and
reflective light extraction facets arranged to reflect light that is guided within the waveguide in directions in which the light reflected thereby is output from the waveguide through the transmissive surface,
wherein the optical element has mirror symmetry about an optical axis in at least one cross-sectional plane and in the at least one cross-sectional plane the reflective light input structure comprises first and second sets of reflective facets that are interleaved with each other and are inclined in opposite senses so that the light reflected by the first and second sets of reflective facets is guided away from the optical axis in opposite directions transverse to the optical axis.

* * * * *